(12) United States Patent
Sasaki et al.

(10) Patent No.: US 9,272,674 B2
(45) Date of Patent: Mar. 1, 2016

(54) WIRE HARNESS CONTINUITY INSPECTION DEVICE, WIRE HARNESS CONTINUITY INSPECTION PROGRAM, AND WIRE HARNESS CONTINUITY INSPECTION METHOD

(75) Inventors: Noriaki Sasaki, Kosai (JP); Yasuhiro Mochizuki, Kosai (JP); Kohta Ohishi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 608 days.

(21) Appl. No.: 13/577,703

(22) PCT Filed: Feb. 4, 2011

(86) PCT No.: PCT/JP2011/052429
§ 371 (c)(1),
(2), (4) Date: Sep. 20, 2012

(87) PCT Pub. No.: WO2011/096543
PCT Pub. Date: Aug. 11, 2011

(65) Prior Publication Data
US 2013/0009649 A1    Jan. 10, 2013

(30) Foreign Application Priority Data

Feb. 8, 2010 (JP) ................................. 2010-025563
Jul. 22, 2010 (JP) ................................. 2010-165257

(51) Int. Cl.
*G01R 31/04* (2006.01)
*G01R 31/02* (2006.01)
*B60R 16/02* (2006.01)

(52) U.S. Cl.
CPC ................................. *B60R 16/0207* (2013.01)

(58) Field of Classification Search
CPC .. G01R 31/045; G01R 31/021; G01R 31/026; G01R 31/024; G01R 31/041; G01R 31/022

USPC .............. 324/503, 538, 539, 76.11, 500, 555; 702/117, 118, 58
See application file for complete search history.

(56) References Cited

U.S. PATENT DOCUMENTS 6,438,435 B1    8/2002   Wada et al.
6,457,165 B1    9/2002   Ishikawa et al.
(Continued)

FOREIGN PATENT DOCUMENTS

JP    11-85811 A      3/1999
JP    2000-163453 A   6/2000
(Continued)

OTHER PUBLICATIONS

International Search Report (PCT/ISA/210), issued by the International Searching Authority in corresponding International Application No. PCT/JP2011/052429 on Apr. 12, 2011.
(Continued)

*Primary Examiner* — Paresh Patel
*Assistant Examiner* — Neel Shah
(74) *Attorney, Agent, or Firm* — Sughrue Mion, PLLC

(57) ABSTRACT

A wire harness continuity inspection method includes: specifying a first certain electrical wire and a second certain electrical wire of which one end is connected to the other end of the first certain electrical wire, described in the first region-based connector/wiring information, and regarding them as a single electrical wire; referring to auxiliary device-based wiring information to obtain a first terminal of a first electrical component and a second terminal of a second electrical component connected by a circuit line, which are described in the auxiliary device-based wiring information; referring to the region-based connector/wiring information to specify a first electrical wire of which one end is connected to the first terminal of the first electrical component, described in the region-based connector/wiring information; and determining whether the terminal connected to the other end of the first electrical wire is identical to the second terminal of the second electrical component.

11 Claims, 38 Drawing Sheets

(56) References Cited

U.S. PATENT DOCUMENTS

| | | | |
|---|---|---|---|
| 6,687,639 B2* | 2/2004 | Mori et al. | 702/117 |
| 7,368,919 B2* | 5/2008 | Gervais | 324/539 |
| 2003/0006779 A1* | 1/2003 | Youval | 324/503 |
| 2003/0141878 A1* | 7/2003 | Shinzou et al. | 324/539 |

FOREIGN PATENT DOCUMENTS

| | | |
|---|---|---|
| JP | 2002-315124 A | 10/2002 |
| JP | 2007-310670 A | 11/2007 |
| JP | 2010-3016 A | 1/2010 |

OTHER PUBLICATIONS

Written Opinion (PCT/ISA/237) of the International Searching Authority, issued in corresponding International Application No. PCT/JP2011/052429 on Apr. 12, 2011.

Translation of Written Opinion issued Sep. 18, 2012, by the International Searching Authority in counterpart International Application No. PCT/JP2011/052429.

Office Action dated May 13, 2014, issued by the Japanese Patent Office in counterpart Japanese Application No. 2010-165257.

* cited by examiner (a)

| SYSTEM NAME | F-PART NAME | TERMINAL | T-PART NAME | TERMINAL |
|---|---|---|---|---|
| ABS | MAIN_ECU | A01 | ABS_SWITCH | A02 |
| ABS | MAIN_ECU | A03 | EARTH | A04 |
| ABS | ABS_SENSOR | A05 | MAIN_ECU | A06 |
| A/C | A/C_SWITCH | B01 | MAIN_ECU | B02 |
| A/C | TEMP_SENSOR | B03 | MAIN_ECU | B04 |
| A/C | A/C_ECU | B05 | RELAY-1 | B06 |
| METER | EARTH | C01 | METER | C02 |
| METER | MAIN_ECU | C03 | METER | C04 |
| METER | EARTH | C05 | METER | C06 |

FIG. 4B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | WtoW-E41 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_SWITCH | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | MAIN_ECU | 111-000-111 | A01 | 4 | | ABS_SWITCH | 111-000-111 | A02 | 4 | |
| E41-111 | EARTH | 111-000-111 | N01 | 2 | | J/C-4 | 111-000-111 | N01 | 2 | |
| E41-111 | WtoW-E21 | 111-000-111 | T04 | 4 | | MAIN_ECU | 111-000-111 | T04 | 4 | |

FIG. 5A

| SYSTEM NAME | F-PART NAME | TERMINAL | T-PART NAME | TERMINAL |
|---|---|---|---|---|
| ABS | MAIN_ECU | A01 | ABS_SWITCH | A02 |
| ABS | MAIN_ECU | A03 | EARTH | A04 |
| ABS | ABS_SENSOR | A05 | MAIN_ECU | A06 |
| A/C | A/C_SWITCH | B01 | MAIN_ECU | B02 |
| A/C | TEMP_SENSOR | B03 | MAIN_ECU | B04 |
| A/C | A/C_ECU | B05 | RELAY-1 | B06 |
| METER | EARTH | C01 | METER | C02 |
| METER | MAIN_ECU | C03 | METER | C04 |
| METER | EARTH | C05 | METER | C06 |

FIG. 5B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | WtoW-E41-2 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | MAIN_ECU | 111-000-111 | A01 | 4 | | WtoW-E11-8 | 999-111-102 | A01 | 4 | |
| E41-111 | EARTH | 111-000-111 | N01 | 2 | | J/C-4 | 111-000-111 | N01 | 2 | |
| E41-111 | WtoW-E21 | 111-000-111 | T04 | 4 | | MAIN_ECU | 111-000-111 | T04 | 4 | |

FIG. 5C

| REGION NAME | CONNECTOR NAME | REGION NAME | CONNECTOR NAME |
|---|---|---|---|
| E11 | WtoW-E12 | E12 | WtoW-E11-1 |
| E11 | WtoW-E21-1 | E21 | WtoW-E11-2 |
| E11 | WtoW-E21-2 | E21 | WtoW-E11-3 |
| E11 | WtoW-E21 | E21 | WtoW-E11-4 |
| E11 | WtoW-E22 | E22 | WtoW-E11-5 |
| E11 | WtoW-E36 | E36 | WtoW-E11-6 |
| E11 | WtoW-E41-1 | E41 | WtoW-E11-7 |
| E11 | WtoW-E41-2 | E41 | WtoW-E11-8 |

FIG. 5D

| CONNECTOR PART NUMBER | CONNECTOR PART NUMBER |
|---|---|
| 999-111-101 | 999-111-102 |
| 999-111-103 | 999-111-104 |
| 999-111-105 | 999-111-106 |

FIG. 6A

| SYSTEM NAME | F-PART NAME | TERMINAL | T-PART NAME | TERMINAL |
|---|---|---|---|---|
| ABS | MAIN_ECU | A01 | ABS_SWITCH | A02 |
| ABS | MAIN_ECU | A03 | EARTH | A04 |
| ABS | ABS_SENSOR | A05 | MAIN_ECU | A06 |
| A/C | A/C_SWITCH | B01 | MAIN_ECU | B02 |
| A/C | TEMP_SENSOR | B03 | MAIN_ECU | B04 |
| A/C | A/C_ECU | B05 | RELAY-1 | B06 |
| METER | EARTH | C01 | METER | C02 |
| METER | MAIN_ECU | C03 | METER | C04 |
| METER | EARTH | C05 | METER | C06 |

FIG. 6B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | F-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | WtoW-E41 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | A/C_SWITCH | 111-000-111 | B01 | 1 | | J/B-4 | 999-000-104 | ##1 | 33 | |
| E41-111 | MAIN_ECU | 111-000-111 | XYT | 10 | | SSS_SWITCH | 111-000-111 | SS1 | 1 | |
| E41-111 | J/B-1-2-3 | 111-000-113 | %01 | 23 | | CONTROL_SW | 111-000-111 | E01 | 2 | |
| E41-111 | WtoW-E21 | 111-000-111 | T04 | 4 | | MAIN_ECU | 111-000-111 | T04 | 4 | |
| E41-111 | J/B-6 | 111-000-116 | ##3 | 32 | | MAIN_ECU | 111-000-111 | B02 | 19 | |

FIG. 6C

| MAIN BODY PART NUMBER | PLACE | CONNECTOR PART NUMBER | CONNECTOR NAME |
|---|---|---|---|
| 888-000-111 | A | 111-000-114 | J/B-4 |
| 888-000-111 | B | 111-000-113 | J/B-1-2-3 |
| 888-000-111 | C | 111-000-112 | J/B-4-5 |
| 888-000-111 | D | 111-000-116 | J/B-6 |
| 888-000-111 | E | 111-000-115 | J/B-5 |
| 888-000-112 | A | 111-000-120 | J/C1 |
| 888-000-112 | B | 111-000-121 | J/C2 |

FIG. 6D

| MAIN BODY PART NUMBER | CAVITY CONNECTION |
|---|---|
| 888-000-111 | C6+DOOR_FUSE_2+DOOR_RELAY |
| 888-000-111 | A10+DOOR_RELAY-2 |
| 888-000-111 | IG_FUSE+DOOR_RELAY-3 |
| 888-000-111 | B48+ACC_RELAY |
| 888-000-111 | B22&A20+LAMP_RELAY-1 |
| 888-000-111 | B52+IG_RLY-2+IG_RLY-3+IG_RLY-4 |
| 888-000-111 | A3+FUSE-1+FUSE-2 |
| 888-000-111 | A33&B23&D32 |
| 888-000-111 | A5&B1&B19&B18&D15 |
| 888-000-111 | A6&B2&B21&B20&D14 |
| 888-000-111 | A30&C22&C21&D20 |
| 888-000-111 | A32&B28&B27 |

FIG. 7A

| SYSTEM NAME | F-PART NAME | TERMINAL | T-PART NAME | TERMINAL |
|---|---|---|---|---|
| ABS | MAIN_ECU | A01 | ABS_SWITCH | A02 |
| ABS | MAIN_ECU | A03 | EARTH | A04 |
| ABS | ABS_SENSOR | A05 | MAIN_ECU | A06 |
| A/C | A/C_SWITCH | B01 | MAIN_ECU | B02 |
| A/C | TEMP_SENSOR | B03 | MAIN_ECU | B04 |
| A/C | A/C_ECU | B05 | REALY-1 | B06 |
| METER | EARTH | C01 | METER | C02 |
| METER | MAIN_ECU | C03 | METER | C04 |
| METER | EARTH | C05 | METER | C06 |

FIG. 7B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | WtoW-E41 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | MAIN_ECU | 111-000-111 | C03 | 4 | | J/C-4 | 999-111-102 | A01 | 4 | 800-200-100 |
| E41-111 | METER | 111-000-111 | C04 | 2 | | J/C-4 | 111-000-111 | N01 | 5 | 800-200-100 |
| E41-111 | WtoW-E21 | 111-000-111 | T04 | 4 | | MAIN_ECU | 111-000-111 | T04 | 4 | |

FIG. 7C

| MAIN BODY PART NUMBER | CAVITY CONNECTION |
|---|---|
| 888-200-100 | 1&2&3 |
| 888-200-100 | 4&5 |
| 888-200-100 | 6&7&8&9&10&11 |
| 888-200-100 | 12&13&14&15 |
| 888-200-100 | 16&17&18&19&20&21&22 |
| 888-200-100 | 1&2&5&6 |
| 888-200-100 | 3&4&7&8 |

FIG. 8A

| SYSTEM NAME | F-PART NAME | TERMINAL | T-PART NAME | TERMINAL |
|---|---|---|---|---|
| ABS | MAIN_ECU | A01 | ABS_SWITCH | A02 |
| ABS | MAIN_ECU | A03 | EARTH | A04 |
| ABS | ABS_SENSOR | A05 | MAIN_ECU | A06 |
| A/C | A/C_SWITCH | B01 | MAIN_ECU | B02 |
| A/C | TEMP_SENSOR | B03 | MAIN_ECU | B04 |
| A/C | A/C_ECU | B05 | RELAY-1 | B06 |
| METER | EARTH | C01 | METER | C02 |
| METER | MAIN_ECU | C03 | METER | C04 |
| METER | EARTH | C05 | METER | C06 |

FIG. 8B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | W/S-1 | SSS-000-111 | %%1 | 1 | | MAIN_ECU | 111-000-111 | B04 | 9 | |
| E11-111 | WtoW-E41 | 999-111-101 | Z01 | 4 | | ABS_SWITCH | 111-000-111 | A02 | 4 | |
| E11-111 | TEMP_SENSOR | 111-000-111 | B03 | 2 | | W/S-1 | SSS-000-000 | %%1 | 1 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | MAIN_ECU | 111-000-111 | C03 | 4 | | J/C-4 | 999-111-102 | A01 | 4 | 800-200-100 |
| E41-111 | METER | 111-000-111 | C04 | 2 | | J/C-4 | 111-000-111 | N01 | 2 | 800-200-100 |
| E41-111 | WtoW-E21 | 111-000-111 | T04 | 4 | | MAIN_ECU | 111-000-111 | T04 | 4 | |

FIG. 9A

| SYSTEM NAME | F-PART NAME | TERMINAL | T-PART NAME | TERMINAL |
|---|---|---|---|---|
| ABS | MAIN_ECU | A01 | ABS_SWITCH | A02 |
| ABS | MAIN_ECU | A03 | EARTH | A04 |
| ABS | ABS_SENSOR | A05 | MAIN_ECU | A06 |
| A/C | A/C_SWITCH | B01 | MAIN_ECU | B02 |
| A/C | TEMP_SENSOR | B03 | MAIN_ECU | B04 |
| A/C | A/C_ECU | B05 | RELAY-1 | B06 |
| METER | EARTH | C01 | METER | C02 |
| METER | MAIN_ECU | C03 | METER | C04 |
| METER | EARTH | C05 | METER | C06 |

FIG. 9B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | | LAMP | 111-000-111 | S01 | 12 | 800-000-111 |
| E11-111 | W/S-1 | SSS-000-111 | %%1 | 1 | | MAIN_ECU | 111-000-111 | B04 | 9 | |
| E11-111 | ABS_SENSOR | 111-000-111 | A05 | 4 | | | | #A1 | | |
| E11-111 | TEMPERATUR | 111-000-111 | F01 | 2 | | W/S-1 | SSS-000-000 | %%1 | 2 | |
| E11-111 | MAIN_ECU | 111-000-111 | A06 | 4 | | | | #A1 | | |
| | | | | | | | | | | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| | | | | | | | | | | |
| E41-111 | MAIN_ECU | 111-000-111 | C03 | 4 | | J/C-4 | 999-111-102 | A01 | 4 | 800-200-100 |
| E41-111 | METER | 111-000-111 | C04 | 2 | | J/C-4 | 111-000-111 | N01 | 2 | 800-200-100 |
| E41-111 | WtoW-E21 | 111-000-111 | T04 | 4 | | MAIN_ECU | 111-000-111 | T04 | 4 | |

FIG. 11A

| SYSTEM NAME | F-PART NAME | TERMINAL | T-PART NAME | TERMINAL |
|---|---|---|---|---|
| ABS | MAIN_ECU | A01 | ABS_SWITCH | A06 |
| ABS | MAIN_ECU | A03 | EARTH | A04 |
| ABS | F:DOME | #05 | MAIN_ECU | A02 |
| A/C | A/C_SWITCH | B01 | MAIN_ECU | B02 |
| A/C | TEMP_SENSOR | B03 | MAIN_ECU | B04 |
| A/C | A/C_ECU | B05 | REALY-1 | B06 |
| METER | EARTH | C01 | METER | C02 |
| METER | MAIN_ECU | C03 | METER | C04 |
| METER | EARTH | C05 | METER | C06 |

FIG. 11B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | F-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | WtoW-E41 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | A/C_SWITCH | 111-000-111 | B01 | 1 | | J/B-4 | 999-000-104 | ##1 | 33 | |
| E41-111 | MAIN_ECU | 111-000-111 | XYT | 10 | | SSS_SWITCH | 111-000-111 | SS1 | 1 | |
| E41-111 | J/B-1-2-3 | 111-000-113 | %01 | 23 | | MAIN_ECU | 111-000-111 | A02 | 2 | |

FIG. 11C

| MAIN BODY PART NUMBER | PLACE | CONNECTOR PART NUMBER | CONNECTOR NAME |
|---|---|---|---|
| 888-000-111 | A | 111-000-114 | J/B-4 |
| 888-000-111 | B | 111-000-113 | J/B-1-2-3 |
| 888-000-111 | C | 111-000-112 | J/B-4-5 |
| 888-000-111 | D | 111-000-116 | J/B-6 |
| 888-000-111 | E | 111-000-115 | J/B-5 |
| 888-000-112 | A | 111-000-120 | J/C1 |
| 888-000-112 | B | 111-000-121 | J/C2 |

FIG. 11D

| MAIN BODY PART NUMBER | CAVITY CONNECTION |
|---|---|
| 888-000-111 | C6+DOOR_FUSE_2+DOOR_RELAY |
| 888-000-111 | A10+DOOR_RELAY-2 |
| 888-000-111 | IG_FUSE+DOOR_RELAY-3 |
| 888-000-111 | B4+F:DOME |
| 888-000-111 | B22&A20+LAMP_RELAY-1 |
| 888-000-111 | B52+IG_RLY-2+IG_RLY-3+IG_RLY-4 |
| 888-000-111 | A3+FUSE-1+FUSE-2 |
| 888-000-111 | A33&B23&D32 |
| 888-000-111 | A5&B1&B19&B18&D15 |
| 888-000-111 | A6&B2&B21&B20&D14 |
| 888-000-111 | A30&C22&C21&D20 |
| 888-000-111 | A32&B28&B27 |

FIG. 12A

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | WtoW-E41-2 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | MAIN_ECU | 111-000-111 | A01 | 4 | | WtoW-E11-8 | 999-111-102 | A01 | 4 | |
| E41-111 | EARTH | 111-000-111 | N01 | 2 | | J/C-4 | 111-000-111 | N01 | 2 | |
| E41-111 | WtoW-E21 | 111-000-111 | T04 | 4 | | MAIN_ECU | 111-000-111 | T04 | 4 | |

FIG. 12B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | T-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z02 | 9 | |
| E11-111 | PF_JC | 111-000-111 | F01 | 2 | | LAN-1 | 111-000-111 | F01 | 2 | |
| E11-111 | ABS_ECU-2 | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | EARTH | 111-000-111 | N01 | 2 | | J/C-4 | 111-000-111 | N01 | 2 | |
| E41-111 | WtoW-E21 | 111-000-111 | T04 | 4 | | MAIN_ECU | 111-000-111 | T04 | 4 | |
| ADD-111 | MAIN_ECU | 111-000-111 | A01 | 4 | | ABS_SWITCH | 111-000-111 | A02 | 4 | |

| SYSTEM NAME | F-PART NAME | PART NUMBER | TERMINAL | C/N | T-PART NAME | PART NUMBER | TERMINAL | C/N |
|---|---|---|---|---|---|---|---|---|
| ABS | MAIN_ECU | K-000-111 | A01 | 4 | ABS_SWITCH | K-000-112 | A02 | 4 |
| ABS | MAIN_ECU | K-000-111 | A03 | 7 | EARTH | – | A04 | – |
| ABS | ABS_SENSOR | K-001-111 | A05 | 2 | MAIN_ECU | K-000-111 | A06 | 10 |
| A/C | A/C_SWITCH | K-001-112 | B01 | 4 | MAIN_ECU | K-000-111 | B02 | 6 |
| A/C | TEMP_SENSOR | K-001-113 | B03 | 1 | MAIN_ECU | K-000-111 | B04 | 12 |
| A/C | A/C_ECU | K-001-114 | B05 | 20 | RELAY-1 | K-050-101 | B06 | 1 |
| METER | EARTH | – | C01 | – | METER | K-101-111 | C02 | 4 |
| METER | MAIN_ECU | K-000-111 | C03 | 9 | METER | K-101-111 | C04 | 9 |
| METER | EARTH | – | C05 | – | METER | K-101-111 | C06 | 7 |

FIG. 14B

| DRAWING PART NUMBER | F-CONNECTOR NAME | CONNECTOR PART NUMBER | TERMINAL | C/N | F-PART NUMBER | T-CONNECTOR NAME | CONNECTOR PART NUMBER | TERMINAL | C/N | F-PART NUMBER |
|---|---|---|---|---|---|---|---|---|---|---|
| E11-111 | J/C-1 | 111-000-111 | S01 | 12 | 800-000-111 | LAMP | 111-000-111 | S01 | 12 | 800-000-111 |
| E11-111 | WtoW-E53 | 111-000-111 | Z03 | 9 | | WtoW-E51 | 111-000-111 | Z03 | 9 | |
| E11-111 | WtoW-E41 | 999-111-101 | Z01 | 4 | | ABS_SWITCH | 111-000-111 | A02 | 4 | |
| E11-111 | PF_JC | 111-000-111 | F01 | 2 | | LAN-1 | 111-000-111 | F01 | 2 | |
| E11-111 | ABS_SWITCH | 111-000-111 | T01 | 4 | | WtoW-E41 | 111-000-111 | T01 | 4 | |
| E21-111 | EARTH | 111-000-111 | B09 | 1 | | BATTERY | 111-000-111 | B09 | 1 | |
| E21-111 | IG_SWITCH | 111-000-111 | N01 | 2 | | R/B | 111-000-111 | N01 | 2 | |
| E21-111 | WtoW-E22 | 111-000-111 | T04 | 4 | | EARTH | 111-000-111 | T04 | 4 | |
| E41-111 | MAIN_ECU | 111-000-111 | A01 | 4 | | ABS_SWITCH | 111-000-112 | A02 | 4 | |
| E41-111 | EARTH | 111-000-111 | N01 | 2 | | J/C-4 | 111-000-111 | N01 | 2 | |
| E41-111 | WtoW-E21 | 111-000-111 | T04 | 4 | | MAIN_ECU | 111-000-111 | T04 | 4 | |

*FIG.14C*

| PART NUMBER | CONNECTOR PART NUMBER |
|---|---|
| K-000-111 | 111-000-111 |
| K-000-112 | 111-000-112 |
| K-000-113 | 111-000-113 |

WIRE HARNESS CONTINUITY INSPECTION DEVICE, WIRE HARNESS CONTINUITY INSPECTION PROGRAM, AND WIRE HARNESS CONTINUITY INSPECTION METHOD

TECHNICAL FIELD

The present invention relates to a wire harness continuity inspection device, a wire harness continuity inspection program, and a wire harness continuity inspection method for comparing connection between the starting point and the terminating point of a circuit line, described in auxiliary device-based wiring information (more specifically auxiliary device-based wiring information prepared for each grade of a vehicle model and depending on the presence of an optional function) including wiring information on electrical wires and connectors connected to an auxiliary device, prepared in relation to a certain vehicle model with connection of electrical wires described in region-based connector information including information on connectors constituting wire harnesses designed for each subdivided region and region-based wiring information including information on wirings constituting the wire harnesses designed for each subdivided region (the region-based connector information is an actual wiring diagram prepared based on the auxiliary device-based wiring information, and the region-based wiring information is a diagram expanded based on an auxiliary device specification table of the vehicle model; thereinafter, the region-based connector information and the region-based wiring information will be collectively referred to as "region-based connector/wiring information") and inspecting for the presence of errors in connections of electrical wires described in the region-based connector/wiring information.

BACKGROUND ART

When designing wire harnesses arranged in a certain vehicle, it is necessary to prepare a design drawing showing connections of electrical wires constituting the wire harnesses. Hereinafter, a procedure of designing wire harnesses will be described.

When designing wire harnesses arranged in a certain vehicle, two specifications of auxiliary device-based wiring information and an auxiliary device specification table of the vehicle are necessary. First, auxiliary device-based wiring information and an actual wiring diagram prepared based on the auxiliary device-based wiring information will be described. In the past, the auxiliary device-based wiring information and the actual wiring diagram have been designed by CAD (Computer Aided Design) (for example, see Patent Literature 1).

The auxiliary device-based wiring information is prepared for each of the systems mounted in a vehicle and individually driven, such as a head lamp system, an airbag system, an air-conditioning system, an engine control system, and an ABS system. In order to drive the system, it is necessary to connect electrical components (for example, a battery, an ECU (Electronic Control Unit), and a driving machine) constituting the system by a signal line, a power line, and a ground line. The auxiliary device-based wiring information includes circuit line connection information showing which terminals of which electrical component, the starting point and the terminating point of each of the electrical wires of these signal line, power line, and ground line are connected to, and which electrical wires the signal line, the power line, and the ground line are connected to, and auxiliary device information on an auxiliary device that connects the electrical wires of the signal line, the power line, and the ground line to the electrical component. Since the auxiliary device-based wiring information mainly aims to show a circuit diagram of a system made up of a plurality of electrical components, information on electrical wires is not included therein.

Thus, an actual wiring diagram in which information on the electrical wires is added to the auxiliary device-based wiring information is prepared. The actual wiring diagram is one in which the information on the electrical wires is added to the information on the circuit lines connecting electrical components, described in the auxiliary device-based wiring information, and which is divided into respective regions (an engine compartment, a vehicle interior wall, or a trunk; hereinafter these regions will be referred to as subdivided regions) where wire harnesses can be arranged, dividing a vehicle space into respective functions. For example, when a circuit line described in the auxiliary device-based wiring information extends over a plurality of subdivided regions to be connected to a plurality of electrical components, information on terminals or connectors connected to the terminals of the electrical component at the starting point and the terminating points of the circuit line is described in the actual wiring diagram. Moreover, information on respective electrical wires positioned in the subdivided regions (since wire harnesses are arranged in respective subdivided regions, it is necessary to connect the terminals of a plurality of electrical components by connecting the electrical wires of the respective subdivided regions) is also described in the actual wiring diagram. Furthermore, information on auxiliary devices such as a connector, a JB ((Electric) Junction Block or Junction Box), or a JC (Joint Connector) for connecting the end portions of electrical wires positioned in the respective subdivided regions (when the end portions of an electrical wire are connected by welding or butt-joining, information of this fact) is described in the actual wiring diagram. The actual wiring diagram in which the information on electrical wires is described in this way is prepared for each system mounted in the vehicle.

Subsequently, an auxiliary device specification table will be described.

In the auxiliary device specification table, the configuration (a part number of the wire harness, a combination of specifications applicable to the wire harness, identification information of applicable vehicles in which the wire harness can be arranged, and arrangeable subdivided regions of the applied vehicle) of general-purpose wire harnesses is described in a matrix form for each wire harness.

Subsequently, region-based connector/wiring information is prepared based on the actual wiring diagram and the auxiliary device specification table prepared in this way. The region-based connector/wiring information describes wire harnesses arrangeable in each subdivided region of a target vehicle while including the electrical wires described in the actual wiring diagram (that is, while enabling all systems mounted in the vehicle to be driven). When creating the region-based connector/wiring information, a wire harness arrangeable in the subdivided region is schematically specified from the auxiliary device specification table through the subsequent step. First, a specification code necessary for driving all systems in the subdivided region is specified by referring to the actual wiring diagram of all systems mounted in the vehicle. A wire harness including a combination of all specification codes is specified by referring to the specified specification codes. This step is executed with respect to all subdivided regions, whereby wire harnesses arrangeable in each subdivided region of the target vehicle are specified.

After performing a region-based connector/wiring information creating step of creating the region-based connector/wiring information, a validity determining step of determining whether the description of the auxiliary device-based wiring information is identical to the description of the region-based connector/wiring information is performed. That is, it is determined whether the starting point and the terminating point of a circuit line connecting electrical components, described in the auxiliary device-based wiring information are identical to the starting point and the terminating point of connections of electrical wires connecting electrical components, described in the region-based connector/wiring information.

CITATION LIST

Patent Literature

Patent Literature 1: JP-A-2000-163453

SUMMARY OF INVENTION

Technical Problem

In the past, in the validity determining step, a designer finds the starting point of a circuit line described in the auxiliary device-based wiring information, finds an end portion of the electrical wire corresponding to the starting point from the region-based connector/wiring information, and visually recognizes, for each of the circuit lines, whether the end portion of the electrical wire reaches the terminating point of the circuit line described in the auxiliary device-based wiring information while tracking along the electrical wire and the connections of electrical wires connected to the electrical wire. However, such a validity determining step is a very burdensome operation to the designer.

As another validity determining step, the designer manufactures actual wire harnesses connected as described in the region-based connector/wiring information and performs inspection on the continuity of the terminals of the wire harnesses corresponding to the starting point and the terminating point of a circuit line described in the auxiliary device-based wiring information. However, in such a validity determining step, it is burdensome for the designer to manufacture the wire harnesses.

The present invention has been made in view of the above problems, and an object thereof is to provide a wire harness continuity inspection device, a wire harness continuity inspection program, and a wire harness continuity inspection method capable of inspecting for the presence of errors in connections of electrical wires described in region-based connector/wiring information using an electronic computer.

Solution to Problem

In order to attain the object, a wire harness continuity inspection device according to the present invention is characterized by the following aspects (1) to (5).
(1) A wire harness continuity inspection device, including:
a storage unit that stores codes described in auxiliary device-based wiring information and codes described in region-based connector/wiring information; and
a control unit that compares a first terminal of a first electrical component and a second terminal of a second electrical component connected by a circuit line, described in the auxiliary device-based wiring information stored in the storage unit with terminals connected to both ends of an electrical wire connecting the first terminal of the first electrical component and the second terminal of the second electrical component, described in the region-based connector/wiring information stored in the storage unit, wherein
the control unit is configured to
refer to first region-based connector/wiring information to specify a first certain electrical wire and a second certain electrical wire of which one end is connected to the other end of the first certain electrical wire which are described in the first region-based connector/wiring information, and regard the first certain electrical wire and the second certain electrical wire as a single electrical wire,
refer to first auxiliary device-based wiring information to specify a first terminal of a first electrical component and a second terminal of a second electrical component connected by a circuit line, described in the first auxiliary device-based wiring information,
refer to the first region-based connector/wiring information to specify a first electrical wire of which one end is connected to the first terminal of the first electrical component described in the first region-based connector/wiring information, and
determine whether a terminal connected to the other end of the first electrical wire is identical to the second terminal of the second electrical component.
(2) The wire harness continuity inspection device according to the configuration (1), wherein
when a terminal connected to the other end of the (n−1)th electrical wire, where n is an integer of 2 or more, is not identical to the second terminal of the second electrical component, the control unit refers to the first region-based connector/wiring information to specify the n-th electrical wire of which the one end is connected to the other end of the (n−1)th electrical wire described in the first region-based connector/wiring information, and
the control unit determines whether a terminal connected to the other end of the n-th electrical wire is identical to the second terminal of the second electrical component.
(3) The wire harness continuity inspection device according to the configuration (2), wherein
when a terminal connected to the other end of the (n−1)th electrical wire, where n is an integer of 2 or more, is not identical to the second terminal of the second electrical component, the control unit refers to the first region-based connector/wiring information to specify the n-th electrical wire of which the one end is connected to the other end of the (n−1)th electrical wire described in the first region-based connector/wiring information based on connection means for connecting the other end of the (n−1)th electrical wire and the one end of the n-th electrical wire, and
(4) The wire harness continuity inspection device according to the configuration (2) or (3), wherein
the control unit sequentially records information on the specified (n−1)th electrical wire, where n is an integer of 2 or more, into the storage unit, and
when a terminal connected to the other end of the (n−1)th electrical wire, where n is an integer of 2 or more, is identical to the second terminal of the second electrical component, the control unit stores, into the storage unit, information indicating that the first terminal of the first electrical component is electrically connected to the second terminal of the second electrical component.
(5) The wire harness continuity inspection device according to the configuration (4), wherein the control unit is configured to
refer to second auxiliary device-based wiring information to specify the first terminal of the first electrical component and the second terminal of the second electrical component described in the second auxiliary device-based wiring information,
refer to the information on the (n−1)th electrical wire, where n is an integer of 2 or more, recorded sequentially to specify first to (n−1)th wire harnesses connecting the first terminal of the first electrical component and the second terminal of the second electrical component,
determine whether the first to (n−1)th wire harnesses belong to wire harnesses constituting the second region-based connector/wiring information, and
when the first to (n−1)th wire harnesses are determined to belong to the wire harnesses, the control unit refers to the information stored in the storage unit, indicating that the first terminal of the first electrical component is electrically connected to the second terminal of the second electrical component and records information indicating that the first terminal of the first electrical component is electrically connected to the second terminal of the second electrical component.

In order to attain the object, a wire harness continuity inspection method according to the present invention is characterized by the following aspects (6) to (10).

(6) A wire harness continuity inspection method, including:
a regarding step of referring to first region-based connector/wiring information to specify a first certain electrical wire and a second certain electrical wire of which one end is connected to the other end of the first certain electrical wire which are described in the first region-based connector/wiring information, and regarding the first certain electrical wire and the second certain electrical wire as a single electrical wire;
a referring step of referring to first auxiliary device-based wiring information to specify a first terminal of a first electrical component and a second terminal of a second electrical component connected by a circuit line, described in the first auxiliary device-based wiring information;
a first specifying step of referring to the first region-based connector/wiring information to specify a first electrical wire of which one end is connected to the first terminal of the first electrical component described in the first region-based connector/wiring information; and
a first determining step of determining whether a terminal connected to the other end of the first electrical wire is identical to the second terminal of the second electrical component.

(7) The wire harness continuity inspection method according to the configuration (6), further including:
an n-th specifying step of referring to the first region-based connector/wiring information to specify an n-th electrical wire of which one end is connected to the other end of a (n−1)th electrical wire, described in the first region-based connector/wiring information when a terminal connected to the other end of the (n−1) electrical wire, where n is an integer of 2 or more, is not identical to the second terminal of the second electrical component; and
an n-th determining step of determining whether a terminal connected to the other end of the n-th electrical wire is identical to the second terminal of the second electrical component.

(8) The wire harness continuity inspection method according to the configuration (7), wherein when the terminal connected to the other end of the (n−1)th electrical wire, where n is an integer of 2 or more, is not identical to the second terminal of the second electrical component, the n-th specifying step includes referring to the first region-based connector/wiring information to specify the n-th electrical wire of which the one end is connected to the other end of the (n−1)th electrical wire described in the first region-based connector/wiring information based on connection means for connecting the other end of the (n−1)th electrical wire and the one end of the n-th electrical wire.

(9) The wire harness continuity inspection method according to the configuration (7) or (8), wherein
the (n−1)th specifying step includes sequentially recording information on the specified (n−1)th electrical wire, where n is an integer of 2 or more, and
the n-th specifying step includes recording information indicating that the first terminal of the first electrical component is electrically connected to the second terminal of the second electrical component when the terminal connected to the other end of the (n−1)th electrical wire, where n is an integer of 2 or more, is identical to the second terminal of the second electrical component.

(10) The wire harness continuity inspection method according to the configuration (9), further including:
a second referring step of referring to second auxiliary device-based wiring information to specify the first terminal of the first electrical component and the second terminal of the second electrical component described in the second auxiliary device-based wiring information,
a wire harness specifying step of referring to the information on the (n−1)th electrical wire, where n is an integer of 2 or more, recorded sequentially in the (n−1)th specifying step to specify first to (n−1)th wire harnesses connecting the first terminal of the first electrical component and the second terminal of the second electrical component, a wire harness determining step of determining whether the first to (n−1)th wire harnesses specified in the wire harness specifying step belong to wire harnesses constituting the second region-based connector/wiring information, and
when the first to (n−1)th wire harnesses are determined to belong to the wire harnesses in the wire harness determining step, referring to the information recorded in the n-th specifying step, the information indicating that the terminals are electrically connected to each other, and recording information indicating that the first terminal of the first electrical component is electrically connected to the second terminal of the second electrical component.

In order to attain the object, a wire harness continuity inspection program according to the present invention is characterized by the following aspect (11).

(11) A wire harness continuity inspection program for causing a computer to execute the respective steps of the wire harness continuity inspection method as defined in any one of the aspects (6) to (10).

According to the wire harness continuity inspection device of the aspects (1) and (2), the wire harness continuity inspection method of the aspects (6) and (7), and the wire harness continuity inspection program of the aspect (11), it is possible to inspect for the presence of errors in connections of electrical wires described in the region-based connector/wiring information, by using an electronic computer. Moreover, it is possible to shorten the time necessary for the validity determining step.

According to the wire harness continuity inspection device of the aspect (3), the wire harness continuity inspection method of the aspect (8), and the wire harness continuity inspection program of the aspect (11), it is possible to specify the n-th electrical wire of which one end is connected to the other end of the (n−1)th electrical wire precisely.

According to the wire harness continuity inspection device of the aspect (4), the wire harness continuity inspection method of the aspect (9), and the wire harness continuity inspection program of the aspect (11), it is possible to output the history of determination results in the validity determining step.

According to the wire harness continuity inspection device of the aspect (5), the wire harness continuity inspection method of the aspect (10), and the wire harness continuity inspection program of the aspect (11), it is possible to shorten the validity determining step.

Advantageous Effects of Invention

According to the wire harness continuity inspection device, the wire harness continuity inspection program, and the wire harness continuity inspection method of the present invention, it is possible to inspect for the presence of errors in connections of electrical wires described in the region-based connector/wiring information using an electronic computer.

The present invention has been described briefly. The details of the present invention will be more clearly understood by reading Description of Embodiments with reference to the accompanying drawings.

BRIEF DESCRIPTION OF DRAWINGS

FIG. 1 indicates diagrams for explaining an electrical component connection state, in which FIG. 1(a) is a schematic view of a circuit line connecting electrical components described in auxiliary device-based wiring information, and FIGS. 1(b) to 1(f) are schematic views of connections of electrical wires connecting electrical components described in region-based connector/wiring information.

FIG. 4A is an example of auxiliary device-based wiring information.

FIG. 4B is an example of region-based connector/wiring information.

FIG. 5A is an example of auxiliary device-based wiring information.

FIG. 5B is an example of region-based connector/wiring information.

FIG. 5C is an example of a connector name correspondence table.

FIG. 5D is an example of a connector part number correspondence table.

FIG. 6A is an example of auxiliary device-based wiring information.

FIG. 6B is an example of region-based connector/wiring information.

FIG. 6C is an example of a JB-connector correspondence table.

FIG. 6D is an example of a JB terminal connection correspondence table.

FIG. 7A is an example of auxiliary device-based wiring information.

FIG. 7B is an example of region-based connector/wiring information.

FIG. 7C is an example of a JC terminal connection correspondence table.

FIG. 8A is an example of auxiliary device-based wiring information.

FIG. 8B is an example of region-based connector/wiring information.

FIG. 9A is an example of auxiliary device-based wiring information.

FIG. 9B is an example of region-based connector/wiring information.

FIG. 11A is an example of auxiliary device-based wiring information.

FIG. 11B is an example of region-based connector/wiring information.

FIG. 11C is an example of a JB-connector correspondence table.

FIG. 11D is an example of a JB terminal connection correspondence table.

FIG. 12A is an example of region-based connector/wiring information before a preliminary electrical wire bonding step (identical to FIG. 5B).

FIG. 12B is an example of region-based connector/wiring information after the preliminary electrical wire bonding step.

FIG. 13 is a diagram illustrating the overview of the preliminary electrical wire bonding step to be executed by the wire harness continuity inspection device according to the embodiment of the present invention, in which FIGS. 13(a) to 13(c) are diagrams illustrating a process of the preliminary electrical wire bonding step.

FIG. 14A is another example of auxiliary device-based wiring information.

FIG. 14B is another example of region-based connector/wiring information.

FIG. 14C is another example of a part number correspondence table.

FIG. 15 indicates diagrams for explaining back-tracking to the branches of multilayer inspection to be executed by the wire harness continuity inspection device according to the embodiment of the present invention, in which FIG. 15(a) shows a case where there is one JB, and FIG. 15(b) shows a case where there are two JBs.

FIG. 16 indicates conceptual diagrams showing a method of recording the result of multilayer inspection to be executed by the wire harness continuity inspection device according to the embodiment of the present invention, in which FIGS. 16(a) to 16(g) are diagrams conceptually showing the statuses recorded in a certain situation.

FIG. 17 indicates conceptual diagrams showing a method of recording the result of multilayer inspection to be executed by the wire harness continuity inspection device according to the embodiment of the present invention, in which FIGS. 17(a) to 17(f) are diagrams conceptually showing the statuses recorded in a certain situation.

FIG. 18 indicates conceptual diagrams showing a method of recording the result of multilayer inspection to be executed by the wire harness continuity inspection device according to the embodiment of the present invention, in which FIGS. 18(a) to 18(c) are diagrams conceptually showing the statuses recorded in a certain situation.

FIG. 19 indicates conceptual diagrams showing a method of recording the result of multilayer inspection to be executed by the wire harness continuity inspection device according to the embodiment of the present invention (showing a case where a plurality of electrical wires is connected to a single electrical wire), in which FIGS. 19(a) to 19(c) are diagrams conceptually showing the statuses recorded in a certain situation.

FIG. 20 indicates diagrams for explaining a connection state of electrical components provided in respective subdivided regions, in which FIG. 20(a) shows a case where an electrical component E32 is present in a subdivided region C, and FIG. 20(b) shows a case where the electrical component E32 is not present in the subdivided region C.

DESCRIPTION OF EMBODIMENTS

Figure 1:
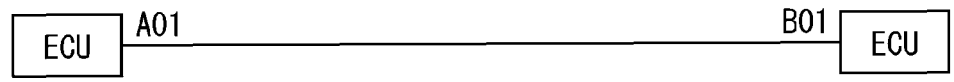
Figure 1:
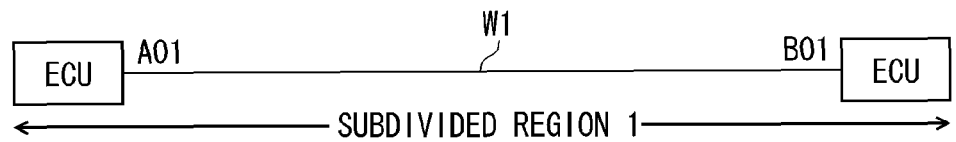
Figure 1:
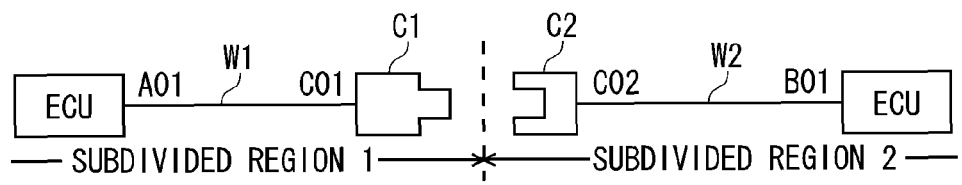
Figure 1:
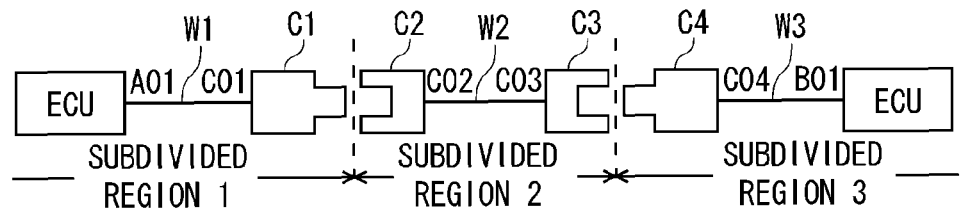
Figure 1:
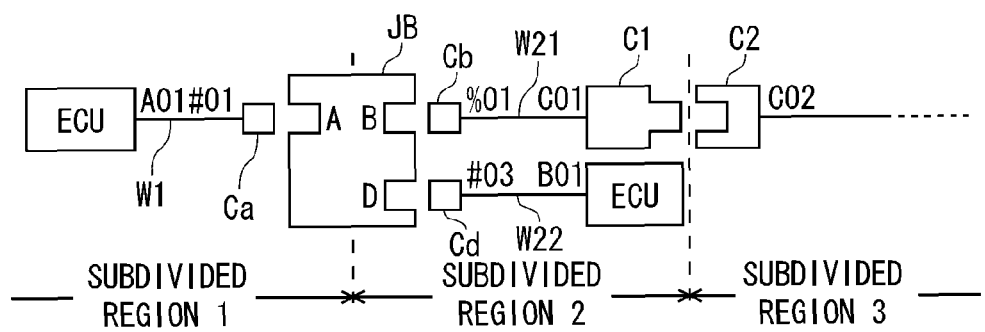
Figure 1:
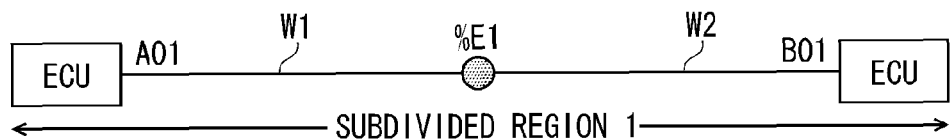
Figure 2:
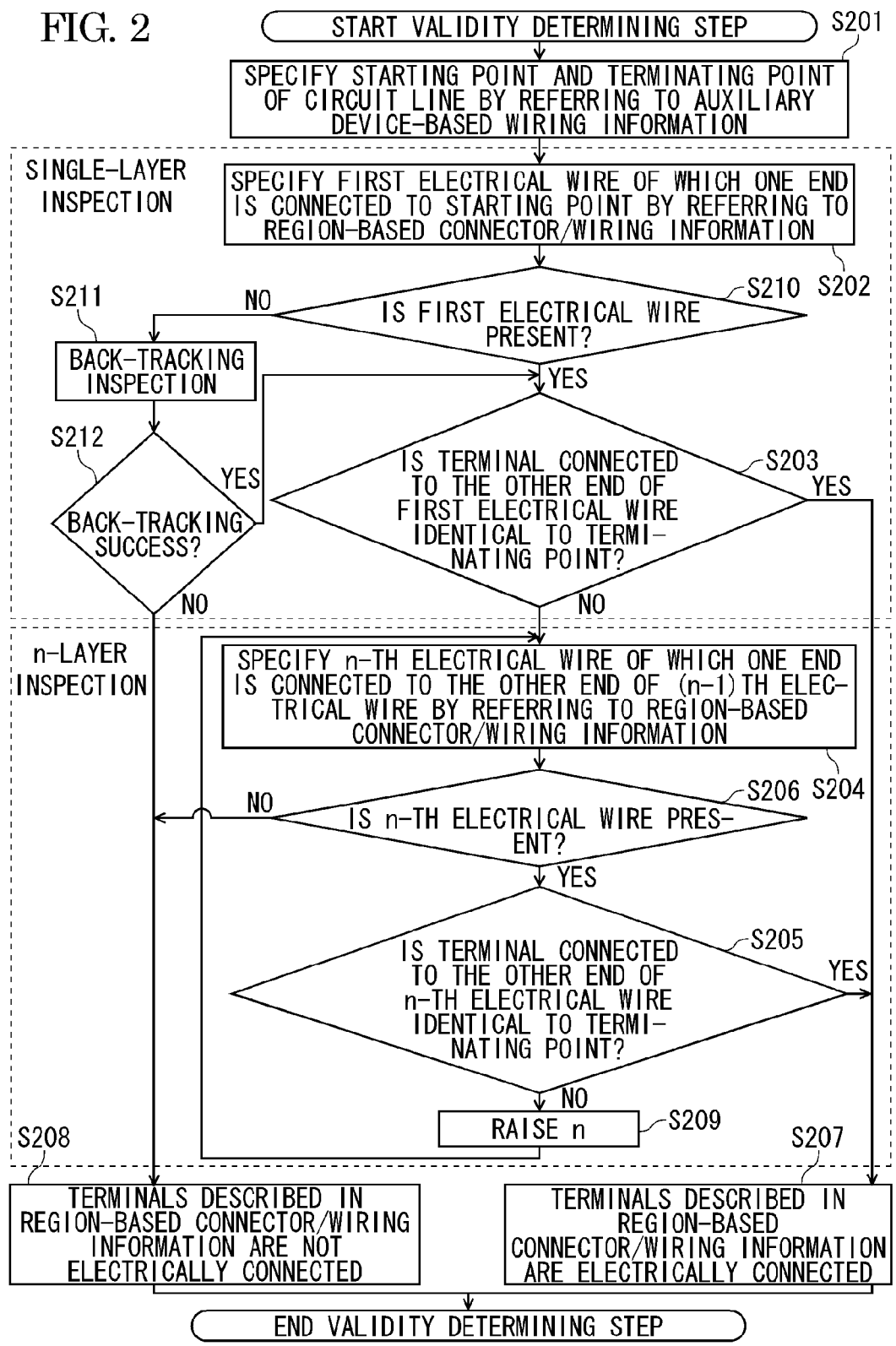
FIG. 2 is a flowchart of a process to be executed by a wire harness continuity inspection device according to an embodiment of the present invention.

Hereinafter, a wire harness continuity inspection device according to an embodiment of the present invention will be described. First, an overview of a process to be executed by the wire harness continuity inspection device according to the embodiment of the present invention will be described. FIG. 1(a) is a schematic view of a circuit line connecting electrical components described in auxiliary device-based wiring information, and FIGS. 1(b) to 1(f) are schematic views of connections of electrical wires connecting electrical components described in region-based connector/wiring information. FIG. 2 shows a flowchart of a process to be executed by the wire harness continuity inspection device according to the embodiment of the present invention.

[Overview of Multilayer Inspection]

As described in "Background Art", the auxiliary device-based wiring information includes circuit line connection information showing which electrical component and which terminals of the electrical component, the starting point and the terminating point of each of the electrical wires of these signal line, power line, and ground line are connected to, and which electrical wires, the signal line is connected to. FIG. 1(a) shows two ECUs which are electrical components, and a terminal "A01" of one of the ECUs is connected to a terminal "B01" of the other ECU via a circuit line. First, the wire harness continuity inspection device according to the embodiment of the present invention refers to the auxiliary device-based wiring information to specify a first terminal ("A01") of a first electrical component (ECU) and a second terminal ("B01") of a second electrical component (ECU) connected by the circuit line, described in the auxiliary device-based wiring information (referring step: S201).

On the other hand, as described in "Background Art," the region-based connector/wiring information describes wire harnesses arrangeable in each subdivided region of a target vehicle while including the electrical wires described in the actual wiring diagram (that is, while satisfying required specifications). The wire harness continuity inspection device according to the embodiment of the present invention refers to the region-based connector/wiring information to specify a first electrical wire of which one end is connected to the first terminal ("A01") of the first electrical component (ECU) described in the region-based connector/wiring information based on the wire harness information described in the region-based connector/wiring information (first specifying step: S202). Although there may be a case where it is not possible to specify the first electrical wire from the region-based connector/wiring information (S210: N), this case will be described in "Single-Layer Inspection Algorithm." In "Overview of Multilayer Inspection," a case where it is possible to specify the first electrical wire from the region-based connector/wiring information will be described later.

In FIGS. 1(b) to 1(f), the line width of the electrical wire of which one end is connected to the first terminal ("A01") of the first electrical component (ECU) is larger than the circuit line of FIG. 1(a). In this way, the circuit line and the electrical wire are distinguished from each other in FIGS. 1(a) to 1(f). However, two electrical components are often arranged over a plurality of subdivided regions. In this case, respective wire harnesses arranged in respective subdivided regions are connected so that the terminals of the two electrical components are connected. Thus, it cannot be said that the other end of the first electrical wire W1 specified in the first specifying step is connected to the second terminal ("B01") of the second electrical component (ECU) in the same subdivided region 1 as shown in FIG. 1(b).

Therefore, based on such a situation, first, the wire harness continuity inspection device according to the embodiment of the present invention determines whether a terminal connected to the other end of the first electrical wire is identical to the second terminal ("B01") of the second electrical component (ECU) (first determining step: S203). As shown in FIG. 1(b), when it is determined that the other end of the first electrical wire W1 is connected to the second terminal ("B01") of the second electrical component (ECU) in the same subdivided region 1 and is identical to the second terminal ("B01") of the second electrical component (ECU) described in the auxiliary device-based wiring information (S203: Y), it is regarded that the first terminal ("A01") of the first electrical component (ECU) described in the region-based connector/wiring information is electrically connected to the second terminal ("B01") of the second electrical component (ECU) (continuity success: S207). In this way, a validity determining step regarding the circuit line of FIG. 1(a) ends.

On the other hand, in the wire harness continuity inspection device according to the embodiment of the present invention, in the first determining step, there may be a case where the terminal connected to the other end of the first electrical wire is not identical to the second terminal ("B01") of the second electrical component (ECU) (S203: N). In this case, the wire harness continuity inspection device according to the embodiment of the present invention refers to the region-based connector/wiring information to specify the second electrical wire of which one end is connected to the other end of the first electrical wire described in the region-based connector/wiring information based on the wire harness information described in the region-based connector/wiring information (second specifying step: S204). The second specifying step will be described in detail. For example, as shown in FIG. 1(c), an auxiliary device (in FIG. 1(c), a terminal "C01" is connected to the other end of the electrical wire W1, and the terminal "C01" is accommodated in a connector C1) connected to the other end of the first electrical wire W1 is specified from the information on a wire harness arranged in the subdivided region 1, an auxiliary device (a connector C2 in FIG. 1(c)) fitted to the connector C1 is specified from the information on a wire harness arranged in a subdivided region 2 adjacent to the subdivided region 1, and the second electrical wire W2 of which one end is connected to a terminal "C02" connected to the terminal "C01" among the terminals accommodated in the connector C2 is specified.

Furthermore, the wire harness continuity inspection device according to the embodiment of the present invention determines whether a terminal connected to the other end of the second electrical wire is identical to the second terminal ("B01") of the second electrical component (ECU) (second determining step: S205). As shown in FIG. 1(c), when it is determined that the other end of the second electrical wire W2 is connected to the second terminal ("B01") of the second electrical component (ECU) in the subdivided region 2, and is identical to the second terminal ("B01") of the second electrical component (ECU) described in the auxiliary device-based wiring information (S205:Y), it is regarded that the first terminal ("A01") of the first electrical component (ECU) described in the region-based connector/wiring information is electrically connected to the second terminal ("B01") of the second electrical component (ECU) (continuity success: S207). In this way, the validity determining step regarding the circuit line of FIG. 1(a) ends.

However, in the wire harness continuity inspection device according to the embodiment of the present invention, in the second determining step, there may be a case where the terminal connected to the other end of the second electrical wire is not identical to the second terminal ("B01") of the second electrical component (ECU). In this case, the wire harness continuity inspection device according to the embodiment of the present invention refers to the region-based connector/wiring information to specify a third electrical wire of which one end is connected to the other end of the second electrical wire described in the region-based connector/wiring information based on the wire harness information described in the region-based connector/wiring information (third specifying step: S204). The third specifying step will be described in detail. For example, as shown in FIG. 1(d), an auxiliary device (in FIG. 1(d), a terminal "C03" is connected to the other end of the electrical wire W2, and the terminal "C03" is accommodated in a connector C3) connected to the other end of the second electrical wire W2 is specified from the information on a wire harness arranged in the subdivided region 2, an auxiliary device (a connector C4 in FIG. 1(d)) fitted to the connector C3 is specified from the information on a wire harness arranged in a subdivided region 3 adjacent to the subdivided region 2, and a third electrical wire W3 of which one end is connected to the terminal "C04" connected to the terminal "C03" among the terminals accommodated in the connector C4 is specified.

Furthermore, the wire harness continuity inspection device according to the embodiment of the present invention determines whether a terminal connected to the other end of the third electrical wire is identical to the second terminal ("B01") of the second electrical component (ECU) (third determining step: S205). As shown in FIG. 1(d), when it is determined that the other end of the third electrical wire W3 is connected to the second terminal ("B01") of the second electrical component (ECU) in the subdivided region 3, and is identical to the second terminal ("B01") of the second electrical component (ECU) described in the auxiliary device-based wiring information, it is regarded that the first terminal ("A01") of the first electrical component (ECU) described in the region-based connector/wiring information is electrically connected to the second terminal ("B01") of the second electrical component (ECU) (continuity success: S207). In this way, the validity determining step regarding the circuit line of FIG. 1(a) ends.

In the third determining step (S205), when the terminal connected to the other end of the third electrical wire is not identical to the second terminal ("B01") of the second electrical component (ECU), if the wire harness information described in the region-based connector/wiring information includes information on the fourth, fifth, . . . , and n-th electrical wires W4, W5, . . . , and Wn, the fourth, fifth, . . . , and n-th specifying steps (S204) and the fourth, fifth, . . . , and n-th determining steps (S205) are sequentially performed while raising n (S209) (where n is an integer of 2 or more).

On the other hand, when the information on the electrical wire Wn connected to the electrical wire W(n−1) is not present in the wire harness information described in the region-based connector/wiring information (S206: N, where n is an integer of 2 or more), and in the n-th specifying step, it is not possible to specify the n-th electrical wire Wn, so that the (n−1)th electrical wire W(n−1) is not identical to the second terminal ("B01") of the second electrical component (ECU) described in the auxiliary device-based wiring information, it is regarded that the first terminal ("A01") of the first electrical component (ECU) described in the region-based connector/wiring information is not electrically connected to the second terminal ("B01") of the second electrical component (ECU) (continuity fail: S208). In this way, the validity determining step regarding the circuit line of FIG. 1(a) ends.

In FIGS. 1(a) to 1(d), an overview of a case where connectors of respective wire harnesses arranged in respective subdivided regions are connected to form electrical wires connected over a plurality of subdivided regions, and the terminals of two electrical components are connected by the electrical wires has been mainly described. In addition to connecting the electrical wires over a plurality of subdivided regions by a connector, there is a case where electrical wires are connected via a JB or a JC (see FIG. 1(e)). Moreover, there is also a case where a plurality of electrical wires is connected in a single subdivided region (see FIG. 1(f)). An overview of a process to be executed by the wire harness continuity inspection device according to the embodiment of the present invention with respect to the two cases will be described. First, a case where the electrical wires are connected via a JB will be described. The first specifying step (S202) and the first determining step (S203) are the same as those of the case where the electrical wires are connected over a plurality of subdivided regions by a connector, and description thereof will not be provided. Moreover, the reasoning of the case where the electrical wires are connected via a JC is the same as that of the case where the electrical wires are connected via a JB, and description thereof will not be provided.

In the wire harness continuity inspection device according to the embodiment of the present invention, a case where in the first determining step (S203), the terminal connected to the other end of the first electrical wire is not identical to the second terminal ("B01") of the second electrical component (ECU) (S203: N) will be described. In this case, the wire harness continuity inspection device according to the embodiment of the present invention refers to the region-based connector/wiring information to specify the second electrical wire of which one end is connected to the other end of the first electrical wire described in the region-based connector/wiring information based on the wire harness information described in the region-based connector/wiring information (second specifying step: S204). The second specifying step will be described in detail. As shown in FIG. 1(e), an auxiliary device (in FIG. 1(e), a terminal "#01" is connected to the other end of the electrical wire W1, and the terminal "#01" is accommodated in a connector Ca) connected to the other end of the first electrical wire W1 is specified from the information on a wire harness arranged in the subdivided region 1, and a JB having a connector fitting position A fitted to the connector Ca is specified from a correspondence table (details of the correspondence table will be described in "Details of JB Inspection"). Moreover, connector fitting positions B and D connected to the connector fitting position A via an electrical wire or a bus bar in the JB are specified, and second electrical wires W21 and W22 of which one set of ends are connected to terminals "%01" and "#03" accommodated in respective connectors Cb and Cd to which the respective connector fitting positions B and D are fitted are specified.

Furthermore, the wire harness continuity inspection device according to the embodiment of the present invention determines whether a terminal connected to the other end of the second electrical wire is identical to the second terminal ("B01") of the second electrical component (ECU) (second determining step: S205). As shown in FIG. 1(e), when it is determined that one of the other ends of the second electrical wires W21 or W22 is connected to the second terminal ("B01") of the second electrical component (ECU) in the subdivided region 2, and is identical to the second terminal ("B01") of the second electrical component (ECU) described in the auxiliary device-based wiring information, it is regarded that the first terminal ("A01") of the first electrical component (ECU) described in the region-based connector/wiring information is electrically connected to the second terminal ("B01") of the second electrical component (ECU) (continuity success: S207). In this way, the validity determining step regarding the circuit line of FIG. 1(e) ends.

When the electrical wires are connected via a JB (or a JC), since a number of electrical wires may be connected to a single electrical wire, it is necessary to determine whether the other end of each of these electrical wires is identical to the terminating point of the circuit line. This is an aspect different from that of a case where the electrical wires are connected over a plurality of subdivided regions by a connector.

Subsequently, an overview of a process to be executed by the wire harness continuity inspection device according to the embodiment of the present invention when a plurality of electrical wires is connected in a single subdivided region will be described. The first specifying step (S202) and the first determining step (S203) are the same as those of the case where the electrical wires are connected over a plurality of subdivided regions by a connector, and description thereof will not be provided.

In the wire harness continuity inspection device according to the embodiment of the present invention, a case where in the first determining step (S203), the terminal connected to the other end of the first electrical wire is not identical to the second terminal ("B01") of the second electrical component (ECU) (S203: N) will be described. In this case, the wire harness continuity inspection device according to the embodiment of the present invention refers to the region-based connector/wiring information to specify the second electrical wire of which one end is connected to the other end of the first electrical wire described in the region-based connector/wiring information based on the wire harness information described in the region-based connector/wiring information (second specifying step: S204). The second specifying step will be described in detail. For example, as shown in FIG. 1(f), a connection point (in FIG. 1(f), the other end of the electrical wire W1 is connected to one end of another electrical wire, for example, by welding or butt-joining, and "%E1" is assigned as a number identifying the welding or butt-joining point) connected to the other end of the first electrical wire W1 is specified from the information on a wire harness arranged in the subdivided region 1, and the second electrical wire W2 of which one end is connected to the connection point "%E1" is specified.

Furthermore, the wire harness continuity inspection device according to the embodiment of the present invention determines whether the terminal connected to the other end of the second electrical wire is identical to the second terminal ("B01") of the second electrical component (ECU) (second determining step: S205). As shown in FIG. 1(f), when it is determined that the other end of the second electrical wire W2 is connected to the second terminal ("B01") of the second electrical component (ECU) in the subdivided region 1, and is identical to the second terminal ("B01") of the second electrical component (ECU) described in the auxiliary device-based wiring information, it is regarded that the first terminal ("A01") of the first electrical component (ECU) described in the region-based connector/wiring information is electrically connected to the second terminal ("B01") of the second electrical component (ECU) (continuity success: S207). In this way, the validity determining step regarding the circuit line of FIG. 1(f) ends.

Hereinabove, an overview of a process to be executed by the wire harness continuity inspection device according to the embodiment of the present invention has been described. As described with reference to FIGS. 1(a) to 1(f), the wire harness continuity inspection device according to the embodiment of the present invention refers to the auxiliary device-based wiring information to specify the starting point and the terminating point of the circuit line and recursively analyzes whether the other end of the first electrical wire of which one end is connected to the starting point of the circuit line specified by referring to the region-based connector/wiring information or the other end of the n-th electrical wire (where n is an integer of 2 or more) of which one end is connected to the other end of the (n−1)th electrical wire is identical to the terminating point of the circuit line, or the n-th electrical wire Wn is not present, so that the (n−1)th electrical wire W(n−1) is not identical to the terminating point of the circuit line. As above, the process of specifying the electrical wires of the first electrical wire W1, the second electrical wire W2, . . . , and the N-th electrical wire WN and the process of determining whether the other end of each of these electrical wires is identical to the terminating point of the circuit line will be collectively referred to as "multilayer inspection." Moreover, within the "multilayer inspection," the process of specifying the first electrical wire W1 of which one end is connected to the starting point of the circuit line (first specifying step: S202) and determining whether the other end of the electrical wire W1 is identical to the terminating point of the circuit line (first determining step: S203) will be referred to as "single-layer inspection." Furthermore, the process of specifying the n-th electrical wire Wn (where n is an integer of 2 or more) (n-th specifying step: S204) and determining whether the other end of the electrical wire Wn is identical to the terminating point of the circuit line (n-th determining step: S205), including the process of S206 and S209 will be referred to as "n-layer inspection." For example, FIG. 1(b) is a case where it is determined by single-layer inspection that the other end of the first electrical wire W1 is identical to the terminating point of the circuit line, FIGS. 1(c), 1(e), and 1(f) are a case where it is determined by 2-layer inspection that the other end of the second electrical wire W2 (the second electrical wire W22 in the case of FIG. 1(e)) is identical to the terminating point of the circuit line, and FIG. 1(d) is a case where it is determined by 3-layer inspection that the other end of the third electrical wire W3 is identical to the terminating point of the circuit line.

Figure 3:
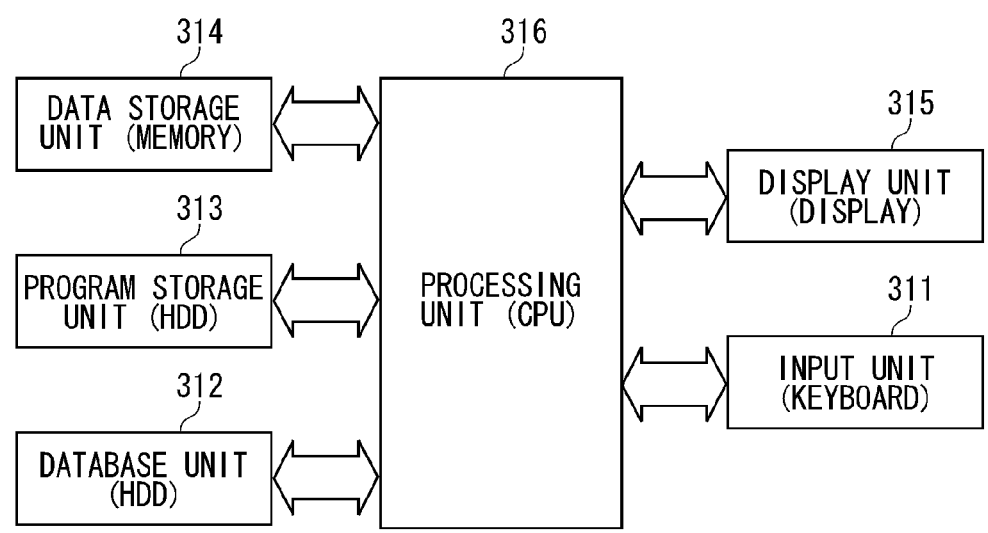
FIG. 3 is a functional block diagram of the wire harness continuity inspection device according to the embodiment of the present invention.

Hereinafter, details of the multilayer inspection to be executed by the wire harness continuity inspection device according to the embodiment of the present invention will be described. First, the configuration of the wire harness continuity inspection device according to the embodiment of the present invention will be described with reference to the functional block diagram shown in FIG. 3, of the wire harness continuity inspection device according to the embodiment of the present invention.

[Configuration of Wire Harness Continuity Inspection Device]

The wire harness continuity inspection device according to the embodiment of the present invention is configured to include an input unit 311, a database unit 312, a program storage unit 313, a data storage unit 314, a display unit 315, and a processing unit 316. When the wire harness continuity inspection device of the present invention is configured as a general-purpose PC, for example, the input unit 311 is realized as various input interfaces such as a keyboard, a mouse, and a number pad. The database unit 312 and the program storage unit 313 are realized as a hard disk drive (HDD), the data storage unit 314 is realized as a RAM (Random Access Memory), the display unit 315 is realized as various output devices such as a CRT display or a liquid crystal display, and the processing unit 316 is realized as a CPU (Central Processing Unit). The data of the auxiliary device-based wiring information, the data of the region-based connector/wiring information of necessary, the data of the actual wiring diagram prepared based on the auxiliary device-based wiring information), and the data of the auxiliary device specification table are stored in the database unit 312. Moreover, programs for allowing the processing unit 316 to execute the multilayer inspection and "Preliminary Electrical Wire Bonding Step" described later are recorded in the program storage unit 313. Moreover, data input and output to and from the processing unit 316 executing the multilayer inspection and the preliminary electrical wire bonding step are recorded in the data storage unit 314. A person who instructs the wire harness continuity inspection device of the present invention to execute the multilayer inspection performs various operations for allowing the processing unit 316 to perform computation using the input unit 311 while viewing the display unit 315.

Subsequently, details of an algorithm of the multilayer inspection will be described. The multilayer inspection is classified into single-layer inspection and n-layer inspection, and first, the details of the single-layer inspection algorithm will be described.

[Details of Single-Layer Inspection]

(Auxiliary Device-Based Wiring Information and Region-Based Connector/Wiring Information)

When executing the single-layer inspection, first, some information is extracted from the auxiliary device-based wiring information and the region-based connector/wiring information. The information extracted from the auxiliary device-based wiring information and the region-based connector/wiring information will be described with reference to an example of the auxiliary device-based wiring information and the region-based connector/wiring information, shown in FIGS. 4A and 4B.

As shown in FIG. 4A, the auxiliary device-based wiring information is made up of three elements of system name; F-part name and terminal; and T-part name and terminal. The column of F-part name and the column of terminal adjacent to the column of F-part name form a pair. Similarly, the column of T-part name and the column of terminal adjacent to the column of T-part name form a pair. Each row of the arrangement forming the auxiliary device-based wiring information represents the starting point and the terminating point of one circuit line described in the auxiliary device-based wiring information. For example, the first row of FIG. 4A represents a circuit line of which the starting point is a terminal "A01" of an electrical component "MAIN_ECU" in the auxiliary device-based wiring information described in a system "ABS" (see the columns of F-part name and terminal), and of which the terminating point is a terminal "A02" of an electrical component "ABS_SWITCH." As above, the column of system name stores information on the name of a system mounted on a vehicle, the columns of F-part name and terminal store information on the name of an electrical component serving as a starting point (From) and the identification number of a terminal of the electrical component, and the columns of T-part name and terminal store information on the name of an electrical component serving as the terminating point (To) and the identification number of a terminal of the electrical component.

Moreover, the first to third rows of FIG. 4A represent the circuit lines in the auxiliary device-based wiring information described in the system "ABS," the fourth to sixth rows represent the circuit lines in the auxiliary device-based wiring information described in the system "A/C," and the seventh to ninth rows represent the circuit lines in the auxiliary device-based wiring information described in the system "METER." The auxiliary device-based wiring information made up of these elements can be prepared by extracting the information on the above-described elements from the data of the auxiliary device-based wiring information. In this case, as can be understood from that fact that the circuit lines of a plurality of systems are included in one set of auxiliary device-based wiring information, the auxiliary device-based wiring information is made up of the data of a plurality of sets of auxiliary device-based wiring information for the vehicle (one set of auxiliary device-based wiring information is provided for one system). The prepared auxiliary device-based wiring information is stored in the data storage unit 314.

On the other hand, as shown in FIG. 4B, the region-based connector/wiring information is made up of three elements of: drawing part number, F-connector name, connector part number, terminal, cavity number (hereinafter simply referred to as C/N), and F-part number; and T-connector name, connector part number, terminal, C/N, and T-part number. The five columns of F-connector name to F-part number form a group. Similarly, the five columns of T-connector name to T-part number form a group. Each row of the arrangement forming the region-based connector/wiring information represents terminals connected to both ends of one electrical wire described in the region-based connector/wiring information. For example, the second row of FIG. 4B shows an electrical wire of which one end is connected to a terminal "Z03" accommodated in a C/N "9" of a connector identified by connector name "WtoW-E53" and connector part number "111-000-111" in a wire harness identified by identification number "111," arranged in a subdivided region identified by identification number "E11," (see the columns of F-connector name, connector part number, terminal, and C/N; information is stored in the column of F-part number when the terminal is accommodated in a JC, and the purpose thereof will be described in "Details of JC Inspection") and of which the other end is connected to a terminal "Z02" accommodated in the C/N "9" of the connector identified by connector name "WtoW-E51" and connector part number "111-000-111" (see the columns of T-connector name, connector part number, terminal, C/N; information is stored in the column of T-part number when the terminal is accommodated in the JC, and the purpose thereof will be described in "Details of JC Inspection"). As above, a portion before "-" in the drawing part number stores the identification information of a subdivided region of the vehicle, and the portion after "-" stores the identification information of the wire harness (although the information of the drawing part number is made up of two sets of information of the identification information of the subdivided region and the identification information of the wire harness, the identification information of the subdivided region and the identification information of the wire harness may be described in the region-based connector/wiring information as different information instead of using the drawing part number). The columns of F-connector name, connector part number, terminal, and C/N store the identification information of an auxiliary device connected to one end of the electrical wire. The columns of T-connector name, connector part number, terminal, and C/N store the identification information of an auxiliary device connected to the other end of the electrical wire. When an end portion of an electrical wire is connected to an auxiliary device, the name of the auxiliary device is stored in the F-connector name and the T-connector name. When the end portion of the electrical wire is connected to an electrical component, the name of the electrical component is stored as information. For example, the name "J/C-1" of an electrical component is stored in the F-connector name on the first row of the region-based connector/wiring information.

Moreover, the arrangement at the top of FIG. 4B shows terminals connected to both ends of an electrical wire included in a wire harness identified by drawing part number "E11-111." The arrangement in the middle shows terminals connected to both ends of an electrical wire included in a wire harness identified by drawing part number "E12-111." The arrangement at the bottom shows terminals connected to both ends of an electrical wire included in a wire harness identified by drawing part number "E41-111." The region-based connector/wiring information made up of these elements can be prepared by extracting information on the above-described elements from the data of the region-based connector/wiring information. The prepared region-based connector/wiring information is stored in the data storage unit 314.

(Single-Layer Inspection Algorithm)

Next, details of a single-layer inspection algorithm will be described with reference to FIGS. 4A and 4B. As described in "Overview of Multilayer Inspection," the single-layer inspection includes the process of specifying the first electrical wire W1 of which one end is connected to the starting point of a circuit line (first specifying step: S202) and determining whether the other end of the electrical wire W1 is identical to the terminating point of the circuit line (first determining step: S203). In order to realize this process, the auxiliary device-based wiring information and the region-based connector/wiring information described in "Auxiliary Device-based Wiring Information and Region-based Connector/Wiring Information" are used.

First, one optional row constituting the arrangement of the auxiliary device-based wiring information is extracted by referring to the auxiliary device-based wiring information. In the following description, for better understanding of the single-layer inspection algorithm, a case where the first row of FIG. 4A is extracted will be described. When the validity determining step for the corresponding row ends, the validity determining step for another row is performed until the validity determining step is performed for all of the rows.

Subsequently, the information on F-part name and terminal thereof and the information on T-part name and terminal thereof are referred to within one row extracted from the arrangement of the auxiliary device-based wiring information. As shown in FIG. 4A, the F-part name is "MAIN_ECU," and the terminal thereof is "A01." Moreover, the T-part name is "ABS_SWITCH," and the terminal thereof is "A02." Hereinafter, the terminal paired with the F-part name will be referred to as an F-side terminal. Moreover, the terminal paired with the T-part name will be referred to as a T-side terminal.

Subsequently, it is checked whether there is a terminal identical to the F-side terminal "A01" among the terminals in the same group as the F-connector name or the terminals in the same group as the T-connector name by referring to the entire arrangement of the region-based connector/wiring information. Here, if the terminal identical to the F-side terminal "A01" is not present, it is regarded that the first electrical wire is not present (S210 of FIG. 2: N, hereinafter a process corresponding to a determination result of "No" will be referred to as "N"), and a determination result of continuity fail is obtained (a process "back-tracking inspection" S211 executed subsequent to this determination will be described in "Back-tracking Inspection" described later). This is because the F-side terminal itself described in the auxiliary device-based wiring information is not described in the region-based connector/wiring information.

If the terminal identical to the F-side terminal "A01" is present, it is checked whether there is a connector name identical to the F-part name "MAIN_ECU" among the F-connector names or the T-connector names in the same group as the terminal. Here, if the connector name identical to the F-part name "MAIN_ECU" is not present, it is regarded that the first electrical wire is not present (S210 of FIG. 2: N), and a determination result of continuity fail is obtained (a process "back-tracking inspection" S211 executed subsequent to this determination will be described in "Back-tracking Inspection" described later). This is because an electrical component itself identified by the F-part name "MAIN_ECU" described in the auxiliary device-based wiring information is not described in the region-based connector/wiring information. It can be understood from FIG. 4B that the first row of the bottom arrangement of the region-based connector/wiring information includes an F-connector name identical to the F-part name "MAIN_ECU" and a terminal identical to the F-side terminal "A01" on the same group as the F-connector name.

When the F-connector name or the T-connector name identical to the F-part name "MAIN_ECU" is present, subsequently, it is checked whether a terminal on the other end side, in the same group as the T-connector name or a terminal on the other end side, in the same group as the F-connector name among one row of the region-based connector/wiring information including the F-connector name or the T-connector name is identical to the T-side terminal "A02." Here, if the terminal is not identical to the T-side terminal "A02," the inspection transitions to 2-layer inspection. It can be understood from FIG. 4B that in the first row of the bottom arrangement of the region-based connector/wiring information, a terminal in the same group as the T-connector name is identical to the T-side terminal "A02."

When the terminal on the other end side in the same group as the T-connector name or the terminal on the other end side in the same group as the F-connector name, identical to the T-side terminal "A02" is present, subsequently, it is checked whether the T-connector name or the F-connector name in the same group as the terminal is identical to the T-part name "ABS_SWITCH." Here, if the connector name is not identical to the T-part name "ABS_SWITCH," the inspection transitions to 2-layer inspection. It can be understood from FIG. 4B that in the first row of the bottom arrangement of the region-based connector/wiring information, the T-connector name is identical to the T-part name "ABS_SWITCH."

Even when the name described in the F-part name or the T-part name of the auxiliary device-based wiring information and the name described in the F-connector name or the T-connector name of the region-based connector/wiring information represent the same electrical component or auxiliary device, the notations of the names may be different. In this case, a name library indicating the correspondence between the names is prepared separately, and a connector name identical to the F-part name or the T-part name of the auxiliary device-based wiring information is specified from the F-connector name or the T-connector name of the region-based connector/wiring information by referring to the name library. Alternatively, before performing the validity determining step, the F-part name or the T-part name of the auxiliary device-based wiring information or the F-connector name or the T-connector name of the region-based connector/wiring information is replaced with the other name by referring to the name library, and then, the validity determining step is performed. The same is applied to the n-layer inspection described later and the back-tracking inspection described later.

When proceeding to the 2-layer inspection, it is necessary to record the drawing part number, the T-connector name on the other end side, the connector part number, the terminal, the C/N, and the T-part number, or the drawing part number, the F-connector name on the other end side, the connector part number, the terminal, the C/N, and the F-part number in the data storage unit 314. This is because these sets of information are information on the other end of the first electrical wire W1 specified by the single-layer inspection, and these sets of information are required in order to specify one end of the second electrical wire W2 by the 2-layer inspection.

Through the above processes, one row of the arrangement of the region-based connector/wiring information in which the information on the F-part name and the terminal thereof and the information on the T-part name and the terminal thereof are included in the information on the F-connector name and the terminal thereof and the information on the T-connector name and the terminal thereof is retrieved within one row extracted from the arrangement of the auxiliary device-based wiring information. As shown in FIGS. 4A and 4B, when identical information is discovered (the first row of the auxiliary device-based wiring information of FIG. 4A is identical to the first row of the region-based connector/wiring information at the bottom of FIG. 4B), it can be regarded that the starting point and the terminating point of the circuit line represented by one row extracted from the arrangement of the auxiliary device-based wiring information are electrically connected by the electrical wire represented by the corresponding one row of the region-based connector/wiring information (continuity success). On the other hand, when identical information is not discovered, as described above, in the course of the inspection, it is regarded that the starting point and the terminating point of the circuit line represented by one row extracted from the arrangement of the auxiliary device-based wiring information are not electrically connected (continuity fail), or the inspection transitions to the 2-layer inspection.

However, as described above, the single-layer inspection is the process of specifying the first electrical wire W1 of which one end is connected to the starting point of the circuit line (first specifying step: S202) and determining whether the other end of the electrical wire W1 is identical to the terminating point of the circuit line (first determining step: S203). This process assumes that the electrical components serving as the starting point and the terminating point of the circuit line are reliably fitted to one end and the other end of the first electrical wire W1 by connectors, and that the terminal on the electrical component side is electrically connected to the one end or the other end of the first electrical wire W1. If this assumption is false, that is, if there is an error in a combination of connectors between the electrical components serving as the starting point and the terminating point of the circuit line and the one end and the other end of the first electrical wire W1, even if a determination result of continuity success is obtained through the first specifying step and the first determining step, they are not actually electrically connected. Thus, in the following description, the single-layer inspection algorithm in which the validity of the combination of connectors between the electrical components serving as the starting point and the terminating point of the circuit line and the one end and the other end of the first electrical wire W1 is added to the process described with reference to FIGS. 4A and 4B will be described with reference to FIGS. 14A to 14C. FIGS. 14A to 14C show another example of the auxiliary device-based wiring information, the region-based connector/wiring information, and the part number correspondence table. Since the region-based connector/wiring information of FIG. 14B is the same as that of FIG. 4A, description thereof will not be provided.

The auxiliary device-based wiring information is made up of three elements: system name; F-part name, part number, terminal, and C/N; and T-part name, part number, terminal, and C/N, shown in FIG. 14A. That is, part number and C/N corresponding to F-part name and part number and C/N corresponding to T-part name are added to the auxiliary device-based wiring information shown in FIG. 4A. The column of F-part name and the columns of part number, terminal, and C/N arranged to the right of the column of F-part name form a pair. Similarly, the column of T-part name and the columns of part number, terminal, and C/N arranged to the right of the column of T-part name form a pair. Each row of the arrangement forming the auxiliary device-based wiring information represents the starting point and the terminating point of one circuit line described in the auxiliary device-based wiring information. For example, the first row of FIG. 14A represents a circuit line of which the starting point is a terminal "A01" accommodated in a C/N "4" of an electrical component-side connector identified by a part number "K-000-111" included in an electrical component "MAIN_ECU" in the auxiliary device-based wiring information described in a system "ABS" (see the columns of F-part name, part number, terminal, and C/N), and of which the terminating point is a terminal "A02" accommodated in a C/N "4" of a part number "K-000-112" included in an electrical component "ABS_SWITCH." As above, the column of system name stores information on the name of a system mounted on a vehicle, the columns of F-part name, part number, terminal, and C/N store information on the name of an electrical component serving as a starting point (From), the identification number of a connector included in the electrical component, and the identification numbers of the terminal and the C/N included in the connector, and the columns of T-part name, part number, terminal, and C/N store information on the name of an electrical component serving as the terminating point (To), the identification number of a connector included in the electrical component, and the identification numbers of the terminal and the C/N included in the connector.

Moreover, the first to third rows of FIG. 14A represent the circuit lines in the auxiliary device-based wiring information described in the system "ABS," the fourth to sixth rows represent the circuit lines in the auxiliary device-based wiring information described in the system "A/C," and the seventh to ninth rows represent the circuit lines in the auxiliary device-based wiring information described in the system "METER." The auxiliary device-based wiring information made up of these elements can be prepared by extracting the information on the above-described elements from the data of the auxiliary device-based wiring information. In this case, as can be understood from that fact that the circuit lines of a plurality of systems are included in one set of auxiliary device-based wiring information, the auxiliary device-based wiring information is made up of the data of a plurality of sets of auxiliary device-based wiring information for the vehicle (one set of auxiliary device-based wiring information is provided for one system). The prepared auxiliary device-based wiring information is stored in the data storage unit 314.

Furthermore, the part number correspondence table will be described. As shown in FIG. 14C, the part number correspondence table is made up of a pair of two arrangements of part number and connector part number. The column of part number stores information on the identification number of a connector included in an electrical component, and the column of connector part number stores information on a connector part number that can be fitted to the connector specified by the part number. The part number correspondence table shows that the part number and the connector part number adjacent to each other are in a fitted relation. For example, the first row of FIG. 14C shows that a connector on an electrical component side identified by the part number "K-000-111" and a connector specified by the connector part number "111-000-111" are in a fitted relation. The part number correspondence table made up of these elements can be prepared by extracting information on the above-described elements from the data of the region-based connector/wiring information. The prepared connector name correspondence table is stored in the data storage unit 314.

Subsequently, the single-layer inspection algorithm in which the validity of the combination of the electrical components serving as the starting point and the terminating point of the circuit line and the one end and the other end of the first electrical wire W1 is added to the process described with reference to FIGS. 4A and 4B will be described.

First, one optional row constituting the arrangement of the auxiliary device-based wiring information is extracted by referring to the auxiliary device-based wiring information. In the following description, for better understanding of the single-layer inspection algorithm, a case where the first row of FIG. 14A is extracted will be described. When the validity determining step for the corresponding row ends, the validity determining step for another row is performed until the validity determining step is performed for all of the rows.

The information on F-part name, part number thereof, terminal thereof, and C/N thereof, and the information on T-part name, part number thereof, terminal thereof, and C/N thereof are referred to within one row extracted from the arrangement of the auxiliary device-based wiring information. As shown in FIG. 14A, the F-part name is "MAIN_ECU," the part number thereof is "K-000-111," the terminal thereof is "A01," and the C/N thereof is "4." Moreover, the T-part name is "ABS_SWITCH," the part number thereof is "K-000-111," the terminal thereof is "A02," and the C/N thereof is "4." Hereinafter, the part number, the terminal, and the C/N paired with the F-part name will be referred to as an F-side part number, an F-side terminal, and an F-side C/N. Moreover, the part number, the terminal, and the C/N paired with the T-part name will be referred to as a T-side part number, a T-side terminal, and a T-side C/N.

Subsequently, it is checked whether there is a terminal identical to the F-side terminal "A01" among the terminals in the same group as the F-connector name or the terminals in the same group as the T-connector name by referring to the entire arrangement of the region-based connector/wiring information. Here, if the terminal identical to the F-side terminal "A01" is not present, it is regarded that the first electrical wire is not present (S210 of FIG. 2: N), and a determination result of continuity fail is obtained (a process "back-tracking inspection" S211 executed subsequent to this determination will be described in "Back-tracking Inspection" described later). This is because the F-side terminal itself described in the auxiliary device-based wiring information is not described in the region-based connector/wiring information.

When the terminal identical to the F-side terminal "A01" is present, subsequently, it is checked whether there is a C/N identical to the F-side C/N "4" among the C/Ns in the same group as the terminal. Here, if the C/N identical to the F-side C/N "4" is not present, it is regarded that the first electrical wire is not present (S210 of FIG. 2: N), and a determination result of continuity fail is obtained (a process "back-tracking inspection" S211 executed subsequent to this determination will be described in "Back-tracking Inspection" described later). This is because an electrical component itself identified by the F-part name "MAIN_ECU" described in the auxiliary device-based wiring information is not described in the region-based connector/wiring information.

When the terminal identical to the F-side C/N "4" is present, by referring to the F-side part number "K-000-111," it is checked whether a row in which the part number is identical to the identification information "K-000-111" is present in the part number correspondence table. It can be understood from FIG. 14C that "K-000-111" is included in the part number on the first row, and a connector part number paired with the part number "K-000-111" is "111-000-111." Moreover, it is checked whether a terminal of which the connector part number paired with the part number "K-000-111" is identical to "111-000-111" is present in the connector part numbers in the same group as the terminal. By this checking, the fitting between an electrical component-side connector and an electrical wire-side connector is checked.

When the terminal identical to the connector part number "111-000-111" is present, subsequently, it is checked whether a connector name identical to the F-part name "MAIN_ECU" is present in the F-connector names or the T-connector names in the same group as the terminal. Here, if the connector name identical to the F-part name "MAIN_ECU" is not present, it is regarded that the first electrical wire is not present (S210 of FIG. 2: N), and a determination result of continuity fail is obtained (a process "back-tracking inspection" S211 executed subsequent to this determination will be described in "Back-tracking Inspection" described later). This is because the electrical component itself identified by the F-part name "MAIN_ECU" described in the auxiliary device-based wiring information is not described in the region-based connector/wiring information. It can be understood from FIG. 14B that in the bottom arrangement of the region-based connector/wiring information, the first row includes the F-connector name identical to the F-part name "MAIN_ECU," includes the connector part number identical to the connector part number "111-000-111," and includes the terminal identical to the F-side terminal "A01" and the F-side C/N "4."

When the F-connector name or the T-connector name identical to the F-part name "MAIN_ECU" is present, it is checked whether a terminal on the other end side, in the same group as the T-connector name or a terminal on the other end side, in the same group as the F-connector name among one row of the region-based connector/wiring information including the F-connector name or the T-connector name is identical to the T-side terminal "A02." Here, if the terminal is not identical to the T-side terminal "A02," the inspection transitions to 2-layer inspection. It can be understood from FIG. 14B that in the first row of the bottom arrangement of the region-based connector/wiring information, a terminal in the same group as the T-connector name is identical to the T-side terminal "A02."

When the terminal on the other end side in the same group as the T-connector name or the terminal on the other end side in the same group as the F-connector name, identical to the T-side terminal "A02" is present, subsequently, it is checked whether a C/N identical to the T-side C/N "4" is present in the C/Ns in the same group as the terminal. Here, if the C/N is not identical to the T-side C/N "4," the inspection transitions to 2-layer inspection. It can be understood from FIG. 14B that in the first row of the bottom arrangement of the region-based connector/wiring information, the C/N is identical to the T-side C/N "4."

When the terminal identical to the T-side C/N "4" is present, by referring to the connector part number "111-000-112" in the same group as the terminal, it is checked whether a row in which the connector part number is identical to the connector part number "111-000-112" is present in the part number correspondence table. It can be understood from FIG. 14C that "111-000-112" is included in the connector part number on the second row, and a part number paired with the connector part number "111-000-112" is "K-000-112." Moreover, it is checked whether a terminal of which the part number paired with the connector part number "111-000-112" is identical to "K-000-112" is present in the connector part numbers in the same group as the terminal. By this checking, the fitting between an electrical component-side connector and an electrical wire-side connector is checked.

When the terminal identical to the part number "K-000-112" is present, subsequently, it is checked whether a connector name identical to the T-part name "ABS_SWITCH" is present in the F-connector names or the T-connector names in the same group as the terminal. Here, if the connector name is not identical to the T-part name "ABS_SWITCH," the inspection transitions to the 2-layer inspection. It can be understood from FIG. 14B that in the first row of the bottom arrangement of the region-based connector/wiring information, the T-connector name is identical to the T-part name "ABS_SWITCH."

In this way, it is possible to perform continuity inspection while checking the fitting state due to connectors between the electrical components serving as the starting point and the terminating point of the circuit line and the one end and the other end of the first electrical wire W1. In this way, it is possible to further improve the accuracy of the continuity inspection.

Even when the name described in the F-part name or the T-part name of the auxiliary device-based wiring information and the name described in the F-connector name or the T-connector name of the region-based connector/wiring information represent the same electrical component or auxiliary device, the notations of the names may be different. In this case, a name library indicating the correspondence between the names is prepared separately, and a connector name identical to the F-part name or the T-part name of the auxiliary device-based wiring information is specified from the F-connector name or the T-connector name of the region-based connector/wiring information by referring to the name library. Alternatively, before performing the validity determining step, the F-part name or the T-part name of the auxiliary device-based wiring information or the F-connector name or the T-connector name of the region-based connector/wiring information is replaced with the other name by referring to the name library, and then, the validity determining step is performed. The same is applied to the n-layer inspection described later and the back-tracking inspection described later.

Subsequently, details of the n-layer inspection algorithm will be described.

[Details of n-Layer Inspection]
[Key Point of n-Layer Inspection]

In this section, details of a case where the flow proceeds from single-layer inspection to 2-layer inspection will be mainly described. This is because the 2-layer inspection is repeated in the 3-layer inspection and the subsequent layer inspection. Although a single electrical wire is subjected to the single-layer inspection, at least two electrical wires of which the end portions are connected are subjected to the n-layer inspection. In order to specify another electrical wire of which one end is connected to the other end of one electrical wire from the region-based connector/wiring information, it is necessary to execute a process corresponding to connection means that realizes the connection. The connection means includes (1) connector-based connection (see FIG. 1(c)), (2) JB-based connection (see FIG. 1(e)), (3) JC-based connection, and (4) welding or butt-joining-based connection (see FIG. 1(f)). In order to specify the second electrical wire W2 in the 2-layer inspection, it is necessary to use electrical wire specifying methods corresponding to these connection means. Hereinafter, the electrical wire specifying method corresponding to the connection means (1) will be referred to as "WtoW inspection," the electrical wire specifying method corresponding to the connection means (2) will be referred to as "JB inspection," the electrical wire specifying method corresponding to the connection means (3) will be referred to as "JC inspection," and the electrical wire specifying method corresponding to the connection means (4) will be referred to as "W/S (Weld Splice) inspection" and "B/S (Butt Splice) inspection." Although the 2-layer inspection performs these "WtoW inspection," "JB inspection," "JC inspection," "W/S inspection," and "B/S inspection," after the second electrical wire W2 is specified by executing any of these electrical wire specifying methods, it is finally possible to specify that connection means for connecting the other end of the first electrical wire W1 and one end of the second electrical wire W2 is any one of the specifying methods (1) to (4) corresponding to the specifying method (the key point is that since it is not possible to understand connection means for connecting the other end of the first electrical wire W1 and one end of the second electrical wire W2 in advance, it is necessary to execute the electrical wire specifying methods sequentially until the second electrical wire W2 can be specified). Thus, in this example, the electrical wire specifying method is used sequentially in the order of WtoW inspection, JB inspection, JC inspection, W/S inspection, and B/S inspection. The order of using the electrical wire specifying method in the present invention is not limited to the order of WtoW inspection, JB inspection, JC inspection, W/S inspection, and B/S inspection. For example, the electrical wire specifying method may be used in descending order of frequencies in which they are used as the electrical wire connection means. As a result, it is possible to specify the second electrical wire W2 with a smaller amount of computation. Hereinafter, the details of the electrical wire specifying method will be described in the order of WtoW inspection, a inspection, JC inspection, W/S inspection, and B/S inspection. It is to be noted that in the n-layer inspection, "WtoW inspection," "JB inspection," "JC inspection," "W/S inspection," and "B/inspection" are executed. Similarly, in the (n+1)-layer inspection, "WtoW inspection," "JB inspection," "JC inspection," "W/S inspection," and "B/inspection" are also executed. In other words, the transition from WtoW inspection to JB inspection, for example, is a transition in the same layer rather than a transition where the layer number is raised. This should be noted.

(Details of WtoW Inspection)

The details of WtoW inspection will be described with reference to examples of the auxiliary device-based wiring information, the region-based connector/wiring information, the connector name correspondence table, and the connector part number correspondence table shown in FIGS. 5A to 5D. The auxiliary device-based wiring information and the region-based connector/wiring information are the same as those described in "Auxiliary Device-Based Wiring Information And Region-Based Connector/Wiring Information" in "Details of Single-Layer Inspection," and description thereof will not be provided.

First, a connector name correspondence table will be described. As shown in FIG. 5C, the connector name correspondence table is made up of two arrangements of region name and connector name. The column of region name stores information on the identification number of a subdivided region where a wire harness is arranged, and the column of connector name stores information on the identification information of an auxiliary device connected to one end of an electrical wire included in the wire harness. The connector name correspondence table shows that one set of region name and connector name and the other set of region name and connector name adjacent thereto are in such a relation that auxiliary devices specified by the connector names are fitted to each other. For example, the first row of FIG. 5C shows that an auxiliary device specified by the connector name "WtoW-E12," of a wire harness arranged in the subdivided region identified by the identification number "E11" and an auxiliary device specified by the connector name "WtoW-E11-1," of a wire harness arranged in the subdivided region identified by the identification number "E12" are in a fitted relation. The connector name correspondence table made up of these elements can be prepared by extracting information on the above-described elements from the data of the region-based connector/wiring information. The prepared connector name correspondence table is stored in the data storage unit 314.

Next, the connector part number correspondence table will be described. The connector part number correspondence table is made up of a pair of arrangements of two connector part numbers as shown in FIG. 5D. The connector part number stores information on the identification information of an auxiliary device. The connector part number correspondence table shows that one connector part number and the other connector part number adjacent thereto are in such a relation that auxiliary devices specified by the connector part numbers are fitted to each other. For example, the first row of FIG. 5D shows that an auxiliary device specified by the connector part number "999-111-101" and an auxiliary device specified by the connector part number "999-111-102" are in a fitted relation. The connector part number correspondence table made up of these elements can be prepared by extracting information on the above-described elements from the data of the region-based connector/wiring information. The prepared connector part number correspondence table is stored in the data storage unit 314.

Subsequently, the details of a WtoW inspection algorithm will be described. Before the WtoW inspection is executed, single-layer inspection (a case of WtoT inspection in 2-layer inspection) or (n−1)-layer inspection (a case of WtoT inspection in n-layer inspection) has been executed. By the inspection, the information on the other end of the (n−1)th electrical wire W(n−1) (drawing part number, T-connector name on the other end side, connector part number, terminal, C/N, and T-part number, or F-connector name on the other end side, connector part number, terminal, C/N, and F-part number) is recorded in the data storage unit 314 (see "Single-Layer Inspection Algorithm"). When executing WtoW inspection in the n-layer inspection, first, the information on the other end of the (n−1)th electrical wire W(n−1) recorded in the data storage unit 314 is referred to. In this way, referring to FIG. 5B, it is possible to obtain T-connector name "WtoW-E11-8," connector part number "999-111-102," terminal "A01," and C/N "4" as the information on the other end of the first electrical wire W1. In the subsequent process, one end of the second electrical wire W2 is specified from the other end of the first electrical wire W1 specified in this way.

First, by referring to the identification information "E41" of a subdivided region in the drawing part number "E41-111" within the information on the other end of the first electrical wire W1, it is checked whether a row in which the region name is identical to the identification information "E41" is present in the connector name correspondence table. It can be understood from FIG. 5C that "E41" is included in the region names of two rows. Moreover, by referring to the connector name "WtoW-E11-8" within the information on the other end of the first electrical wire W1, it is checked whether a row in which the connector name is identical to "WtoW-E11-8" is present in the connector name correspondence table. In this case, the checking is performed with respect to the arrangements in which the region name and the connector name are paired with each other. It can be understood from FIG. 5C that "WtoW-E1'-8" is included in the connector name on the bottom row.

Similarly, by referring to the connector part number "999-111-102" within the information on the other end of the first electrical wire W1, it is checked whether a row in which the connector part number is identical to "999-111-102" is present in the connector part number correspondence table. In this case, the checking is performed with respect to the arrangements of two connector part numbers. It can be understood from FIG. 5D that "999-111-102" is included in the connector part number on the first row.

In this way, the checking is subsequently performed with respect to the region-based connector/wiring information by referring to the information on the rows specified from the connector name correspondence table and the connector part number correspondence table. First, a row in which the identification information of a subdivided region in the drawing part number is identical to a counterpart region name "E11" of the row specified from the connector name correspondence table is extracted. Moreover, a connector of which the F-connector name or the T-connector name is identical to the counterpart connector name "WtoW-E41-2" of the row specified from the connector name correspondence table is extracted within the extracted row. Furthermore, a connector of which the connector part number in the same group as the F-connector name or the connector part number in the same group of the T-connector name is identical to the counterpart connector part number "999-111-101" of the row specified from the connector part number correspondence table is extracted. It can be understood from FIG. 5B that these sets of information are included in the connector part number in the same group as the drawing part number, the F-connector name, and the F-connector name on the third row at the top of the region-based connector/wiring information. Furthermore, it is checked whether the C/Ns of the fitting connectors are identical. One row of the region-based connector/wiring information specified in this way (the third row at the top of the region-based connector/wiring information in FIG. 5B) is the second electrical wire W2 of which one end is connected to one end of the first electrical wire W1. When the corresponding row is not present, it is regarded that the connection means for connecting the first electrical wire W1 and the second electrical wire W2 is not the connector-based connection (1), and the inspection transitions to JB inspection.

When the second electrical wire W2 is specified in this way (the process so far corresponds to S204 of FIG. 2), it is checked whether a terminal in the same group as the T-connector name on the other end side or a terminal in the same group as the F-connector name on the other end side within the specified one row of the region-based connector/wiring information is identical to the T-side terminal "A02." Here, if the terminal is not identical to the T-side terminal "A02," the inspection transitions to 3-layer inspection. It can be understood from FIG. 5B that in the third row at the top of the region-based connector/wiring information, the terminal in the same group as the T-connector name is identical to the T-side terminal "A02."

When the terminal in the same group as the T-connector name on the other end side or the terminal in the same group as the F-connector name on the other end side, identical to the T-side terminal "A02" is present, it is checked whether the T-connector name or the F-connector name in the same group as the terminal is identical to the T-part name "ABS_SWITCH." Here, if the connector name is not identical to the T-part name "ABS_SWITCH," the inspection transitions to 3-layer inspection. It can be understood from FIG. 5B that in the third row at the top of the region-based connector/wiring information, the T-connector name is identical to the T-part name "ABS_SWITCH." In this way, it is possible to determine that the other end of the second electrical wire W2 is identical to the terminating point of the circuit line in the row described in the auxiliary device-based wiring information (S205 of FIG. 2: Y, hereinafter a process corresponding to a determination result of "Yes" will be referred to as "Y"). In this case, by performing the process described with reference to FIGS. 14A to 14C, the fitting state due to connectors between the electrical component serving as the terminating point of the circuit line and the other end of the second electrical wire W2 may be checked, so that the accuracy of the continuity inspection may be improved further. As a result, it is regarded that the circuit line in the row described in the auxiliary device-based wiring information is electrically connected in the region-based connector/wiring information (S207 of FIG. 2), and the validity determining step ends.

When proceeding to 3-layer inspection, it is necessary to record the drawing part number, the T-connector name on the other end side, the connector part number, the terminal, the C/N, and the T-part number, or the drawing part number, the F-connector name on the other end side, the connector part number, the terminal, the C/N, and the F-part number, of the specified row of the region-based connector/wiring information in the data storage unit 314. This is because these sets of information are information on the other end of the second electrical wire W2 specified by the single-layer inspection, and these sets of information are required in order to specify one end of the third electrical wire W3 by the 3-layer inspection.

Through the above processes, one row of the arrangement of the region-based connector/wiring information in which the information on the T-part name and the terminal thereof is included in the information on the F-connector name and the terminal thereof or the information on the T-connector name and the terminal thereof is retrieved within one row extracted from the arrangement of the auxiliary device-based wiring information. As shown in FIGS. 5A to 5D, when identical information is discovered (the first row of the auxiliary device-based wiring information of FIG. 5A is identical to the third row at the top of the region-based connector/wiring information of FIG. 5B), it can be regarded that the starting point and the terminating point of the circuit line represented by one row extracted from the arrangement of the auxiliary device-based wiring information are electrically connected by the electrical wires connected by the connector, represented by the corresponding two rows (two rows in the case of 2-layer inspection, and n rows in the case of n-layer inspection) of the region-based connector/wiring information (continuity success). On the other hand, when identical information is not discovered, as described above, the inspection transitions to the JB inspection or the 3-layer inspection in the course of the WtoW inspection.

(Details of JB Inspection)

The JB inspection is executed when it is not possible to specify the electrical wire in the WtoW inspection. The details of the JB inspection will be described with reference to examples of the auxiliary device-based wiring information, the region-based connector/wiring information, the JB-connector correspondence table, and the JB terminal connection correspondence table, shown in FIGS. 6A to 6D. The auxiliary device-based wiring information and the region-based connector/wiring information are the same as those described in "Auxiliary Device-Based Wiring Information And Region-Based Connector/Wiring Information" in "Details of Single-Layer Inspection," and description thereof will not be provided.

First, the JB-connector correspondence table will be described. As shown in FIG. 6C, the JB-connector correspondence table is made up of main body part number, place, connector part number, and connector name. The column of main body part number stores information on the identification information for identifying a JB, the column of place (also referred to as a connector fitting position) stores information designating a connector fitting position of a JB into which a connector is inserted, the column of connector part number stores information on the identification number of a connector that can be inserted into the connector fitting position, and the column of connector name stores information on the name of a connector that can be inserted into the connector fitting position. In the JB-connector correspondence table, these four sets of information form a group. The JB-connector correspondence table shows that a connector specified by connector part number and connector name can be inserted into the designated connector fitting position of the JB identified by main body part number. For example, the first row of FIG. 6C shows that a connector identified by the connector part number "111-000-114" and the connector name of "J/B-4" can be inserted into the connector fitting position "A" of the JB identified by the identification number "888-000-111." The JB-connector correspondence table made up of these elements can be prepared by extracting information on the above-described elements from the data of the region-based connector/wiring information. The prepared JB-connector correspondence table is stored in the data storage unit 314.

Next, the JB terminal connection correspondence table will be described. As shown in FIG. 6D, the JB terminal connection correspondence table is made up of main body part number and cavity connection. The column of main body part number stores the identification information for identifying a JB, and the column of cavity connection stores information on a connection state between terminals within the JB. In the JB terminal connection correspondence table, these two sets of information form a group. The JB terminal connection correspondence table shows that terminals at least at two designated cavity positions of a JB identified by main body part number are electrically connected. For example, the eighth row of FIG. 6D shows that in the JB identified by the identification number "888-000-111," the cavity position "33" at the connector fitting position "A" (see "A33" of cavity connection), the cavity position "23" at the connector fitting position "B" (see "B23" of cavity connection), and the cavity position "32" at the connector fitting position "D" (see "D32" of cavity connection) are electrically connected within the JB (in FIG. 6D, "&" indicates that cavities are electrically connected, and "+" indicates that a cavity and an electrical element (a relay, a fuse, or the like) are electrically connected). The JB terminal connection correspondence table made up of these elements can be prepared by extracting information on the above-described elements from the data of the region-based connector/wiring information. The prepared JB terminal connection correspondence table is stored in the data storage unit 314.

Subsequently, the details of the JB inspection algorithm will be described. Before the JB inspection is executed, single-layer inspection (a case of JB inspection in 2-layer inspection) or (n−1)-layer inspection (a case of JB inspection in n-layer inspection) has been executed. By the inspection, the information on the other end of the (n−1)th electrical wire W(n−1) (drawing part number, T-connector name on the other end side, connector part number, terminal, C/N, and T-part name, or F-connector name on the other end side, connector part number, terminal, C/N, and F-part name) is recorded in the data storage unit 314 (see "Single-Layer Inspection Algorithm"). When executing JB inspection in the n-layer inspection, first, the information on the other end of the (n−1)th electrical wire W(n−1) recorded in the data storage unit 314 is referred to. In this way, referring to FIG. 6B, it is possible to obtain T-connector name "J/B-4," connector part number "999-111-104," terminal "##1," and C/N "33" as the information on the other end of the first electrical wire W1. In the subsequent process, one end of the second electrical wire W2 is specified from the other end of the first electrical wire W1 specified in this way.

First, by referring to the T-connector name "J/B-4" and the connector part number "999-111-104" within the information on the other end of the first electrical wire W1, it is checked whether a row in which the connector name is identical to the T-connector name "J/B-4," and the connector part number is identical to the connector part number "999-111-104" is not present in the JB-connector correspondence table. It can be understood from FIG. 6C that the connector name "J/B-4" and the connector part number "999-111-104" are included in the first row.

Subsequently, by referring to the main body part number and the connector fitting position in one row of the JB-connector correspondence table in which the identical connector part number and the identical connector name are included, and the C/N within the information on the other end of the first electrical wire W1, it is checked whether a row including these main body part number, connector part number and C/N are included is not present in the JB terminal connection correspondence table. It can be understood from FIG. 6D that the main body part number "888-000-111," the connector fitting position "A," and the C/N "33" are included in the eighth row of the JB terminal connection correspondence table (as for the connector fitting position "A" and the C/N "33," refer to "A33" within the cavity connection "A33&B23&D32"). If a desired row is present in the JB terminal connection correspondence table, it is possible to specify to which terminal and at which cavity position of the JB, the other end of the first electrical wire W1 is electrically connected. For example, the eighth row of the JB terminal connection correspondence table of FIG. 6D shows that the cavity position "33" (corresponding to the other end of the first electrical wire W1) of the connector fitting position "A" of the JB identified by the main body part number "888-000-111" is electrically connected to the cavity position "23" of the connector fitting position "B" of the JB and the cavity position "32" of the connector fitting position "D" of the JB. Based on this, the second electrical wire W2 of which one end is connected to the cavity position (excluding a terminal ("A33" in FIG. 6D) to which the other end of the first electrical wire W1 is directly connected) of the JB electrically connected to the other end of the first electrical wire W1 is subjected to the subsequent inspection. Thus, at this point in time, a plurality of candidates is present as the second electrical wire W2. For example, in the case of FIG. 6D, the second electrical wire W21 of which one end is connected to the cavity position "23" of the connector fitting position "B" and the second electrical wire W22 of which one end is connected to the cavity position "32" of the connector fitting position "D" are candidates for the second electrical wire W2 (see FIG. 1(e)).

Subsequently, by referring to the main body part number and the cavity connection in the row of the JB terminal connection correspondence table, it is checked whether a row in which any one of the cavity positions stored in the cavity connection is included is not present in the JB-connector correspondence table. It can be understood from FIG. 6C that the main body part number "888-000-111" and the connector fitting position "B" are included in the second row of the JB-connector correspondence table, and that the main body part number "888-000-111" and the connector fitting position "D" are included in the fourth row of the JB-connector correspondence table.

By referring to the information on the row specified from the JB-connector correspondence table and the cavity position of the connector fitting position specified from the JB terminal connection correspondence table in this way, the region-based connector/wiring information is checked. First, by referring to the connector part number and the connector name of one row specified from the JB-connector correspondence table, it is checked whether a row in which the connector part number is identical to the F-connector name and the connector part numbers in the same group of the F-connector name or the T-connector name and the connector part numbers in the same group as the T-connector name is not present in the region-based connector/wiring information. When the corresponding row is present, it is checked whether a row including the identical C/N is not present in the region-based connector/wiring information by referring to the cavity position of the connector fitting position specified from the JB terminal connection correspondence table. It can be understood from FIG. 6B that the F-connector name, the connector part number, and the C/N identical to the connector part number "111-000-113," the connector name "J/B-1-2-3," and the cavity position "23" on the second row of the JB-connector correspondence table are included in the third row at the bottom of the region-based connector/wiring information. Moreover, it can be understood that the F-connector name, the connector part number, and the C/N identical to the connector part number "111-000-116," the connector name "J/B-6," and the cavity position "32" on the fourth row of the JB-connector correspondence table are included in the fifth row at the bottom of the region-based connector/wiring information. One set of rows (the third and fifth rows at the bottom of the region-based connector/wiring information in FIG. 6B) of the region-based connector/wiring information specified in this way become the candidates for the second electrical wire W2 of which one end is connected to the other end of the first electrical wire W1. When the corresponding row is not present, it is regarded that the connection means for connecting the first electrical wire W1 and the second electrical wire W2 is not the JB-based connection (2), and the inspection transitions to JC inspection.

When the candidates for the second electrical wire W2 are specified in this way (the process so far corresponds to S204 of FIG. 2), it is checked whether a terminal in the same group as the T-connector name on the other end side or a terminal in the same group as the F-connector name on the other end side within the specified one row of the region-based connector/wiring information is not identical to the T-side terminal "B02." Here, if the terminal is not identical to the T-side terminal "B02," the inspection transitions to 3-layer inspection. It can be understood from FIG. 6B that in the third row at the bottom of the region-based connector/wiring information, since the terminal "E01" in the same group as the T-connector name is not identical to the T-side terminal "B02," the inspection transitions to 3-layer inspection. On the other hand, it can be understood that in the fifth row at the bottom of the region-based connector/wiring information, the terminal in the same group as the T-connector name is identical to the T-side terminal "B02."

When the terminal in the same group as the T-connector name on the other end side or the terminal in the same group as the F-connector name on the other end side, identical to the T-side terminal "B02" is present, it is checked whether the T-connector name or the F-connector name in the same group as the terminal is not identical to the T-part name "MAIN_ECU." Here, if the connector name is not identical to the T-part name "MAIN_ECU," the inspection transitions to 3-layer inspection. It can be understood from FIG. 6B that in the fifth row at the bottom of the region-based connector/wiring information, the T-connector name is identical to the T-part name "MAIN_ECU." In this way, it is possible to determine that the other end of the second electrical wire W2 is identical to the terminating point of the circuit line in the row described in the auxiliary device-based wiring information (S205 of FIG. 2: Y). In this case, by performing the process described with reference to FIGS. 14A to 14C, the fitting state due to connectors between the electrical component serving as the terminating point of the circuit line and the other end of the second electrical wire W2 may be checked, so that the accuracy of the continuity inspection may be improved further. As a result, it is regarded that the circuit line in the row described in the auxiliary device-based wiring information is electrically connected in the region-based connector/wiring information (S207 of FIG. 2), and the validity determining step ends.

When proceeding to 3-layer inspection, it is necessary to record the drawing part number, the T-connector name on the other end side, the connector part number, the terminal, the C/N, and the T-part name, or the drawing part number, the F-connector name on the other end side, the connector part number, the terminal, the C/N, and the F-part name, of the specified row of the region-based connector/wiring information in the data storage unit 314. This is because these sets of information are information on the other end of the second electrical wire W2 specified by the single-layer inspection, and these sets of information are required in order to specify one end of the third electrical wire W3 by the 3-layer inspection.

However, in the case of FIG. 6B, in the third row at the bottom of the region-based connector/wiring information, since the terminal "E01" in the same group as the T-connector name is not identical to the T-side terminal "B02," the inspection transitions to 3-layer inspection. On the other hand, in the fifth row at the bottom of the region-based connector/wiring information, the terminal in the same group as the T-connector name is identical to the T-side terminal "B02." If the T-side terminal "B02" was checked earlier with respect to the third row at the bottom of the region-based connector/wiring information, the inspection transitions to 3-layer inspection before the T-side terminal "B02" is checked with respect to the fifth row at the bottom of the region-based connector/wiring information. In this case, although the 3-layer inspection and the subsequent inspection are performed by regarding the third row at the bottom of the region-based connector/wiring information as the second electrical wire W2 (actually the third row is not the second electrical wire W2), the terminal is not identical to the T-side terminal "B02," and it is not possible to specify the next electrical wire. In this case, rather than directly proceeding to JC inspection, by tracking back to the position where the connection is first branched by the JB, the fifth row at the bottom of the region-based connector/wiring information is regarded as the second electrical wire W2, and the T-side terminal "B02" is checked with respect to the fifth row at the bottom of the region-based connector/wiring information. Moreover, when a row including information identical to the T-side terminal "B02" and the T-part name "MAIN_ECU" is not present in the region-based connector/wiring information (that is, when continuity success is not obtained with respect to all candidates for the second electrical wires W2), it is regarded that the connection means for connecting the first electrical wire W1 and the second electrical wire W2 is not the JB-based connection (2), and the inspection transitions to JC inspection.

Figure 15:
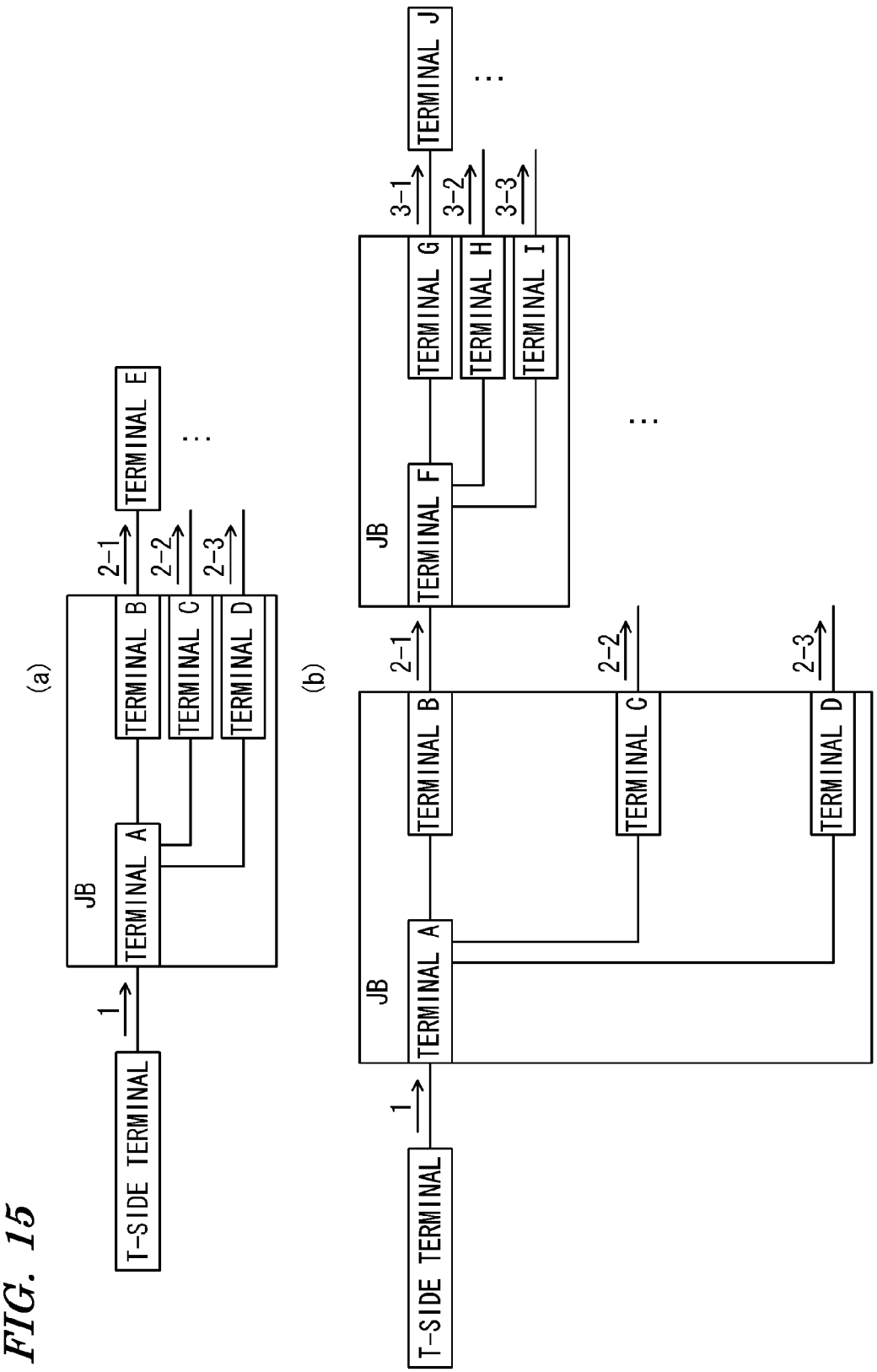

Here, a specific example of a case where since a branch is present in the JB, and the electrical wire which is first subjected to multilayer inspection is not identical to the T-side terminal, by tracking back to the branch, the next electrical wire is subjected to multilayer inspection will be described with reference to FIGS. 15(a) and 15(b). FIGS. 15(a) and 15(b) are diagrams for explaining back-tracking to the branches of multilayer inspection to be executed by the wire harness continuity inspection device according to the embodiment of the present invention. In FIGS. 15(a) and 15(b), arrows show that n-layer inspection of the multilayer inspection is executed. Moreover, the number "2" before "-" among the numbers "1," "2-1," "2-2," or "2-3" positioned above the arrows and the number "3" before "-" among the numbers "3-1," "3-2," or "3-3" represent the layer n of the multilayer inspection being executed, and the numbers "1," "2," and "3" after "-" represent the information for identifying the multilayer inspection performed for each of the branched electrical wires.

As shown in FIG. 15(a), when it is specified by the single-layer inspection that the other end of the first electrical wire W1 is connected to the terminal A of the JB, in the 2-layer inspection, continuity inspection is performed with respect to each of the second electrical wire W21 of which one end is connected to the terminal B electrically connected to the terminal A within the JB, the second electrical wire W22 of which one end is connected to the terminal C electrically connected to the terminal A within the JB, and the second electrical wire W23 of which one end is connected to the terminal D electrically connected to the terminal A within the JB. In this case, after 2-1 multilayer inspection is performed for the branched electrical wire W21, 2-2 multilayer inspection is performed for the branched electrical wire W22. Furthermore, after 2-2 multilayer inspection is performed for the branched electrical wire W22, 2-3 multilayer inspection is performed for the branched electrical wire W23. As above, even if the 3-layer inspection and the subsequent inspection were performed by regarding the electrical wire W21 as the second electrical wire W2, when there is no terminal identical to the T-side terminal, and it is not possible to specify the next electrical wire, the 3-layer inspection and the subsequent inspection are performed by sequentially regarding the electrical wires W22 and W23 as the second electrical wire W2. By doing so, the single-layer inspection is not executed repeatedly, and the process associated with the multilayer inspection is simplified.

There is a case where a terminal F of another JB is connected to the other end of the second electrical wire W21 of which one end is connected to the terminal B described above (see FIG. 15(b)). In this case, in the 3-layer inspection, the continuity inspection is performed with respect to each of the third electrical wire W31 of which one end is connected to the terminal G electrically connected to the terminal F within the JB, the third electrical wire W32 of which one end is connected to the terminal H electrically connected to the terminal F within the JB, and the third electrical wire W33 of which one end is connected to the terminal I electrically connected to the terminal F within the JB. Moreover, even if the 4-layer inspection and the subsequent inspection were performed by regarding the electrical wire W31 as the third electrical wire W3, when there is no terminal identical to the T-side terminal, and it is not possible to specify the next electrical wire, the 4-layer inspection and the subsequent inspection are performed by sequentially regarding the electrical wires W32 and W33 as the third electrical wire W3. By doing so, the single-layer inspection is not executed repeatedly, and the process associated with the multilayer inspection is simplified.

Through the above processes, one row of the arrangement of the region-based connector/wiring information in which the information on the T-part name and the terminal thereof is included in the information on the F-connector name and the terminal thereof and the information on the T-connector name and the terminal thereof is retrieved within one row extracted from the arrangement of the auxiliary device-based wiring information. As shown in FIGS. 6A to 6D, when identical information is discovered (the fourth row of the auxiliary device-based wiring information of FIG. 6A is identical to the fifth row of the region-based connector/wiring information at the bottom of FIG. 6B), it can be regarded that the starting point and the terminating point of the circuit line represented by one row extracted from the arrangement of the auxiliary device-based wiring information are electrically connected by electrical wires connected by the JB represented by the corresponding two rows (two rows in the case of 2-layer inspection, and n rows in the case of n-layer inspection) of the region-based connector/wiring information (continuity success). On the other hand, when identical information is not discovered, as described above, the inspection transitions to the 3-layer inspection in the course of the JB inspection or to the JC inspection after the end of the JB inspection.

(Details of JC Inspection)

The JC inspection is executed when it is not possible to specify the electrical wire in the JB inspection. The details of the JC inspection will be described with reference to examples of the auxiliary device-based wiring information, the region-based connector/wiring information, and the JC terminal connection correspondence table, shown in FIGS. 7A to 7C. The auxiliary device-based wiring information and the region-based connector/wiring information are the same as those described in "Auxiliary Device-Based Wiring Information And Region-Based Connector/Wiring Information" in "Details of Single-Layer Inspection," and description thereof will not be provided.

Next, the JC terminal connection correspondence table will be described. As shown in FIG. 7C, the JC terminal connection correspondence table is made up of main body part number and cavity connection. The column of main body part number stores the identification information for identifying a JC, and the column of cavity connection stores information on a connection state between terminals within the JC. In the JC terminal connection correspondence table, these two sets of information form a group. The JB terminal connection correspondence table shows that terminals at least at two designated cavity positions of a JC identified by main body part number are electrically connected. For example, the first row of FIG. 7C shows that in the JC identified by the identification number "800-200-100," the cavity "1" (see "1" in the cavity connection "1&2&3"), the cavity "2" (see "2" in the cavity connection "1&2&3"), and the cavity "3" (see "3" in the cavity connection "1&2&3") are electrically connected within the JC ("&" indicates that cavities are electrically connected). The JC terminal connection correspondence table made up of these elements can be prepared by extracting information on the above-described elements from the data of the region-based connector/wiring information. The prepared JC terminal connection correspondence table is stored in the data storage unit 314.

Subsequently, the details of the JC inspection algorithm will be described. Before the JC inspection is executed, single-layer inspection (a case of JC inspection in 2-layer inspection) or (n−1)-layer inspection (a case of JC inspection in n-layer inspection) has been executed. By the inspection, the information on the other end of the (n−1)th electrical wire W(n−1) (drawing part number, T-connector name on the other end side, connector part number, terminal, C/N, and T-part name, or F-connector name on the other end side, connector part number, terminal, C/N, and F-part name) is recorded in the data storage unit 314 (see "Single-Layer Inspection Algorithm"). When executing JC inspection in the n-layer inspection, first, the information on the other end of the (n−1)th electrical wire W(n−1) recorded in the data storage unit 314 is referred to. In this way, referring to FIG. 7B, it is possible to obtain T-connector name "J/C-4," connector part number "999-111-102," terminal "A01," C/N "4," and T-part name "800-200-100" as the information on the other end of the first electrical wire W1. In the subsequent process, one end of the second electrical wire W2 is specified from the other end of the first electrical wire W1 specified in this way.

First, the T-part name within the information on the other end of the first electrical wire W1 is referred to. In the column of T-part name, when a terminal in the same group as the T-part name is accommodated in the JC, the information on the identification number for identifying the JC is stored. Thus, by determining the presence of the data of T-part name, it is possible to determine whether the other end of the first electrical wire W1 is connected to the second electrical wire W2 by the JC. When the data is not present in the T-part name, the inspection transitions to "W/S inspection." It can be understood from FIG. 7B that "800-200-100" is stored in the T-part name.

When data is stored in the T-part name, it is checked whether a row in which the main body part number is identical to the T-part name is not present in the JC terminal connection correspondence table. It can be understood from FIG. 7C that the main body part number "800-200-100" is included in the second row.

Subsequently, by referring to the cavity connection in one row of the JC terminal connection correspondence table in which the T-part name is identical to the main body part number, information on the continuity of the corresponding cavities of the JC identified by the main body part number is referred to. For example, the second row of the JC terminal connection correspondence table of FIG. 7C shows that the cavity "4" of the JC identified by the main body part number "800-200-100" is electrically connected to the cavity "5" of the JC. Since the C/N is "4" within the information on the other end of the first electrical wire W1, the cavity connected to the other end of the first electrical wire W1 has a number other than "4."

By referring to the information on the row specified from the JC terminal connection correspondence table in this way, the region-based connector/wiring information is checked. First, it is checked whether a row in which the F-part name or the T-part name is identical to the main body part number of the corresponding row of the JC terminal connection correspondence table is not present in the region-based connector/wiring information. When the corresponding row is present, it is checked whether a row including the identical C/N is not present in the region-based connector/wiring information by referring to the cavity connection of the corresponding row of the JC terminal connection correspondence table. When the corresponding row is present, it is checked whether the T-connector names and the connector part numbers are identical to each other. It can be understood from FIG. 7B that the C/N identical to the cavity connection "5" is included in the second row at the bottom of the region-based connector/wiring information. Moreover, it can be understood that the T-connector name and the connector part number of the first and second rows at the bottom of the region-based connector/wiring information are identical to "J/C-4" and "999-111-102." The second row (the second row at the bottom of the region-based connector/wiring information in FIG. 7B) of the region-based connector/wiring information specified in this way becomes the second electrical wire W2 of which one end is connected to the other end of the first electrical wire W1. When the corresponding row is not present, it is regarded that the connection means for connecting the first electrical wire W1 and the second electrical wire W2 is not the JC-based connection (3), and the inspection transitions to W/S inspection.

When the second electrical wire W2 is specified in this way (the process so far corresponds to S204 of FIG. 2), it is checked whether a terminal in the same group as the T-connector name on the other end side or a terminal in the same group as the F-connector name on the other end side within the specified one row of the region-based connector/wiring information is not identical to the T-side terminal "C04." Here, if the terminal is not identical to the T-side terminal "C04," the inspection transitions to 3-layer inspection. It can be understood from FIG. 7B that in the second row at the bottom of the region-based connector/wiring information, the terminal in the same group as the T-connector name is identical to the T-side terminal "C04."

When the terminal in the same group as the T-connector name on the other end side or the terminal in the same group as the F-connector name on the other end side, identical to the T-side terminal "C04" is present, it is checked whether the T-connector name or the F-connector name in the same group as the terminal is not identical to the T-part name "METER." Here, if the connector name is not identical to the T-part name "METER," the inspection transitions to 3-layer inspection. It can be understood from FIG. 7B that in the second row at the bottom of the region-based connector/wiring information, the T-connector name is identical to the T-part name "METER." In this way, it is possible to determine that the other end of the second electrical wire W2 is identical to the terminating point of the circuit line in the row described in the auxiliary device-based wiring information (S205 of FIG. 2: Y). In this case, by performing the process described with reference to FIGS. 14A to 14C, the fitting state due to connectors between the electrical component serving as the terminating point of the circuit line and the other end of the second electrical wire W2 may be checked, so that the accuracy of the continuity inspection may be improved further. As a result, it is regarded that the circuit line in the row described in the auxiliary device-based wiring information is electrically connected in the region-based connector/wiring information (S207 of FIG. 2), and the validity determining step ends.

When proceeding to 3-layer inspection, it is necessary to record the drawing part number, the T-connector name on the other end side, the connector part number, the terminal, the C/N, and the T-part name, or the drawing part number, the F-connector name on the other end side, the connector part number, the terminal, the C/N, and the F-part name, of the specified row of the region-based connector/wiring information in the data storage unit 314. This is because these sets of information are information on the other end of the second electrical wire W2 specified by the single-layer inspection, and these sets of information are required in order to specify one end of the third electrical wire W3 by the 3-layer inspection.

Figure 17:
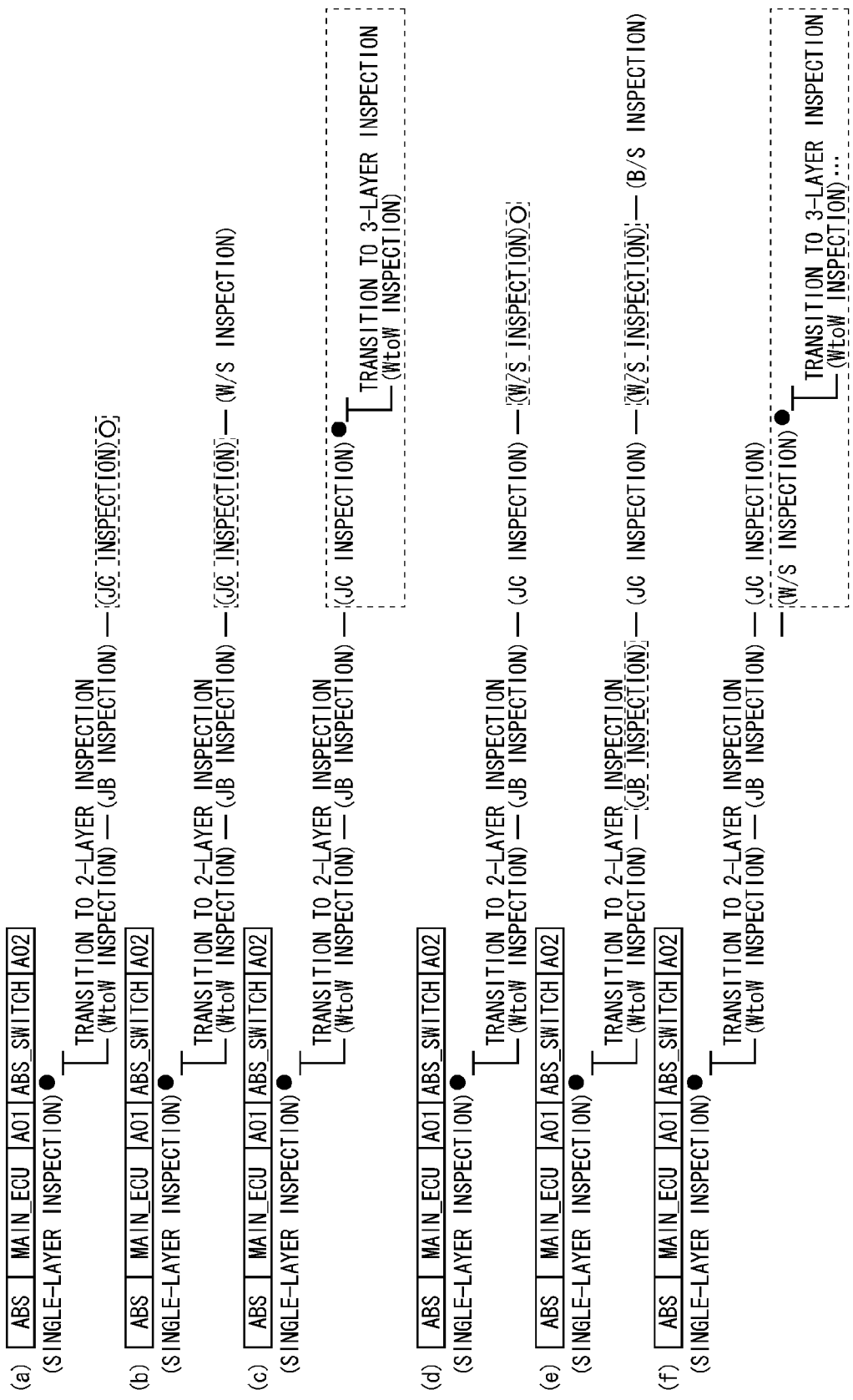
Figure 18:

Hitherto, a case where two electrical wires are connected by the JC has been described. However, there may be a case where three or more electrical wires are connected by the JC. In this case, a description corresponding to the number is added to the cavity connection of the JC terminal connection correspondence table. For example, the first row of the JC terminal connection correspondence table of FIG. 17C shows that three electrical wires are connected by the JC. When three or more electrical wires are connected by the JC, similarly to the JB inspection, a plurality of candidates for the second electrical wire W2 is present. Thus, as described in "Details of JB Inspection," when the 3-layer inspection and the subsequent inspection are performed with respect to the candidates (actually not the second electrical wire W2) for the second electrical wire W2, and it is not possible to specify the next electrical wire, rather than directly proceeding to "W/S inspection," by tracking back to the position where the connection is first branched by the JC and regarding the other candidate for the second electrical wire W2 as the second electrical wire W2, the T-side terminal of the corresponding row of the auxiliary device-based wiring information is checked (the process of performing the multilayer inspection with respect to the next electrical wire by tracking back to the branch of the JC inspection is the same as the process of JB inspection described with reference to FIG. 15(*a*) and FIG. 15(*b*)). Moreover, when the continuity success is not obtained with respect to all of the candidates for the second electrical wire W2, it is regarded that the connection means for connecting the first electrical wire W1 and the second electrical wire W2 is not the JC-based connection (3), and the inspection transitions to "W/S inspection."

Through the above processes, one row of the arrangement of the region-based connector/wiring information in which the information on the T-part name and the terminal thereof is included in the information on the F-connector name and the terminal thereof and the information on the T-connector name and the terminal thereof is retrieved within one row extracted from the arrangement of the auxiliary device-based wiring information. As shown in FIGS. 7A to 7C, when identical information is discovered (the eighth row of the auxiliary device-based wiring information of FIG. 7A is identical to the second row at the bottom of the region-based connector/wiring information of FIG. 7B), it can be regarded that the starting point and the terminating point of the circuit line represented by one row extracted from the arrangement of the auxiliary device-based wiring information are electrically connected by electrical wires connected by the JC represented by the corresponding two rows (two rows in the case of 2-layer inspection, and n rows in the case of n-layer inspection) of the region-based connector/wiring information (continuity success). On the other hand, when identical information is not discovered, as described above, the inspection transitions to the 3-layer inspection in the course of the JC inspection or to the W/S inspection after the end of the JC inspection.

(Details of W/S Inspection)

The W/S inspection is executed when it is not possible to specify the electrical wire in the JC inspection. The details of the W/S inspection will be described with reference to examples of the auxiliary device-based wiring information and the region-based connector/wiring information, shown in FIGS. 8A and 8B. The auxiliary device-based wiring information and the region-based connector/wiring information are the same as those described in "Auxiliary Device-Based Wiring Information And Region-Based Connector/Wiring Information" in "Details of Single-Layer Inspection," and description thereof will not be provided.

Subsequently, the details of the W/S inspection algorithm will be described. Before the W/S inspection is executed, single-layer inspection (a case of W/S inspection in 2-layer inspection) or (n−1)-layer inspection (a case of W/S inspection in n-layer inspection) has been executed. By the inspection, the information on the other end of the (n−1)th electrical wire W(n−1) (drawing part number, T-connector name on the other end side, connector part number, terminal, C/N, and T-part name, or F-connector name on the other end side, connector part number, terminal, C/N, and F-part name) is recorded in the data storage unit 314 (see "Single-Layer Inspection Algorithm"). When executing W/S inspection in the n-layer inspection, first, the information on the other end of the (n−1)th electrical wire W(n−1) recorded in the data storage unit 314 is referred to. In this case, when the other end of the (n−1)th electrical wire W(n−1) and one end of the n-th electrical wire Wn are connected by the W/S, information unique to the W/S-based connection is included in the information on the other end of the (n−1)th electrical wire W(n−1). That is, unique character strings of "W/S-1," "SSS-000-000," and "%1" are described in the T-connector name, the connector part number, and the terminal, respectively. By determining the presence of the unique character string, it is possible to determine whether the other end of the (n−1)th electrical wire W(n−1) and one end of the n-th electrical wire Wn are connected by the W/S. Referring to FIG. 8B, it is possible to obtain T-connector name "W/S-1," connector part number "SSS-000-000," terminal "%%1," and C/N "1" as the information on the other end of the first electrical wire W1. In the subsequent process, one end of the second electrical wire W2 is specified from the other end of the first electrical wire W1 specified in this way. On the other hand, when the information unique to the W/S-based connection is not included in the information on the other end of the first electrical wire W1, the inspection transitions to "B/S inspection."

First, the connector part number and the C/N in the same group as the T-connector name are referred to within the information on the other end of the first electrical wire W1. When the connection of the end portion of the electrical wire is realized by a W/S, "SSS-000-000" and "1" are stored in the T-connector part number and the C/N as information. Thus, by determining the data of the T-connector name and the C/N, it is possible to determine whether the other end of the first electrical wire W1 is connected to the second electrical wire W2 by the W/S. When no data is stored in the T-connector name and the C/N, the inspection transitions to "B/S inspection." It can be understood from FIG. 8B that in the fourth row at the top of the region-based connector/wiring information, "SSS-000-000" and "1" are stored in the T-connector part number and the C/N, respectively.

When the corresponding data are stored in the T-connector name and the C/N described above, by referring to the identification information "E11" of a subdivided region in the drawing part number "E11-111" within the information on the first electrical wire W1, it is checked whether a row in which the connector part number and the C/N are "SSS-000-000" and "1" is not present in the rows of the region-based connector/wiring information including the identification information "111" in the drawing part number. When the corresponding row is present, it is checked whether the F-connector name and the terminal of the row are identical to the T-connector name and the terminal within the information on the first electrical wire W1. It is possible to specify a target row with the identification information of the drawing part number among the rows of the region-based connector/wiring information since the W/S is limited to the connection of end portions of electrical wires positioned in the same subdivided region (see FIG. 1(*f*)). It can be understood from FIG. 8B that in the second row at the top of the region-based connector/wiring information, the connector part number and the C/N in the same group as the T-connector name are "SSS-000-000" and "1." Furthermore, the F-connector name and the terminal on the second row at the top of the region-based connector/wiring information are identical to the T-connector name "W/S-1" and the terminal "%%1" within the information on the first electrical wire W1.

When the second electrical wire W2 is specified in this way (the process so far corresponds to S204 of FIG. 2), it is checked whether a terminal in the same group as the T-connector name on the other end side or a terminal in the same group as the F-connector name on the other end side within the specified one row of the region-based connector/wiring information is not identical to the T-side terminal "B04." Here, if the terminal is not identical to the T-side terminal "B04," the inspection transitions to 3-layer inspection. It can be understood from FIG. 8B that in the second row at the top of the region-based connector/wiring information, the terminal in the same group as the T-connector name is identical to the T-side terminal "B04."

When the terminal in the same group as the T-connector name on the other end side or the terminal in the same group as the F-connector name on the other end side, identical to the T-side terminal "B04" is present, it is checked whether the T-connector name or the F-connector name in the same group as the terminal is not identical to the T-part name "MAIN_ECU." Here, if the connector name is not identical to the T-part name "MAIN_ECU," the inspection transitions to 3-layer inspection. It can be understood from FIG. 8B that in the second row at the top of the region-based connector/wiring information, the T-connector name is identical to the T-part name "MAIN_ECU." In this way, it is possible to determine that the other end of the second electrical wire W2 is identical to the terminating point of the circuit line in the row described in the auxiliary device-based wiring information (S205 of FIG. 2: Y). In this case, by performing the process described with reference to FIGS. 14A to 14C, the fitting state due to connectors between the electrical component serving as the terminating point of the circuit line and the other end of the second electrical wire W2 may be checked, so that the accuracy of the continuity inspection may be improved further. As a result, it is regarded that the circuit line in the row described in the auxiliary device-based wiring information is electrically connected in the region-based connector/wiring information (S207 of FIG. 2), and the validity determining step ends.

When proceeding to 3-layer inspection, it is necessary to record the drawing part number, the T-connector name on the other end side, the connector part number, the terminal, the C/N, and the T-part name, or the drawing part number, the F-connector name on the other end side, the connector part number, the terminal, the C/N, and the F-part name, of the specified row of the region-based connector/wiring information in the data storage unit 314. This is because these sets of information are information on the other end of the second electrical wire W2 specified by the single-layer inspection, and these sets of information are required in order to specify one end of the third electrical wire W3 by the 3-layer inspection.

Hitherto, a case where two electrical wires are connected by the W/S has been described. However, there may be a case where three or more electrical wires are connected by the W/S. When three or more electrical wires are connected by the W/S, similarly to the JB inspection and the JC inspection, a plurality of candidates for the second electrical wire W2 is present. Thus, as described in "Details of JB Inspection," when the 3-layer inspection and the subsequent inspection are performed with respect to the candidates (actually not the second electrical wire W2) for the second electrical wire W2, and it is not possible to specify the next electrical wire, rather than directly proceeding to "B/S inspection," by tracking back to the position where the connection is first branched by the W/S and regarding the other candidate for the second electrical wire W2 as the second electrical wire W2, the T-side terminal of the corresponding row of the auxiliary device-based wiring information is checked (the process of performing the multilayer inspection with respect to the next electrical wire by tracking back to the branch of the W/S inspection is the same as the process of JB inspection described with reference to FIGS. 15(*a*) and 15(*b*)). Moreover, when the continuity success is not obtained with respect to all of the candidates for the second electrical wire W2, it is regarded that the connection means for connecting the first electrical wire W1 and the second electrical wire W2 is not the welding (W/S)-based connection (4), and the inspection transitions to "B/S inspection."

Through the above processes, one row of the arrangement of the region-based connector/wiring information in which the information on the T-part name and the terminal thereof is included in the information on the F-connector name and the terminal thereof and the information on the T-connector name and the terminal thereof is retrieved within one row extracted from the arrangement of the auxiliary device-based wiring information. As shown in FIGS. 8A and 8B, when identical information is discovered (the fifth row of the auxiliary device-based wiring information of FIG. 8A is identical to the second row at the top of the region-based connector/wiring information of FIG. 8B), it can be regarded that the starting point and the terminating point of the circuit line represented by one row extracted from the arrangement of the auxiliary device-based wiring information are electrically connected by electrical wires connected by the W/S represented by the corresponding two rows (two rows in the case of 2-layer inspection, and n rows in the case of n-layer inspection) of the region-based connector/wiring information (continuity success). On the other hand, when identical information is not discovered, as described above, the inspection transitions to the 3-layer inspection in the course of the W/S inspection or to the B/S inspection after the end of the W/S inspection.

(Details of B/S Inspection)

The B/S inspection is executed when it is not possible to specify the electrical wire in the W/S inspection. The details of the B/S inspection will be described with reference to examples of the auxiliary device-based wiring information and the region-based connector/wiring information, shown in FIGS. 9A to 9B. The auxiliary device-based wiring information and the region-based connector/wiring information are the same as those described in "Auxiliary Device-Based Wiring Information And Region-Based Connector/Wiring Information" in "Details of Single-Layer Inspection," and description thereof will not be provided.

Subsequently, the details of the B/S inspection algorithm will be described. Before the B/S inspection is executed, single-layer inspection (a case of B/S inspection in 2-layer inspection) or (n−1)-layer inspection (a case of B/S inspection in n-layer inspection) has been executed. By the inspection, the information on the other end of the (n−1)th electrical wire W(n−1) (drawing part number, T-connector name on the other end side, connector part number, terminal, C/N, and T-part name, or F-connector name on the other end side, connector part number, terminal, C/N, and F-part name) is recorded in the data storage unit 314 (see "Single-Layer Inspection Algorithm"). When executing B/S inspection in the n-layer inspection, first, the information on the other end of the (n−1)th electrical wire W(n−1) recorded in the data storage unit 314 is referred to. In this case, when the other end of the (n−1)th electrical wire W(n−1) and one end of the n-th electrical wire Wn are connected by the B/S, information unique to the B/S-based connection is included in the information on the other end of the (n−1)th electrical wire W(n−1). That is, no information (NULL) is stored in the T-connector name, the connector part number, and the C/N, and unique information of "#A1" is described in the terminal. By determining the presence of the unique information, it is possible to determine whether the other end of the (n−1)th electrical wire W(n−1) and one end of the n-th electrical wire Wn are connected by the B/S. Referring to FIG. 9B, it is possible to obtain information in which no information (NULL) on the T-connector name is stored, no information (NULL) on the connector part number is stored, no information (NULL) on terminal "#A1" and the C/N is stored as the information on the other end of the first electrical wire W1. In the subsequent process, one end of the second electrical wire W2 is specified from the other end of the first electrical wire W1 specified in this way. On the other hand, when the information unique to the B/S-based connection is not included in the information on the other end of the first electrical wire W1, the B/S inspection ends.

First, the T-connector name, the connector part number in the same group as the T-connector name, and the C/N in the same group as the T-connector name are referred to within the information on the other end of the first electrical wire W1. When the connection of the end portion of the electrical wire is realized by B/S, no information (NULL) is stored in the T-connector name, the connector part number, and the C/N. Thus, by determining the presence of the data of the T-connector name, the connector part number, and the C/N, it is possible to determine whether the other end of the first electrical wire W1 is connected to the second electrical wire W2 by the B/S. When data are stored in the T-connector name, the connector part number, and the C/N, the B/S inspection ends.

It can be understood from FIG. 9B that in the third row at the top of the region-based connector/wiring information, no information is stored in the T-connector name, the connector part number, and the C/N.

When no data is stored in the T-connector name, the connector part number, and the C/N described above, by referring to the identification information "E11" of a subdivided region in the drawing part number "E11-111" within the information on the first electrical wire W1, it is checked whether a row in which no data is stored in the T-connector name, the connector part number, and the C/N is not present in the rows of the region-based connector/wiring information including the identification information "111" in the drawing part number. When the corresponding row is present, it is checked whether the terminal of the row is identical to the terminal within the information on the first electrical wire W1. It is possible to specify a target row with the identification information of the drawing part number among the rows of the region-based connector/wiring information since the B/S is limited to the connection of end portions of electrical wires positioned in the same subdivided region (see FIG. 1(f)). It can be understood from FIG. 9B that in the fifth row at the top of the region-based connector/wiring information, no information is stored in the T-connector name, the connector part number, and the C/N. Furthermore, the terminal on the fifth row at the top of the region-based connector/wiring information is identical to the terminal "#A1" within the information on the first electrical wire W1.

When the second electrical wire W2 is specified in this way (the process so far corresponds to S204 of FIG. 2), it is checked whether a terminal in the same group as the T-connector name on the other end side or a terminal in the same group as the F-connector name on the other end side within the specified one row of the region-based connector/wiring information is not identical to the T-side terminal "A06." Here, if the terminal is not identical to the T-side terminal "A06," the inspection transitions to 3-layer inspection. It can be understood from FIG. 9B that in the fifth row at the top of the region-based connector/wiring information, the terminal in the same group as the F-connector name is identical to the T-side terminal "A06."

When the terminal in the same group as the T-connector name on the other end side or the terminal in the same group as the F-connector name on the other end side, identical to the T-side terminal "A06" is present, it is checked whether the T-connector name or the F-connector name in the same group as the terminal is not identical to the T-part name "MAIN_ECU." Here, if the connector name is not identical to the T-part name "MAIN_ECU," the inspection transitions to 3-layer inspection. It can be understood from FIG. 9B that in the fifth row at the top of the region-based connector/wiring information, the F-connector name is identical to the T-part name "MAIN_ECU." In this way, it is possible to determine that the other end of the second electrical wire W2 is identical to the terminating point of the circuit line in the row described in the auxiliary device-based wiring information (S205 of FIG. 2: Y). In this case, by performing the process described with reference to FIGS. 14A to 14C, the fitting state due to connectors between the electrical component serving as the terminating point of the circuit line and the other end of the second electrical wire W2 may be checked, so that the accuracy of the continuity inspection may be improved further. As a result, it is regarded that the circuit line in the row described in the auxiliary device-based wiring information is electrically connected in the region-based connector/wiring information (S207 of FIG. 2), and the validity determining step ends.

When proceeding to 3-layer inspection, it is necessary to record the drawing part number, the T-connector name on the other end side, the connector part number, the terminal, the C/N, and the T-part name, or the drawing part number, the F-connector name on the other end side, the connector part number, the terminal, the C/N, and the F-part name, of the specified row of the region-based connector/wiring information in the data storage unit 314. This is because these sets of information are information on the other end of the second electrical wire W2 specified by the single-layer inspection, and these sets of information are required in order to specify one end of the third electrical wire W3 by the 3-layer inspection.

Hitherto, a case where two electrical wires are connected by the B/S has been described. However, there may be a case where three or more electrical wires are connected by the B/S. When three or more electrical wires are connected by the BIS, similarly to the JB inspection and the JC inspection, a plurality of candidates for the second electrical wire W2 is present. Thus, as described in "Details of JB Inspection," when the 3-layer inspection and the subsequent inspection are performed with respect to the candidates (actually not the second electrical wire W2) for the second electrical wire W2, and it is not possible to specify the next electrical wire, rather than directly ending "B/S inspection," by tracking back to the position where the connection is first branched by the B/S and regarding the other candidate for the second electrical wire W2 as the second electrical wire W2, the T-side terminal of the corresponding row of the auxiliary device-based wiring information is checked (the process of performing the multi-layer inspection with respect to the next electrical wire by tracking back to the branch of the B/S inspection is the same as the process of JB inspection described with reference to FIG. 15(a) and FIG. 15(b)). Moreover, when the continuity success is not obtained with respect to all of the candidates for the second electrical wire W2, it is regarded that the connection means for connecting the first electrical wire W1 and the second electrical wire W2 is not the butt-joining-based connection (4), and B/S inspection ends.

Through the above processes, one row of the arrangement of the region-based connector/wiring information in which the information on the T-part name and the terminal thereof is included in the information on the F-connector name and the terminal thereof and the information on the T-connector name and the terminal thereof is retrieved within one row extracted from the arrangement of the auxiliary device-based wiring information. As shown in FIGS. 9A to 9B, when identical information is discovered (the third row of the auxiliary device-based wiring information of FIG. 9A is identical to the fifth row at the top of the region-based connector/wiring information of FIG. 9B), it can be regarded that the starting point and the terminating point of the circuit line represented by one row extracted from the arrangement of the auxiliary device-based wiring information are electrically connected by electrical wires connected by the B/S represented by the corresponding two rows (two rows in the case of 2-layer inspection, and n rows in the case of n-layer inspection) of the region-based connector/wiring information (continuity success). On the other hand, when identical information is not discovered, as described above, the B/S inspection ends in the course of the B/S inspection or the B/S inspection ends after the flow reaches the end of the B/S inspection.

The fact that the B/S inspection ends without reaching continuity success means that it is not possible to specify the second electrical wire W2 by any of "WtoW inspection," "JB inspection," "JC inspection," "W/S inspection," and "B/S inspection." Thus, when the B/S inspection ends without reaching continuity success (S206 of FIG. 2: N), it is regarded that the circuit line of the corresponding row described in the auxiliary device-based wiring information is not electrically connected in the region-based connector/wiring information (continuity fail: S208), and the validity determining step regarding the circuit line of the corresponding row ends. Moreover, the validity determining step is executed for the circuit line of another row of the auxiliary device-based wiring information. One row of the auxiliary device-based wiring information determined as continuity fail in this way is recorded in the data storage unit 314, and a list of circuit lines of the auxiliary device-based wiring information determined as continuity fail is displayed on the display unit 315.

Figure 10:
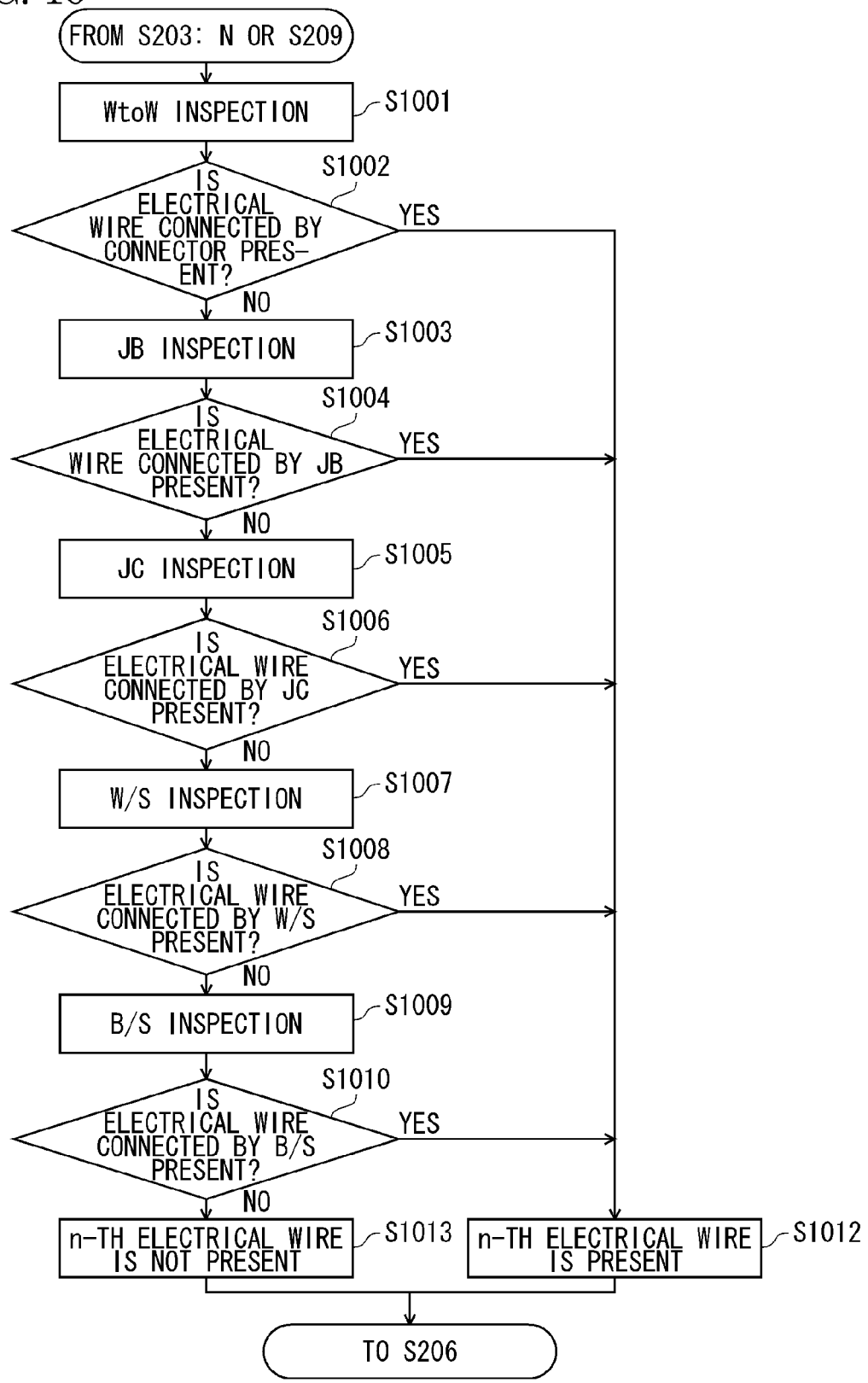
FIG. 10 is a flowchart of n-layer inspection to be executed by the wire harness continuity inspection device according to the embodiment of the present invention.

As above, in the n-layer inspection, "WtoW inspection," "JB inspection," "JC inspection," "W/S inspection," and "B/inspection" are sequentially performed. These series of inspection correspond to the process of S204 in the flowchart of FIG. 2. The relation between the flow of the series of inspection and the flowchart of FIG. 2 will be described with reference to the flowchart of the n-layer inspection to be executed by the wire harness continuity inspection device according to the embodiment of the present invention, shown in FIG. 10. When the flow proceeds from the single-layer inspection to the n-layer inspection, first, the WtoW inspection is performed (S1001). When it is possible to specify an electrical wire connected by the connector by the WtoW inspection (S1002: Y), the electrical wire is regarded as the n-th electrical wire Wn (S1012), and the flow proceeds to the process of S206. When it is not possible to specify the electrical wire connected by the connector by the WtoW inspection (S1002: N), the JB inspection is performed (S1003). When it is possible to specify an electrical wire connected by the JB by the JB inspection (S1004: Y), the electrical wire is regarded as the n-th electrical wire Wn (S1012), and the flow proceeds to the process of S206. When it is not possible to specify the electrical wire connected by the JB by the JB inspection (S1004: N), the JC inspection is performed (S1005). When it is possible to specify an electrical wire connected by the JC by the JC inspection (S1006: Y), the electrical wire is regarded as the n-th electrical wire Wn (S1012), and the flow proceeds to the process of S206. When it is not possible to specify the electrical wire connected by the JC by the JC inspection (S1006: N), the W/S inspection is performed (S1007). When it is possible to specify an electrical wire connected by the W/S by the W/S inspection (S1008: Y), the electrical wire is regarded as the n-th electrical wire Wn (S1012), and the flow proceeds to the process of S206. When it is not possible to specify the electrical wire connected by the W/S by the W/S inspection (S1008: N), the B/S inspection is performed (S1009). When it is possible to specify an electrical wire connected by the B/S by the B/S inspection (S1010: Y), the electrical wire is regarded as the n-th electrical wire Wn (S1012), and the flow proceeds to the process of S206. When it is not possible to specify the electrical wire connected by the B/S by the B/S inspection (S1010: N), it is regarded that the n-th electrical wire Wn is not present (S1013), and the flow proceeds to the process of S206.

[Details of Back-Tracking Inspection]

Subsequently, the back-tracking inspection (the process of S211 of FIG. 2) mentioned in "Single-Layer Inspection Algorithm" will be described. Although descriptions of fuses and relays are included in the auxiliary device-based wiring information, these components are described as being integrated in the JB in the region-based connector/wiring information. That is, as for the fuses and relays, the name for identifying the fuse is described in the F-part name of the auxiliary device-based wiring information, and the terminal of the fuse is described in the terminals in the same group as the F-part name. However, the name for identifying the JB is described in the F-connector name of the region-based connector/wiring information. Thus, even when the validity determining step regarding the circuit line in which a fuse or a relay is connected to the starting point thereof is performed in the single-layer inspection, it is not possible to specify the first electrical wire W1 of which one end is connected to the fuse or the relay from the region-based connector/wiring information (this is because in the region-based connector/wiring information, one end of the first electrical wire W1 is connected to the JB). Therefore, it is regarded that the circuit line described in the auxiliary device-based wiring information is not electrically connected in the region-based connector/wiring information. In order to prevent an erroneous validity determining step, the back-tracking inspection described later is performed. The details of the back-tracking inspection will be described with reference to examples of the auxiliary device-based wiring information, the region-based connector/wiring information, the JB-connector correspondence table, and the JB terminal connection correspondence table, shown in FIGS. 11A to 11D. The auxiliary device-based wiring information, the region-based connector/wiring information, the JB-connector correspondence table, and the JB terminal connection correspondence table are the same as those described in "Details of JB Inspection," and description thereof will not be provided.

Before the back-tracking inspection is executed, the single-layer inspection has been executed. In the single-layer inspection, by referring to the entire arrangement of the region-based connector/wiring information, when a terminal identical to the F-side terminal is not present among the terminals in the same group as the F-connector name or the terminals in the same group as the T-connector name, or when although a terminal identical to the F-side terminal is present, a terminal identical to the F-part name is not present among the F-connector names or the T-connector names in the same group as the terminal, the back-tracking inspection is executed.

First, the F-part name of the corresponding row extracted from the auxiliary device-based wiring information is referred to. It can be understood from FIG. 11A that in the third row of the auxiliary device-based wiring information, a description "F:DOME" representing a fuse is included in the F-part name.

Subsequently, it is checked whether a row in which the referred F-part name is described in the cavity connection is present in the JB terminal connection correspondence table. It can be understood from FIG. 11D that "F:DOME" is described in the fourth row of the JB terminal connection correspondence table. When the corresponding row is present in the JB terminal connection correspondence table, the main body part number and the cavity connection of the corresponding row are referred to.

Subsequently, the information excluding the description of fuse or relay is extracted among the main body part number and the cavity connection of the corresponding row referred to. Referring to FIG. 11D, the fourth row of the JB terminal connection correspondence table shows that the main body part number is "888-000-111" and the description "F:DOME" representing a fuse is electrically connected to the cavity position "4" (refer to "B4") of the connector fitting position "B."

Subsequently, a connector fitted to the connector fitting position described in the cavity connection is specified based on the information excluding the description of fuse or relay among the extracted main body part number and the extracted cavity connection. It can be understood from FIG. 11C that the main body part number "888-000-111" and the connector fitting position "B" are included in the second row of the JB-connector correspondence table. In this way, it can be understood that a connector specified by the connector part number "888-000-111" and the connector name "J/B-1-2-3" described in the second row of the JB-connector correspondence table includes a terminal electrically connected to the above-described fuse.

By referring to the information on the row specified from the JB-connector correspondence table in this way, the region-based connector/wiring information is checked. First, by referring to the connector part number and the connector name of one row specified from the JB-connector correspondence table, it is checked whether a row in which the connector part number is identical to the F-connector name and the connector part numbers in the same group of the F-connector name or the T-connector name and the connector part numbers in the same group as the T-connector name is present in the region-based connector/wiring information. It can be understood from FIG. 11B that the F-connector name and the connector part number identical to the connector part number "111-000-113" and the connector name "J/B-1-2-3" on the second row of the JB-connector correspondence table are included in the third row at the bottom of the region-based connector/wiring information. If it is possible to specify one row (the third row at the bottom of the region-based connector/wiring information in FIG. 11B) of the region-based connector/wiring information in this way, it can be regarded that the corresponding one row is the first electrical wire W1 of which one end is connected to the fuse or relay which is the starting point of the circuit line (back-tracking success, S211 of FIG. 2: Y). After that, the flow proceeds to S203 of FIG. 2, and it is determined whether the other end of the first electrical wire W1 is identical to the terminating point of the circuit line. On the other hand, if it is not possible to specify one row of the region-based connector/wiring information (back-tracking fail, S211 of FIG. 2: N), it is regarded that the circuit line of the corresponding row described in the auxiliary device-based wiring information is not electrically connected in the region-based connector/wiring information (continuity fail: S208), and the validity determining step regarding the circuit line of the corresponding row ends.

In the above description of the back-tracking inspection, there is only one cavity position electrically connected to the fuse. Naturally, there may be a case where a plurality of cavity positions is electrically connected to the fuse. In this case, a description corresponding to the number is added to the cavity connection of the JB terminal connection correspondence table. When two or more electrical wires are connected to the fuse or relay in the JB, a plurality of candidates for the first electrical wire W1 is present. Thus, as described with regard to the second electrical wire W2 in "Details of JB Inspection," when the 2-layer inspection and the subsequent inspection are performed with respect to the candidates (actually not the first electrical wire W1) for the first electrical wire W1, and it is not possible to specify the next electrical wire, rather than directly regarding that continuity is not realized in the region-based connector/wiring information (continuity fail: S208), by tracking back to the position where the connection is branched by the fuse, the other candidate for the first electrical wire W1 is regarded as the first electrical wire W1, and it is determined whether the other end of the first electrical wire W1 is identical to the terminating point of the circuit line (S203). When it is not possible to specify the next electrical wire with respect to all of the candidates for the first electrical wire W1, it is regarded that the circuit line of the corresponding row described in the auxiliary device-based wiring information is not electrically connected in the region-based connector/wiring information (continuity fail: S208).

[Preliminary Electrical Wire Bonding Step]

Figure 13:
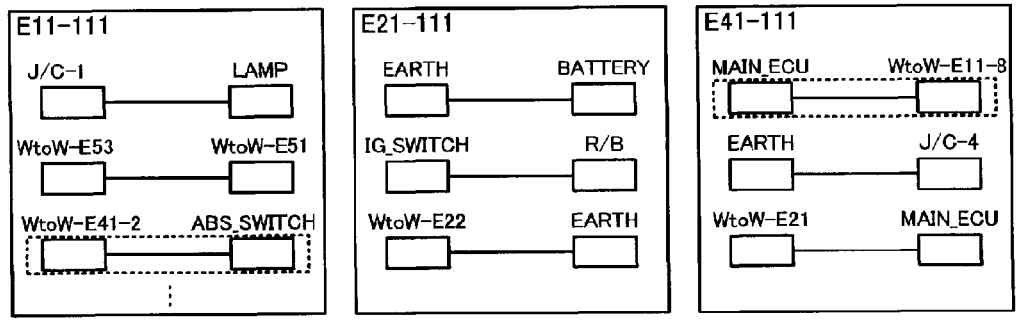
Figure 13:
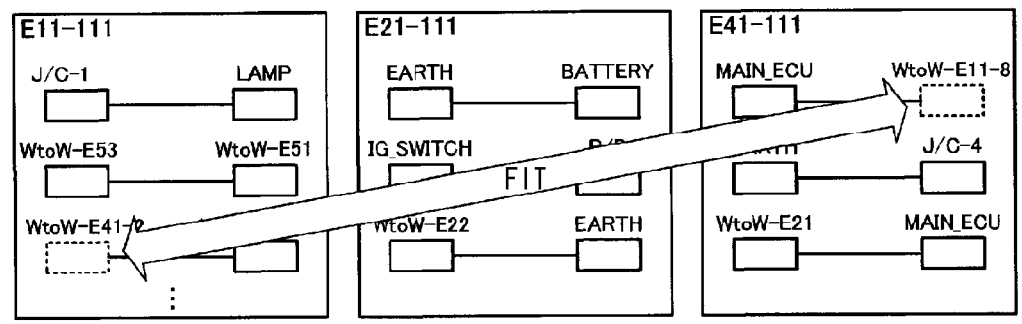
Figure 13:
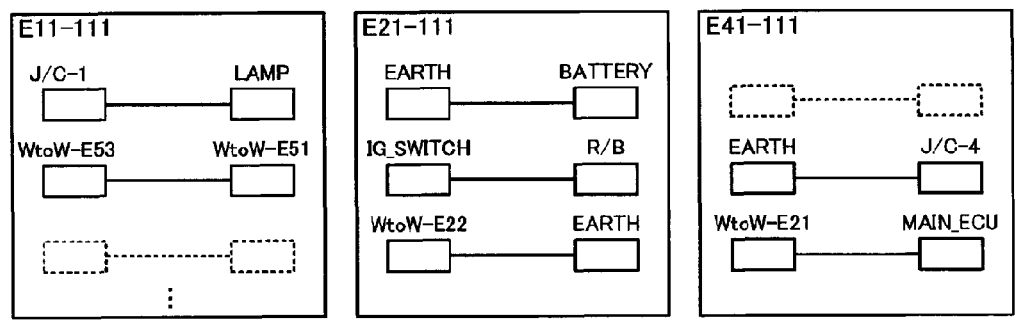
Figure 13:
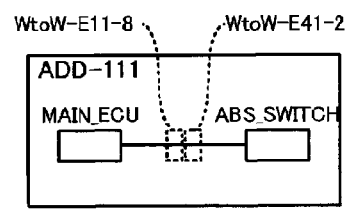

In the above-described multilayer inspection, one arbitrary row constituting the arrangement of the auxiliary device-based wiring information is extracted, and when executing multilayer inspection on one row, an operation to check one row of the auxiliary device-based wiring information and one row of the arrangement forming the region-based connector/wiring information is repeated. For this reason, as the number of rows of the arrangement forming the region-based connector/wiring information is smaller, it is possible to shorten the time required for the validity determining step. Here, a method of shortening the time required for the validity determining step by reducing the number of rows of the arrangement forming the region-based connector/wiring information before performing the validity determining step without affecting the accuracy of the validity determining step will be described. FIGS. 12A and 12B show an example of region-based connector/wiring information before the preliminary electrical wire bonding step (FIG. 12A is the same as FIG. 5B). FIGS. 13(a) to 13(c) are diagrams illustrating the overview of the preliminary electrical wire bonding step which is to be performed by the wire harness connectivity inspection device according to the embodiment of the present invention.

As described in [Overview of Multilayer Inspection], region-based connector/wiring information describes wire harnesses arrangeable in each subdivided region of a target vehicle. The region-based connector/wiring information shown in FIG. 13(a) describes a wire harness which is arrangeable in a subdivided region identified by the identification information "E11" in the drawing part number "E11-111" and includes five wires (in FIG. 13(a), only three rows are described from above) shown in the arrangement at the top of FIG. 12A, a wire harness which is arrangeable in a subdivided region identified by identification information "E21" in the drawing part number "E21-111" and includes three electrical wires shown in the arrangement in the middle of FIG. 12A, and a wire harness which is arrangeable in a subdivided region identified by the identification information "E41" in the drawing part number "E41-111" and includes three electrical wires shown in the arrangement at the bottom of FIG. 12A.

In the region-based connector/wiring information shown in FIG. 13(a), during the WtoW inspection of the multilayer inspection, as described in [Details of WtoW Inspection], it can be specified that the other end of an electrical wire specified by the first row at the bottom of FIG. 12A and one end of an electrical wire specified by the third row at the top of FIG. 12A are connected together via connectors. Specifically, two electrical wires specified by these two rows are connected together via a connector (see the first row at the bottom of FIG. 12A) named "WtoW-E11-8" and a connector (see the third row at the top of FIG. 12A) named "WtoW-E41-2".

On the other hand, the WtoW inspection described in [Details of WtoW Inspection] determines whether or not the starting point and the terminating point of one row described in the auxiliary device-based wiring information match one end and the other end of an electrical wire described in the region-based connector/wiring information (when a plurality of electrical wires are linked together, one end of the first electrical wire W1 and the other end of the n-th electrical wire Wn). However, if a process of the WtoW inspection is applied, that is, if only processing for specifying an electrical wire Wn having one end connected to the other end of an electrical wire W(n−1) is used, two electrical wires connected via connectors in the arrangement forming the region-based connector/wiring information can be specified. In [Preliminary Electrical Wire Bonding Step], first, before performing the validity determining step, a process of the above-described WtoW inspection is performed with reference to the region-based connector/wiring information, thereby specifying two electrical wires connected via connectors. FIG. 13(a) shows a case where a process of the above-described WtoW inspection is performed to specify the condition that an electrical wire having the other end, to which a connector named "WtoW-E11-8" is connected, and an electrical wire having one end, to which a connector named "WtoW-E41-2" is connected, are connected together via the connectors.

Subsequently, the two electrical wires between which the connection is specified in this way virtually fit on the arrangement forming the region-based connector/wiring information (see FIG. 13(b)). The processing for virtually fitting is processing in which one row on a first certain electrical wire and one row on a second certain electrical wire in a connected state are deleted from the region-based connector/wiring information, the first certain electrical wire and the second certain electrical wire are regarded as a single electrical wire, and one row having information on one end of the first certain electrical wire and information on the other end of the second certain electrical wire is newly added to the region-based connector/wiring information. A specific example of the processing for virtually fitting will be described with reference to FIGS. 12B and 13(c).

In FIG. 12B, the electrical wire specified by the first row at the bottom of FIG. 12A and the electrical wire specified by the third row at the top of FIG. 12A are regarded as a single electrical wire. Then, information on the electrical wire specified by the first row at the bottom of FIG. 12A and information on the electrical wire specified by the third row at the top of FIG. 12A are deleted. Furthermore, the F connector name "MAIN_ECU", the connector part number "111-000-111", the terminal "A01", and the C/N "4" which are information on one end of the electrical wire specified by the first row at the bottom of FIG. 12A, and the T connector name "ABS_SWITCH", the connector part number "111-000-111", the terminal "A02", and the C/N "4", which are information on the other end of the electrical wire specified by the third row at the top of FIG. 12A, are added to the first row at the bottom of the drawing part number "ADD-111" in the region-based connector/wiring information. The drawing part number "ADD-111" is newly added to be described in one row having information on one end of the first certain electrical wire and information on the other end of the second certain electrical wire. In the drawing part number, while a portion before "-" represents identification information of a subdivided region in the vehicle, since electrical wires regarded as a single electrical wire extend over a plurality of subdivided regions, it is not possible to specify one subdivided region where the electrical wire is arranged. For this reason, in the newly added drawing part number, information, "ADD", is described in the portion before "-" instead of designating a subdivided region, and it can be identified that an electrical wire described in the drawing part number virtually fits on the arrangement forming the region-based connector/wiring information. Moreover, instead of describing "ADD-111", identification information may be added such that a plurality of electrical wires virtually fit can be identified later. In the case shown in FIG. 12B, for example, "E11-111" and "E41-111" for identifying two electrical wires regarded as a single electrical wire are added as a newly added drawing part number "E1'-111 & E41-111". In this way, the drawing part number "E11-111 & E41-111" is added to the region-based connector/wiring information, and an electrical wire of a wire harness which is virtually fitted can be identified from the drawing part number in one row added to the drawing part number. If it can be determined which electrical wire of a wire harness a single electrical wire fits, this is useful in [Multilayer Inspection Efficiency Improvement] described below.

FIGS. 13(b) and 13(c) are diagrams conceptually illustrating the processing for virtually fitting. FIG. 13(b) shows a mode in which information on the other end of the electrical wire specified by the first row (the first row at the bottom of FIG. 12A) of the drawing part number "E41-111" and information on one end of the electrical wire specified by the third row (the third row at the top of FIG. 12A) of the drawing part number "E11-111" are deleted. Furthermore, FIG. 13(c) shows a mode in which information on the other end of the electrical wire specified by the third row (the third row at the top of FIG. 12A) of the drawing part number "E11-111" and information on one end of the electrical wire specified by the first row (the first row at the bottom of FIG. 12A) of the drawing part number "E41-111" are deleted, and one electrical wire which has the other end and one end in the end portion is recorded in the first row of the drawing part number "ADD-111". As a result, as shown in FIG. 13(c), one row is deleted from the arrangement of the drawing part numbers "E11-111" and "E41-111" in the region-based connector/wiring information, one row is added to the arrangement of the drawing part number "ADD-111" in the region-based connector/wiring information, and consequently, the number of rows of the arrangement forming the region-based connector/wiring information is reduced by one row. The above is the details of the preliminary electrical wire bonding step.

When describing the preliminary electrical wire bonding step, a case where a process of the WtoW inspection is applied has been described. However, if a process (that is, only processing for specifying an electrical wire Wn having one end connected to the other end of an electrical wire W(n−1)) of JB inspection, JC inspection, W/S inspection, and B/S inspection is applied in the same way, two electrical wires which are connected together via a JB, two electrical wires which are connected together via a JC, two electrical wires which are connected together by a W/S, and two electrical wires which are connected together by a B/S can be virtually connected together on the arrangement forming the region-based connector/wiring information. In these cases, a plurality of electrical wires W21, W22, W23, . . . , and W2x (x is the number of electrical wires which are connected to an electrical wire W1) may be connected to one electrical wire W1. At this time, the above-described preliminary electrical wire bonding step may be performed on one row specifying the electrical wire W1 in the region-based connector/wiring information and W2x in the region-based connector/wiring information.

According to the preliminary electrical wire bonding step which is to be performed by the wire harness connectivity inspection device according to the embodiment of the present invention, any one process of the WtoW inspection, the JB inspection, the JC inspection, the W/S inspection, and the B/S inspection is applied to perform the preliminary electrical wire bonding step for virtual connection on the arrangement forming the region-based connector/wiring information, and the number of rows of the arrangement forming the region-based connector/wiring information is reduced, thereby shortening the time required for the validity determining step. If the validity determining step is performed after all processes of the WtoW inspection, the JB inspection, the JC inspection, the W/S inspection, and the B/S inspection are applied to perform the preliminary electrical wire bonding step for virtual connection on the arrangement forming the region-based connector/wiring information, the validity determining step will be completed only with the single-layer inspection insofar as there is no error in the description of the auxiliary device-based wiring information and the region-based connector/wiring information.

[Output of Multilayer Inspection]

Hereinafter, a method of outputting the result (connectivity success or connectivity fail) of the determination by the multilayer inspection will be described. In the multilayer inspection, as described in "Single-Layer Inspection Algorithm," one arbitrary row constituting the arrangement of the auxiliary device-based wiring information is extracted by referring to the auxiliary device-based wiring information, and the multilayer inspection is executed with respect to the extracted one row. Thus, the result of the determination by the multilayer inspection is obtained in respective rows constituting the arrangement of the auxiliary device-based wiring information. Thus, the simplest method of outputting the result of the multilayer inspection is to output connectivity success or connectivity fail in respective rows constituting the arrangement of the auxiliary device-based wiring information. However, although this method can identify connectivity success or connectivity fail, when the result of the determination by the multilayer inspection is connectivity success, it is not possible to specify the electrical wire via which one row constituting the arrangement of the auxiliary device-based wiring information is connected. Furthermore, when the result of the determination by the multilayer inspection is connectivity fail, it is not possible to specify the layer of the multilayer inspection in which the connectivity fail is obtained. Thus, in this embodiment, a method of recording the inspection history of the multilayer inspection reaching connectivity success or connectivity fail and outputting and displaying the inspection history will be described with reference to the conceptual diagrams of a method of recording the result of the multilayer inspection to be executed by the wire harness connectivity inspection device according to the embodiment of the present invention, shown in FIGS. 16(a) to 16(g), FIGS. 17(a) to 17(f), and FIGS. 18(a) to 18(c).

In the multilayer inspection, first, the single-layer inspection is executed. In the single-layer inspection, first, as described in "Single-Layer Inspection Algorithm," one arbitrary row constituting the arrangement of the auxiliary device-based wiring information is extracted by referring to the auxiliary device-based wiring information. The information described in the one row is recorded. After that, the inspection history is recorded in correlation with the one row. After the multilayer inspection for the corresponding one row ends, the multilayer inspection for another one row is executed. In this case, the inspection history is recorded in correlation with the corresponding one row.

However, as described in "Single-Layer Inspection Algorithm," when the single-layer inspection is executed, three inspection results of connectivity fail, connectivity success, and transition to 2-layer inspection are considered. When the result of the single-layer inspection is connectivity fail (see FIG. 16(a)), a status "connectivity fail" in "single-layer inspection" is recorded in correlation with the corresponding one row (in FIG. 16(a), "X" represents the note of connectivity fail). Similarly, when the result of the single-layer inspection is connectivity success, a status "connectivity success" in "single-layer inspection" is recorded in correlation with the corresponding one row. When the result of the inspection in the single-layer inspection is connectivity fail or connectivity success, the recording of the inspection history for the corresponding one row ends there.

On the other hand, when the result of the single-layer inspection is transition to 2-layer inspection (see FIG. 16(b)), a status "transition to 2-layer inspection" is recorded in correlation with the corresponding one row (in FIG. 16(b), an "L"-shaped line extending downward from "-" positioned to the right of "single-layer inspection" represents "transition to 2-layer inspection"). When the result of the inspection in the single-layer inspection is transition to 2-layer inspection, the recording of the inspection history for the corresponding one row continues.

Subsequently, the multilayer inspection executes n-layer inspection. In the n-layer inspection, as described in "Details of n-Layer Inspection," the inspection is executed in the order of "WtoW inspection," "JB inspection," "JC inspection," "W/S inspection," and "B/S inspection." When "WtoW inspection" of the n-layer inspection is executed, as described in "Details of WtoW Inspection," inspection results of connectivity success, transition to JB inspection, and transition to (n+1)-layer inspection are considered. When the result of the WtoW inspection in the n-layer inspection is connectivity success, a status "connectivity success" in "WtoW inspection" of "n-layer inspection" is recorded in correlation with the corresponding one row (in FIG. 16(b), "O" represents the note of connectivity success). When the result of the inspection in the WtoW inspection of the n-layer inspection is connectivity success, the recording of the inspection history for the corresponding one row ends there.

On the other hand, when the result of the WtoW inspection in the n-layer inspection is transition to JB inspection, a status "transition to JB inspection" from "WtoW inspection" of "n-layer inspection" is recorded in correlation with the corresponding one row (in FIG. 16(c), "-" represented by a line extending to the right from "WtoW inspection" represents "transition to JB inspection"). Moreover, when the result of the WtoW inspection in the n-layer inspection is transition to (n+1)-layer inspection, a status "transition to (n+1)-layer inspection" from "WtoW inspection" of "n-layer inspection" is recorded in correlation with the corresponding one row (in FIG. 16(d), an "L"-shaped line extending downward from "-" positioned to the right of "WtoW inspection" represents "transition to 3-layer inspection"). When the result of the inspection in the WtoW inspection of the n-layer inspection is transition to JB inspection or transition to (n+1)-layer inspection, the recording of the inspection history for the corresponding one row continues.

Furthermore, when "JB inspection" of the n-layer inspection is executed, as described in "Details of JB Inspection," inspection results of connectivity success, transition to JC inspection, and transition to (n+1)-layer inspection are considered. When the result of the a inspection in the n-layer inspection is connectivity success, a status "connectivity success" in "JB inspection" of "n-layer inspection" is recorded in correlation with the corresponding one row (see FIG. 16(e)). When the result of the inspection in the JB inspection of the n-layer inspection is connectivity success, the recording of the inspection history for the corresponding one row ends there.

On the other hand, when the result of the JB inspection in the n-layer inspection is transition to JC inspection, a status "transition to JC inspection" from "JB inspection" of "n-layer inspection" is recorded in correlation with the corresponding one row (in FIG. 16(f), "-" represented by a line extending to the right from "JB inspection" represents "transition to JC inspection"). Moreover, when the result of the JB inspection in the n-layer inspection is transition to (n+1)-layer inspection, a status "transition to (n+1)-layer inspection" from "JB inspection" of "n-layer inspection" is recorded in correlation with the corresponding one row (in FIG. 16(g), an "L"-shaped line extending downward from "-" positioned to the right of "JB inspection" represents "transition to 3-layer inspection"). When the result of the inspection in the JB inspection of the n-layer inspection is transition to JC inspection or transition to (n+1)-layer inspection, the recording of the inspection history for the corresponding one row continues.

Furthermore, when "JC inspection" of the n-layer inspection is executed, as described in "Details of JC Inspection," inspection results of connectivity success, transition to W/S inspection, and transition to (n+1)-layer inspection are considered. When the result of the JC inspection in the n-layer inspection is connectivity success, a status "connectivity success" in "JC inspection" of "n-layer inspection" is recorded in correlation with the corresponding one row (see FIG. 17(a)). When the result of the inspection in the JC inspection of the n-layer inspection is connectivity success, the recording of the inspection history for the corresponding one row ends there.

On the other hand, when the result of the JC inspection in the n-layer inspection is transition to W/S inspection, a status "transition to W/S inspection" from "JC inspection" of "n-layer inspection" is recorded in correlation with the corresponding one row (in FIG. 17(b), "-" represented by a line extending to the right from "JC inspection" represents "transition to W/S inspection"). Moreover, when the result of the JC inspection in the n-layer inspection is transition to (n+1)-layer inspection, a status "transition to (n+1)-layer inspection" from "JC inspection" of "n-layer inspection" is recorded in correlation with the corresponding one row (in FIG. 17(c), an "L"-shaped line extending downward from "-" positioned to the right of "JC inspection" represents "transition to 3-layer inspection"). When the result of the inspection in the JC inspection of the n-layer inspection is transition to W/S inspection or transition to (n+1)-layer inspection, the recording of the inspection history for the corresponding one row continues.

Furthermore, when "W/inspection" of the n-layer inspection is executed, as described in "Details of W/S Inspection," inspection results of connectivity success, transition to B/S inspection, and transition to (n+1)-layer inspection are considered. When the result of the W/S inspection in the n-layer inspection is connectivity success, a status "connectivity success" in "W/inspection" of "n-layer inspection" is recorded in correlation with the corresponding one row (see FIG. 17(d)). When the result of the inspection in the W/S inspection of the n-layer inspection is connectivity success, the recording of the inspection history for the corresponding one row ends there.

On the other hand, when the result of the W/S inspection in the n-layer inspection is transition to B/S inspection, a status "transition to B/S inspection" from "W/inspection" of "n-layer inspection" is recorded in correlation with the corresponding one row (in FIG. 17(e), "-" represented by a line extending to the right from "W/inspection" represents "transition to B/inspection"). Moreover, when the result of the W/S inspection in the n-layer inspection is transition to (n+1)-layer inspection, a status "transition to (n+1)-layer inspection" from "W/inspection" of "n-layer inspection" is recorded in correlation with the corresponding one row (in FIG. 17(f), an "L"-shaped line extending downward from "-" positioned to the right of "W/S inspection" represents "transition to 3-layer inspection"). When the result of the inspection in the W/S inspection of the n-layer inspection is transition to B/S inspection or transition to (n+1)-layer inspection, the recording of the inspection history for the corresponding one row continues.

Furthermore, when "B/inspection" of the n-layer inspection is executed, as described in "Details of B/S Inspection," inspection results of connectivity success, connectivity fail, and transition to (n+1)-layer inspection are considered. When the result of the B/S inspection in the n-layer inspection is connectivity success, a status "connectivity fail" in "B/S inspection" of "n-layer inspection" is recorded in correlation with the corresponding one row (see FIG. 18(a)). Similarly, when the result of the B/S inspection in the n-layer inspection is connectivity success, a status "connectivity success" in "B/inspection" of "n-layer inspection" is recorded in correlation with the corresponding one row (see FIG. 18(b)). When the result of the inspection in the B/S inspection of the n-layer inspection is connectivity success or connectivity fail, the recording of the inspection history for the corresponding one row ends there.

On the other hand, when the result of the B/S inspection in the n-layer inspection is transition to (n+1)-layer inspection, a status "transition to (n+1)-layer inspection" from "B/inspection" of "n-layer inspection" is recorded in correlation with the corresponding one row (in FIG. 18(c), an "L"-shaped line extending downward from "-" positioned to the right of "B/S inspection" represents "transition to 3-layer inspection"). When the result of the inspection in the B/S inspection of the n-layer inspection is transition to (n+1)-layer inspection, the recording of the inspection history for the corresponding one row continues.

Hereinabove, the flow of recording the result of the multi-layer inspection has been described. In the above description, the method of recording inspection history has been described in detail for respective inspection results of connectivity success, connectivity fail, transition to "WtoW inspection," "JB inspection" "JC inspection," "W/S inspection," and "B/inspection" in the 2-layer inspection, and transition to 3-layer inspection, mainly by way of the 2-layer inspection as an example of the n-layer inspection with reference to FIGS. 16(a) to 18(c). The inspection history of the n-layer inspection of the 3-layer inspection and the subsequent inspection can be recorded by repeatedly executing the 2-layer inspection.

Moreover, in one row added through the processing described in [Preliminary Electrical Wire Bonding Step], since electrical wires are regarded as a single electrical wire, connectivity inspection is executed in a certain layer. Then, as a history in this layer, connectivity success, connectivity fail, transition to "WtoW inspection", "JB inspection", "JC inspection", "W/inspection", and "B/inspection" in the same layer inspection, and transition to the next layer inspection are recorded. That is, this means that, if [Preliminary Electrical Wire Bonding Step] is not performed, connectivity inspection is executed in each layer, and a plurality of electrical wires which have been recorded as the history in each layer are regarded as a single electrical wire, such that the single electrical wire is recorded as a history in a certain layer.

Furthermore, in "Details of JB Inspection," "Details of JC Inspection," "Details of W/S Inspection," and "Details of B/S Inspection," it has been described that when the inspection transitions from the n-layer inspection to the (n+1)-layer inspection, the drawing part number, the T-connector name on the other end side, the connector part number, the terminal, the C/N, and the T-part name, or the drawing part number, the F-connector name on the other end side, the connector part number, the terminal, the C/N, and the F-part name, of the specified row of the region-based connector/wiring information are recorded in the data storage unit 314. That is, the information on the other end of the n-th electrical wire Wn specified by the n-layer inspection is recorded. This information is added as one set of information of the history when the result of transition from the n-layer inspection to the (n+1)-layer inspection is obtained (in FIGS. 16(*a*) to 18(*c*), a dark circle "●" represents that information on the other end of the n-th electrical wire Wn specified by the n-layer inspection is added). By doing so, when the determination history that connectivity fail is obtained in the (n+1)-layer inspection is recorded, it is possible to specify the first electrical wire W1, the second electrical wire W2, . . . , and the n-th electrical wire Wn specified until reaching the n-layer inspection. As a result, it is possible to track back which electrical wire of the first electrical wire W1, the second electrical wire W2, . . . , and the n-th electrical wire Wn is attributable to the determination of connectivity fail in the (n+1)-layer inspection by checking the output of the history.

However, when the electrical wires are connected via a JB, a JC, W/S, or B/S, as described in "Overview of Multilayer Inspection," "Details of JB Inspection," "Details of JC Inspection," "Details of W/S Inspection," and "Details of B/S Inspection," since a plurality of electrical wires is connected to one electrical wire, it is determined whether the other end of each of the plurality of electrical wires is identical to the terminating point of the circuit line. Thus, a plurality of electrical wires Wn1, Wn2, Wn3, . . . , and Wnx (x is the number of electrical wires connected to one electrical wire W(n−1)) is obtained as the result of the inspection in the JB inspection, the JC inspection, the W/S inspection, or the B/S inspection of the n-layer inspection. A method of recording the inspection history in that case will be described by way of the case of JB inspection with reference to the conceptual diagrams of a method of recording the result of the multilayer inspection to be executed by the wire harness connectivity inspection device according to the embodiment of the present invention, shown in FIGS. 19(*a*) to 19(*c*) (showing a case where a plurality of electrical wires is connected to one electrical wire).

When "JB inspection" of the n-layer inspection is executed, as described in "Details of JB Inspection," inspection results of connectivity success, transition to JC inspection, and transition to (n+1)-layer inspection are considered.

Figure 16:
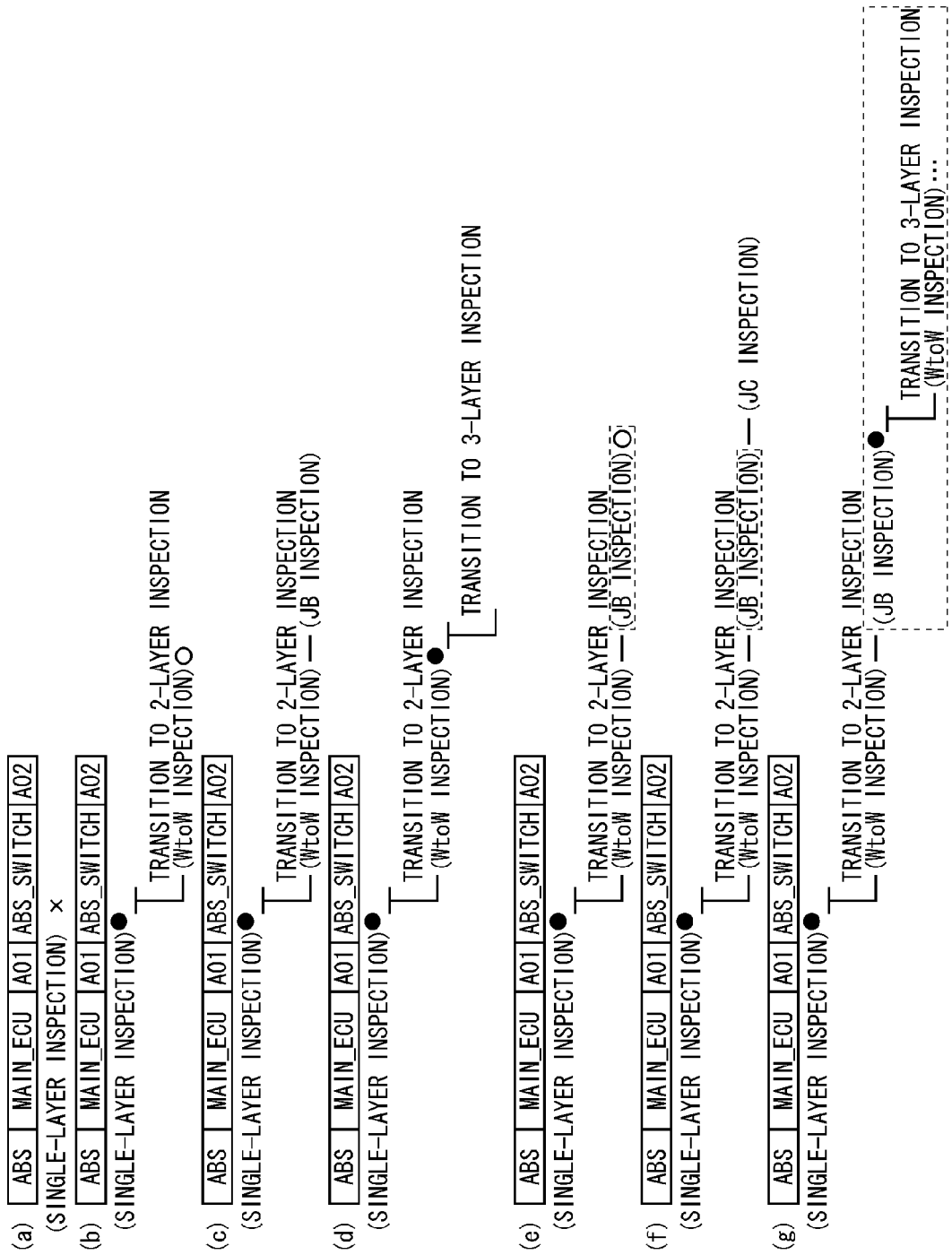

When the result of the JB inspection in the 2-layer inspection is connectivity success, a status "connectivity success" in "JB inspection" of "2-layer inspection" is recorded in correlation with the corresponding one row (see FIG. 16(*e*)). However, in this case, the following statuses are recorded with respect to each of the electrical wires W21, W22, and W23 connected via the JB to the other end of the electrical wire W1 specified by the single-layer inspection.

Figure 19:
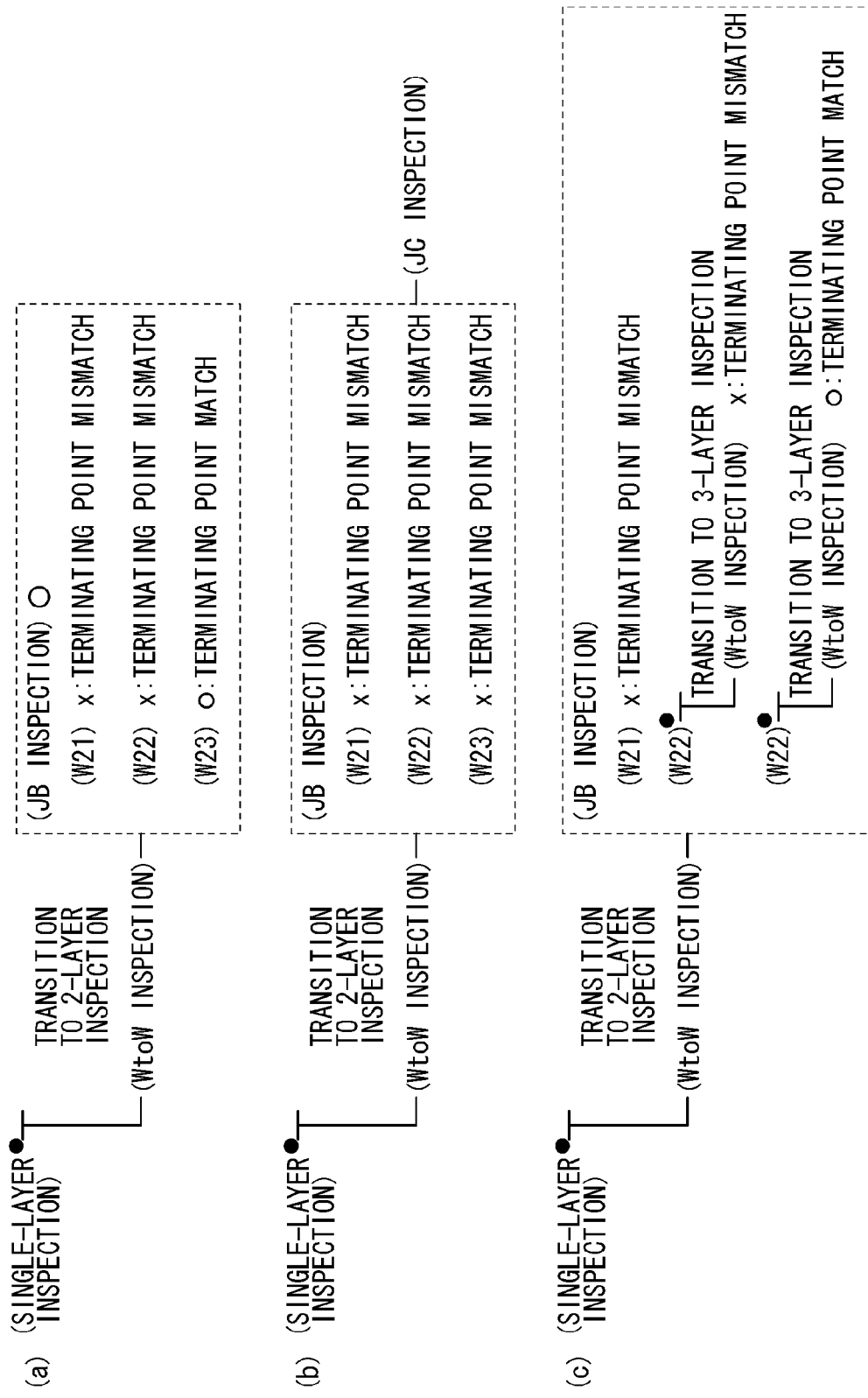

For example, the case of the electrical wires W21, W22, and W23 shown in FIG. 19(*a*) will be described. As for the electrical wires W21 and W22, it is not possible to specify the third electrical wire W3 of which one end is connected to the other end thereof. Moreover, the other end thereof is not identical to the terminating point of one row extracted from the arrangement of the auxiliary device-based wiring information. Moreover, as for the electrical wire W23, the other end thereof is identical to the terminating point of one row extracted from the arrangement of the auxiliary device-based wiring information. This corresponds to the history of FIG. 16(*e*).

In this case, the following statuses are recorded with respect to each of the electrical wires W21, W22, and W23. That is, a status "terminating point mismatch" in "JB inspection" of "2-layer inspection" is recorded for the electrical wire W21. Moreover, a status "terminating point mismatch" in "JB inspection" of "2-layer inspection" is recorded for the electrical wire W22. Moreover, a status "terminating point match" in "JB inspection" of "2-layer inspection" is recorded for the electrical wire W23. When the result of the JB inspection in the 2-layer inspection is connectivity success, a status "terminating point match" is recorded for any one of the electrical wires W21, W22, and W23. As above, it is determined whether the other end of each of a plurality of electrical wires is identical to the terminating point of the circuit line. When a status "terminating point match" is allocated to any one of the electrical wires, a status "connectivity success" in "JB inspection" of "n-layer inspection" is recorded in correlation with the corresponding one row (see FIG. 16(*e*)). When the result of the inspection in the JB inspection of the n-layer inspection is connectivity success, the recording of the inspection history for the corresponding one row ends there.

Next, a case where the result of the JB inspection in the 2-layer inspection is transition to JC inspection will be described. For example, the case of the electrical wires W21, W22, and W23 shown in FIG. 19(*b*) will be described. As for the electrical wires W21, W22, and W23, it is not possible to specify the third electrical wire W3 of which one end is connected to the other end thereof. Moreover, the other end thereof is not identical to the terminating point of one row extracted from the arrangement of the auxiliary device-based wiring information. This corresponds to the history of FIG. 16(*f*).

In this case, the following statuses are recorded with respect to each of the electrical wires W21, W22, and W23. That is, a status "terminating point mismatch" in "JB inspection" of "2-layer inspection" is recorded for the electrical wire W21. Moreover, a status "terminating point mismatch" in "JB inspection" of "2-layer inspection" is recorded for the electrical wire W22. Moreover, a status "terminating point mismatch" in "JB inspection" of "2-layer inspection" is recorded for the electrical wire W23. When the result of the JB inspection in the 2-layer inspection is transition to JC inspection, a status "terminating point mismatch" is recorded for all of the electrical wires W21, W22, and W23. As above, it is determined whether the other end of each of a plurality of electrical wires is identical to the terminating point of the circuit line. When a status "terminating point mismatch" is allocated to all of the electrical wires, a status "transition to JC inspection" from "JB inspection" of "n-layer inspection" is recorded in correlation with the corresponding one row (see FIG. 16(*f*)).

Next, a case where the result of the JB inspection in the 2-layer inspection is transition to 3-layer inspection will be described. For example, the case of the electrical wires W21, W22, and W23 shown in FIG. 19(*c*) will be described. As for the electrical wire W21, it is not possible to specify the third electrical wire W3 of which one end is connected to the other end thereof. Moreover, the other end thereof is not identical to the terminating point of one row extracted from the arrangement of the auxiliary device-based wiring information. Moreover, as for the electrical wire W22, although it is possible to specify the third electrical wire W3 of which one end is connected to the other end thereof via a connector, it is not possible to specify the fourth electrical wire W4 of which one end is connected to the other end of the electrical wire W3. Moreover, the other end of the electrical wire W3 is not identical to the terminating point of one row extracted from the arrangement of the auxiliary device-based wiring information. Moreover, as for the electrical wire W23, although it is possible to specify the third electrical wire W3 of which one end is connected to the other end thereof via a connector, it is not possible to specify the fourth electrical wire W4 of which one end is connected to the other end of the electrical wire W3. Moreover, the other end of the electrical wire W3 is identical to the terminating point of one row extracted from the arrangement of the auxiliary device-based wiring information. This corresponds to the history of FIG. 16(g).

In this case, the following statuses are recorded with respect to each of the electrical wires W21, W22, and W23. That is, a status "terminating point mismatch" in "JB inspection" of "2-layer inspection" is recorded for the electrical wire W21. Moreover, a status "transition to 3-layer inspection" is recorded for the electrical wire W22. Moreover, a status "transition to 3-layer inspection" is recorded for the electrical wire W23. When the result of the JB inspection in the 2-layer inspection is transition to 3-layer inspection, a status "transition to 3-layer inspection" is recorded for any one of the electrical wires W21, W22, and W23. As above, it is determined whether the other end of each of a plurality of electrical wires is not identical to the terminating point of the circuit line. When a status "terminating point match" is not allocated to any of the electrical wires, and a status "transition to 3-layer inspection" is allocated to any one of the electrical wires, a status "transition to (n+1)-layer inspection" from "JB inspection" of "n-layer inspection" is recorded in correlation with the corresponding one row (see FIG. 16(g)).

When a plurality of electrical wires is connected to one electrical wire via a JB, the inspection history is recorded for each of the plurality of electrical wires Wn1, Wn2, Wn3, . . . , and Wnx in the above-described manner. The case where a plurality of electrical wires is connected to one electrical wire via a JC, W/S, or B/S is the same as when the connection is realized via the JB.

According to the method of outputting the result of the multilayer inspection to be executed by the wire harness connectivity inspection device according to the embodiment of the present invention, when the result of the determination by the multilayer inspection is connectivity success, it is possible to specify the electrical wire via which one row constituting the arrangement of the auxiliary device-based wiring information is connected. Moreover, when the result of the determination by the multilayer inspection is connectivity fail, it is possible to specify the layer of the multilayer inspection in which connectivity fail is obtained. In this way, it is possible to greatly lessen the burden required for the validity determining step, particularly the burden imposed on a designer who designs wire harnesses in order to specify the point of connectivity fail.

[Multilayer Inspection Efficiency Improvement]

[Overview of Multilayer Inspection Efficiency Improvement]

The multilayer inspection described hereinabove is connectivity inspection performed with respect to one set of region-based connector/wiring information in which one wire harness is allocated to each subdivided region.

However, when creating the region-based connector/wiring information by specifying a wire harness that can be arranged for each subdivided region of a target vehicle, a plurality of candidates for the wire harness arrangeable in the subdivided region may be present. If a vehicle interior is divided into three subdivided regions, and there are two patterns of candidates for the wire harness arrangeable in each of the subdivided regions, 8 (2×2×2) patterns of region-based connector/wiring information are prepared. The multilayer inspection described hereinabove is the connectivity inspection performed with respect to one of the eight patterns, and it is necessary to perform the multilayer inspection with respect to each of the eight patterns.

However, as the number of candidates for the wire harness arrangeable in the subdivided region increases, the number of prepared patterns of region-based connector/wiring information increases. As a result, the validity determining step performed for each set of region-based connector/wiring information requires a large amount of time. Thus, in "Multilayer Inspection Efficiency Improvement," a method of shortening the time required for the validity determining step will be described.

Figure 20:
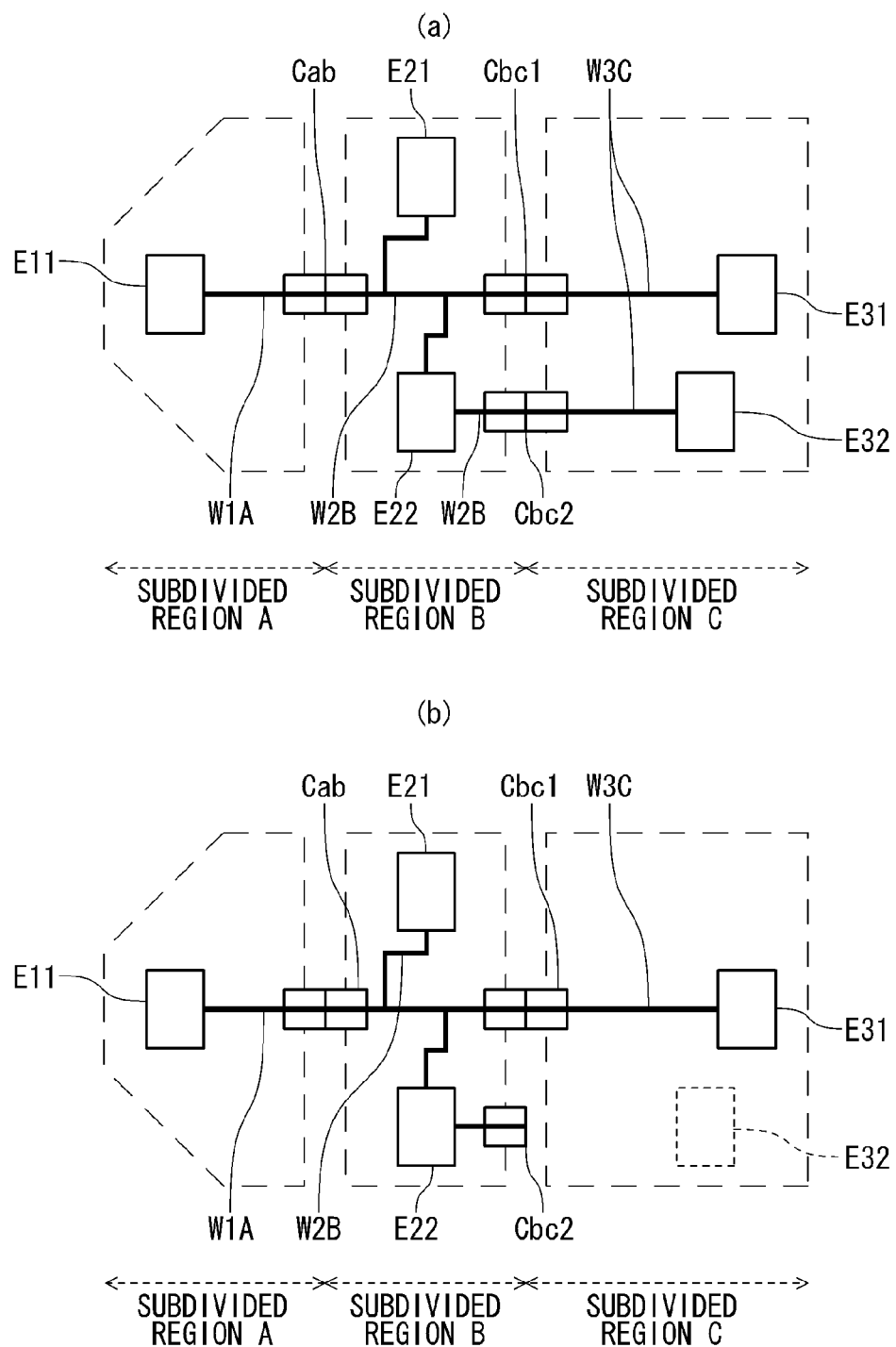

First, before describing the method of shortening the time required for the validity determining step, an overview of the relation between a subdivided region and a wire harness arrangeable in the subdivided region will be described with reference to FIGS. 20(a) and 20(b). FIGS. 20(a) and 20(b) are diagrams for explaining the connection state between electrical components provided in respective subdivided regions.

In the validity determining step, the presence of connectivity is inspected for using a group of auxiliary device-based wiring information (a group of auxiliary device-based wiring information is made up of a plurality of sets of auxiliary device-based wiring information each designated for each of the systems driven individually, such as a head lamp system, an airbag system, an air-conditioning system, an engine control system, and an ABS system) and a group of region-based connector/wiring information (a group of region-based connector/wiring information is made up of a plurality of sets of region-based connector/wiring information in which one wire harness is designated for each subdivided region).

FIG. 20(a) shows a state where a vehicle interior is divided into three subdivided regions A, B, and C. An electrical component E11 is provided in the subdivided region A, electrical components E21 and E22 are provided in the subdivided region B, and electrical components E31 and E32 are provided in the subdivided region C. Moreover, wire harnesses W1A and W2B arranged in the subdivided regions A and B connect electrical components via a connector Cab provided at the terminals of the respective wire harnesses W1A and W2B, and wire harnesses W2B and W3C arranged in the subdivided regions B and C connect electrical components via connectors Cbc1 and Cbc2 provided at the terminals of the respective wire harnesses W2B and W3C.

FIG. 20(b) shows a state where a vehicle interior is divided into three subdivided regions A, B, and C. An electrical component E11 is provided in the subdivided region A, electrical components E21 and E22 are provided in the subdivided region B, and an electrical component E31 is provided in the subdivided region C. Moreover, wire harnesses W1A and W2B arranged in the subdivided regions A and B connect electrical components via a connector Cab provided at the terminals of the respective wire harnesses W1A and W2B, and wire harnesses W2B and W3C arranged in the subdivided regions B and C connect electrical components via a connector Cbc1 provided at the terminals of the respective wire harnesses W2B and W3C.

Referring to the connection between electrical components in FIG. 20(a), the electrical component E11 provided in the subdivided region A is connected to the electrical components E21 and E22 provided in the subdivided region B via the wire harnesses W1A and W2B. Moreover, the electrical component E11 provided in the subdivided region A is connected to the electrical component E31 provided in the subdivided region C via the wire harnesses W1A, W2B, and W3C. Moreover, the electrical components E21 and E22 provided in the subdivided region B are connected to the electrical component E31 provided in the subdivided region C via the wire harnesses W2B and W3C. Furthermore, the electrical component E22 provided in the subdivided region B is connected to the electrical component E32 provided in the subdivided region C via the wire harnesses W2B and W3C.

In the connection state between the electrical components shown in FIG. 20(a), it is necessary to perform connectivity inspection between each of the electrical components E11 and E21, the electrical components E11 and E22, the electrical components E11 and E31, the electrical components E21 and E31, the electrical components E22 and E31, and the electrical components E22 and E32, respectively.

On the other hand, referring to the connection between the electrical components in FIG. 20(b), the electrical component E11 provided in the subdivided region A is connected to the electrical components E21 and E22 provided in the subdivided region B via the wire harnesses W1A and W2B. Moreover, the electrical component E11 provided in the subdivided region A is connected to the electrical component E31 provided in the subdivided region C via the wire harnesses W1A, W2B, and W3C. Moreover, the electrical components E21 and E22 provided in the subdivided region B are connected to the electrical component E31 provided in the subdivided region C via the wire harnesses W2B and W3C. Unlike the connection between the electrical components in FIG. 20(a), the electrical component E22 provided in the subdivided region B is not connected to the electrical component E32 provided in the subdivided region C.

In the connection state between the electrical components shown in FIG. 20(b), it is necessary to perform connectivity inspection between each of the electrical components E11 and E21, the electrical components E11 and E22, the electrical components E11 and E31, the electrical components E21 and E31, and the electrical components E22 and E31, respectively.

By comparing the connection state between the electrical components shown in FIG. 20(a) and the connection state between the electrical components shown in FIG. 20(b), it can be understood that the wire harnesses W1A and W2B arranged in the respective subdivided regions A and B are the same, and the wire harnesses W3C arranged in the respective subdivided regions C are different. In other words, in FIGS. 20(a) and 20(b), the same wire harnesses W1A and W2B are arranged in the respective subdivided regions A and B, and different wire harnesses are arranged in the respective subdivided regions C. When there is only one candidate for the wire harness W1A arrangeable in the subdivided region A, there is only one candidate for the wire harness W2B arrangeable in the subdivided region B, and there are two candidates for the wire harness W3C arrangeable in the subdivided region C, 2 (1×1×2) patterns of region-based connector/wiring information are prepared. Moreover, it is necessary to perform connectivity inspection with respect to respective electrical components in each pattern.

Hereinafter, a method of shortening the time required for the validity determining step will be described. When performing the multilayer inspection, one pattern of region-based connector/wiring information to be subjected to the multilayer inspection is selected. In the case of FIG. 20(a), the region-based connector/wiring information in which the wire harness W3C is arranged in the subdivided region C is selected as one pattern to be subjected to the multilayer inspection. Moreover, the multilayer inspection is performed with respect to the corresponding region-based connector/wiring information. In the connection state between the electrical components shown in FIG. 20(a), the connectivity inspection is performed between each of the electrical components E11 and E21, the electrical components E11 and E22, the electrical components E11 and E31, the electrical components E21 and E31, the electrical components E22 and E31, and the electrical components E22 and E32, respectively, by referring to the auxiliary device-based wiring information.

After the multilayer inspection ends, another pattern of region-based connector/wiring information to be subjected to the multilayer inspection, for which the multilayer inspection has not been performed, is selected. In the case of FIG. 20(b), the region-based connector/wiring information in which the wire harness W3C is arranged in the subdivided region C is selected as another pattern to be subjected to the multilayer inspection. Moreover, in the connection state between the electrical components shown in FIG. 20(b), connectivity inspection is performed between each of the electrical components E11 and E21, the electrical components E11 and E22, the electrical components E11 and E31, the electrical components E21 and E31, and the electrical components E22 and E31, respectively, by referring to the auxiliary device-based wiring information.

Here, the multilayer inspection has been performed for the electrical components E11 and E21 and the electrical components E11 and E22 in the one pattern for which the multilayer inspection has been performed. Whether the multilayer inspection has been performed can be determined by determining whether the following conditions are satisfied. That is:

(1) A circuit line of which the starting point and the terminating point are identical to the starting point and the terminating point of the circuit line of the auxiliary device-based wiring information for which the multilayer inspection is to be performed from now on is present in the circuit line of the auxiliary device-based wiring information for which the multilayer inspection has been performed.

(2) The same wire harness as the wire harness connecting the starting point and the terminating point of the circuit line of the auxiliary device-based wiring information, for which the multilayer inspection has been performed, and which satisfies the condition (1) is arranged in the respective subdivided regions of the region-based connector/wiring information for which the multilayer inspection is to be performed from now on.

It is to be noted that there may be a case where the condition (2) is not satisfied, and only the condition (1) is satisfied. In this case, since this means that the starting point and the terminating point of the circuit line of the auxiliary device-based wiring information for which the multilayer inspection has been performed are connected by another wire harness, it is necessary to perform the multilayer inspection with respect to this circuit line.

These conditions will be described with reference to FIGS. 20(a) and 20(b). As for the electrical components E11 and E21 and the electrical components E11 and E22, since the respective circuit lines connecting the terminal of the electrical component E11 and the terminal of the electrical component E21 are identical in FIGS. 20(a) and 20(b), and the respective circuit lines connecting the terminal of the electrical component E11 and the terminal of the electrical component E22 are identical in FIGS. 20(a) and 20(b), the condition (1) is satisfied. Moreover, since the wire harnesses W1A and W2B arranged in the subdivided regions A and B are the same, the condition (2) is satisfied.

As above, if the circuit line of the auxiliary device-based wiring information and the region-based connector/wiring information for which the multilayer inspection is to be performed from now on satisfy the conditions (1) and (2), it is only necessary to refer to the connectivity result of the multilayer inspection obtained in advance, and it is not necessary to perform multilayer inspection for the circuit line of the auxiliary device-based wiring information.

[Details of Multilayer Inspection Efficiency Improvement]

As described above, when improving the efficiency of the multilayer inspection, the connectivity result of the multilayer inspection obtained in advance is used. In the following description, the details of a process of the multilayer inspection appropriate for using the connectivity result will be described. First, the process when performing the multilayer inspection with respect to the first one of the plurality of patterns of region-based connector/wiring information will be described.

Although the multilayer inspection for this case has been described above, the method of recording the inspection history of the multilayer inspection reaching connectivity success or connectivity fail in "Output of Multilayer Inspection" relating to "Details of Multilayer Inspection Efficiency Improvement" will be described again.

Furthermore, in "Details of JB Inspection," "Details of JC Inspection," "Details of W/S Inspection," and "Details of B/S Inspection," it has been described that when the multilayer inspection transitions from the n-layer inspection to the (n+1)-layer inspection, the drawing part number, the T-connector name on the other end side, the connector part number, the terminal, the C/N, and the T-part name, or the drawing part number, the F-connector name on the other end side, the connector part number, the terminal, the C/N, and the F-part name, of the specified row of the region-based connector/wiring information are recorded in the data storage unit 314. That is, the information on the other end of the n-th electrical wire Wn specified by the n-layer inspection is recorded. It has also been described that, when [Preliminary Electrical Wire Bonding Step] is performed, an electrical wire of a wire harness to which a single electrical wire fits can be determined. This information is added as one set of information of the history when the result of transition from the n-layer inspection to the (n+1)-layer inspection is obtained (in FIGS. 16(*a*) to 19(*c*), a dark circle "●" represents that information on the other end of the n-th electrical wire Wn specified by the n-layer inspection is added). It should be noted that the drawing part number (a portion before "-" of the drawing part number is the identification information of a subdivided region in the vehicle, and a portion after "-" is the identification information of a wire harness, and when [Preliminary Electrical Wire Bonding Step] is performed, "E11-111 & E41-111" or the like is described in the drawing part number.) is included in the recorded information. By doing so, when the determination history that connectivity fail is obtained in the (n+1)-layer inspection is recorded, it is possible to specify the first electrical wire W1, the second electrical wire W2, . . . , and the n-th electrical wire Wn specified until reaching the n-layer inspection.

Figure 21:
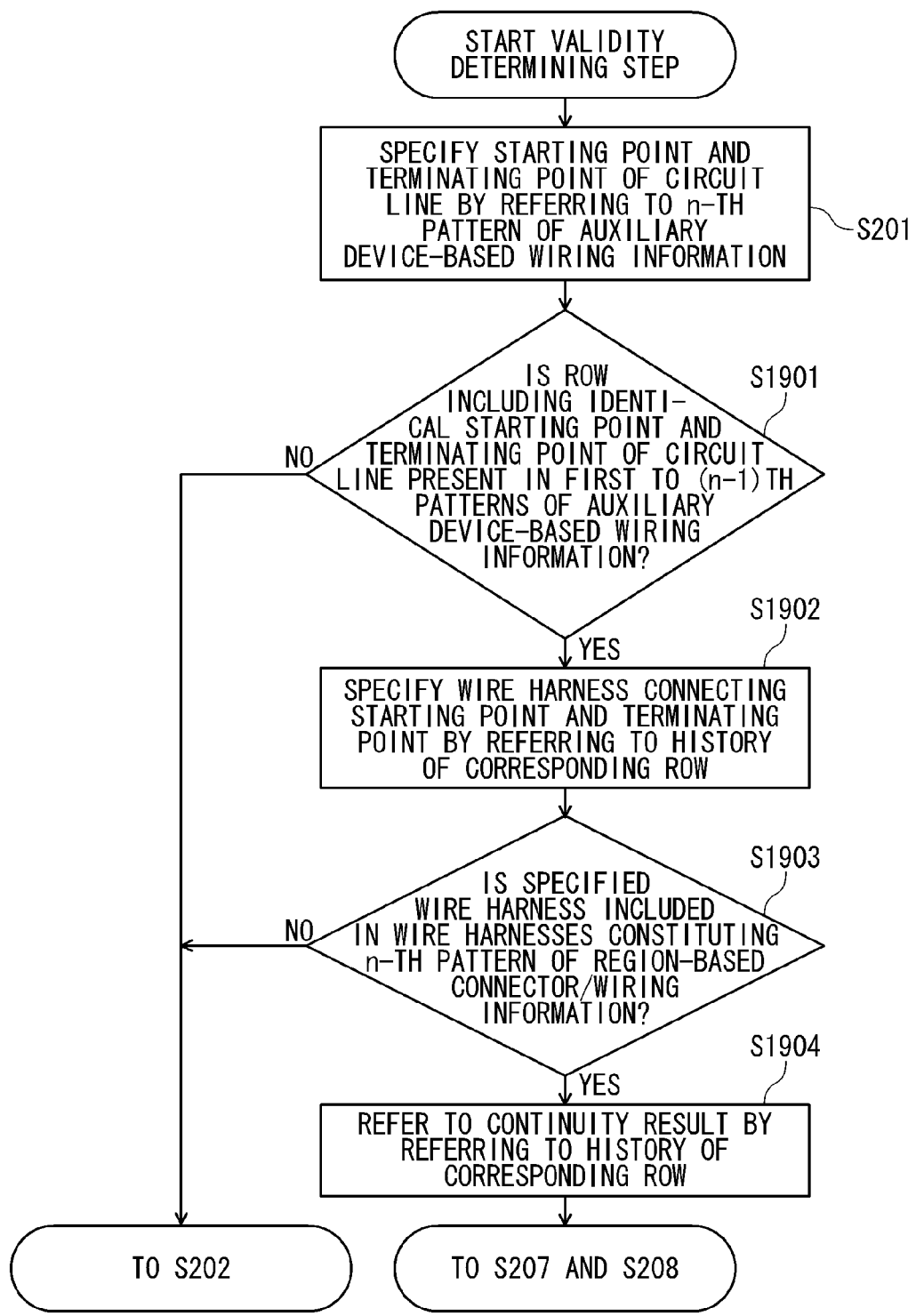
FIG. 21 is a flowchart for improving the efficiency of multilayer inspection to be executed by the wire harness continuity inspection device according to the embodiment of the present invention.

Subsequently, the process when performing the multilayer inspection with respect to the n-th (n>1) pattern of the plurality of patterns of region-based connector/wiring information will be described with reference to FIG. 21. FIG. 21 is a flowchart for improving the efficiency of the multilayer inspection to be executed by the wire harness connectivity inspection device according to the embodiment of the present invention. In FIG. 21, the same reference numerals as those of the flowchart of FIG. 2 have been described above, and detailed description thereof will not be provided.

First, a first terminal of a first electrical component and a second terminal of a second electrical component connected by a circuit line described in the auxiliary device-based wiring information are referred to from the auxiliary device-based wiring information (referring step: S201).

By referring to the first to (n−1)th patterns of auxiliary device-based wiring information for which the multilayer inspection has been performed, it is determined whether a row in which the starting point and the terminating point are identical to the starting point and the terminating point of the circuit line of the n-th pattern of auxiliary device-based wiring information for which the multilayer inspection is to be performed from now on is present in the circuit line of the first to (n−1)th patterns of auxiliary device-based wiring information (step S1901). When it is determined in step S1901 that a row in which the starting point and the terminating point are identical to the starting point and the terminating point of the circuit line of the n-th pattern of auxiliary device-based wiring information is not present (step S1901: N), the flow proceeds to step S201, and the multilayer inspection is performed using the n-th pattern of auxiliary device-based wiring information and the n-th pattern of region-based connector/wiring information (see FIG. 2).

On the other hand, when it is determined in step S1901 that a row in which the starting point and the terminating point are identical to the starting point and the terminating point of the circuit line of the n-th pattern of auxiliary device-based wiring information is present (step S1901: Y), by referring to the inspection history recorded in correlation with the corresponding row, the drawing part number of a wire harness connecting the starting point and the terminating point is specified (step S1902).

Subsequently, it is determined whether the wire harness specified by the drawing part number is included in the n-th pattern of region-based connector/wiring information (step S1903). The number of wire harnesses connecting the starting point and the terminating point, specified in step S1902 is the same as or smaller than the number of subdivided regions constituting the region-based connector/wiring information (when one wire harness is arranged in each subdivided region, the number of wire harnesses is not greater than the number of subdivided regions). Thus, it may be determined whether all of the wire harnesses specified in step S1903 are included in the wire harnesses constituting the n-th pattern of region-based connector/wiring information. When the wire harness specified by the drawing part number is not included in the n-th pattern of region-based connector/wiring information (step S1903: N), the flow proceeds to step S201, and the multilayer inspection is performed using the n-th pattern of auxiliary device-based wiring information and the n-th pattern of region-based connector/wiring information (see FIG. 2).

On the other hand, when the wire harness specified by the drawing part number is included in the n-th pattern of region-based connector/wiring information (step S1903: Y), by referring to the inspection history recorded in correlation with the corresponding row, the result of the connectivity inspection of the wire harness connecting the starting point and the terminating point is specified (step S1904). Moreover, the connectivity success or the connectivity fail of the starting point and the terminating point of the circuit line represented by one row extracted from the arrangement of the auxiliary device-based wiring information in the referring step (S201) is determined in accordance with the specified result of the connectivity inspection (step S207 or S208 of FIG. 2), and the validity determining process ends.

As above, by performing the validity determining process with respect to the n-th pattern of region-based connector/wiring information using the results of the first to n-th validity determining processes, it is possible to prevent the multilayer inspection from being performed redundantly with respect to one circuit line. Therefore, it is possible to improve the efficiency of the multilayer inspection.

As above, according to the wire harness continuity inspection device, the wire harness continuity inspection program, and the wire harness continuity inspection method according to the embodiment of the present invention, by performing the multilayer inspection, it is possible to allow the electronic computer to inspect for the presence of errors in connection of the electrical wires described in the region-based connector/wiring information. This greatly contributes to lessening the burden on the designer who designs wire harnesses.

While the present invention has been described in detail with reference to specific embodiments, it is obvious to those skilled in the art that various changes and modifications can be made without departing from the spirit and scope of the present invention.

This application is based on Japanese Patent Application No. 2010-025563, filed on Feb. 8, 2010 and Japanese Patent Application No. 2010-165257, filed on Jul. 22, 2010, the entire contents of which are incorporated by reference herein.

REFERENCE SIGNS LIST

311: input unit
312: database unit
313: program storage unit
314: data storage unit
315: display unit
316: processing unit

The invention claimed is:

1. A wire harness continuity inspection device, comprising:
a storage unit that stores auxiliary device-based wiring information and region-based connector/wiring information; and
a control unit that compares a first terminal of a first electrical component and a second terminal of a second electrical component connected by a circuit line, described in the auxiliary device-based wiring information stored in the storage unit with terminals connected to both ends of an electrical wire connecting the first terminal of the first electrical component and the second terminal of the second electrical component, described in the region-based connector/wiring information stored in the storage unit, wherein
the control unit is configured to
specify, based on a first region-based connector/wiring information, a first certain electrical wire and a second certain electrical wire of which one end is connected to the other end of the first certain electrical wire which are described in the first region-based connector/wiring information, and regard the first certain electrical wire and the second certain electrical wire as a single electrical wire,
specify, based on a first auxiliary device-based wiring information, a first terminal of a first electrical component and a second terminal of a second electrical component connected by a circuit line, described in the first auxiliary device-based wiring information,
specify, based on the first region-based connector/wiring information, a first electrical wire of which one end is connected to the first terminal of the first electrical component described in the first region-based connector/wiring information, and
determine whether a terminal connected to the other end of the first electrical wire is identical to the second terminal of the second electrical component,
wherein the region-based connector/wiring information reflects actual wiring and the auxiliary device-based wiring information is predetermined.

2. The wire harness continuity inspection device according to claim 1, wherein
when a terminal connected to the other end of a (n−1)th electrical wire, where n is an integer of 2 or more, is not identical to the second terminal of the second electrical component, the control unit refers to the first region-based connector/wiring information to specify the n-th electrical wire of which the one end is connected to the other end of the (n−1)th electrical wire described in the first region-based connector/wiring information, and
the control unit determines whether a terminal connected to the other end of the n-th electrical wire is identical to the second terminal of the second electrical component.

3. The wire harness continuity inspection device according to claim 2, wherein
the control unit sequentially records information on the specified (n−1)th electrical wire, where n is an integer of 2 or more, into the storage unit, and
when a terminal connected to the other end of the (n−1)th electrical wire, where n is an integer of 2 or more, is identical to the second terminal of the second electrical component, the control unit stores, into the storage unit, information indicating that the first terminal of the first electrical component is electrically connected to the second terminal of the second electrical component.

4. The wire harness continuity inspection device according to claim 3, wherein
the control unit is configured to
refer to second auxiliary device-based wiring information to specify the first terminal of the first electrical component and the second terminal of the second electrical component described in the second auxiliary device-based wiring information,
refer to the information on the (n−1)th electrical wire, where n is an integer of 2 or more, recorded sequentially to specify first to (n−1)th wire harnesses connecting the first terminal of the first electrical component and the second terminal of the second electrical component,
determine whether the first to (n−1)th wire harnesses belong to wire harnesses constituting the second region-based connector/wiring information, and
when the first to (n−1)th wire harnesses are determined to belong to the wire harnesses, the control unit refers to the information stored in the storage unit, indicating that the first terminal of the first electrical component is electrically connected to the second terminal of the second electrical component and records information indicating that the first terminal of the first electrical component is electrically connected to the second terminal of the second electrical component.

5. The wire harness continuity inspection device according to claim 1, wherein
when a terminal connected to the other end of the (n−1)th electrical wire, where n is an integer of 2 or more, is not identical to the second terminal of the second electrical component, the control unit refers to the first region-based connector/wiring information to specify the n-th electrical wire of which the one end is connected to the other end of the (n−1)th electrical wire described in the first region-based connector/wiring information based on connection means for connecting the other end of the (n−1)th electrical wire and the one end of the n-th electrical wire.

6. A non-transitory computer-readable medium in which a program for causing a computer to execute a wire harness continuity inspection method is stored, the wire harness continuity inspection method, comprising:
- specifying, based on a first region-based connector/wiring information, a first certain electrical wire and a second certain electrical wire of which one end is connected to the other end of the first certain electrical wire which are described in the first region-based connector/wiring information, and regarding the first certain electrical wire and the second certain electrical wire as a single electrical wire;
- specifying, based on a first auxiliary device-based wiring information, a first terminal of a first electrical component and a second terminal of a second electrical component connected by a circuit line, described in the first auxiliary device-based wiring information;
- specifying, based on the first region-based connector/wiring information, a first electrical wire of which one end is connected to the first terminal of the first electrical component described in the first region-based connector/wiring information; and
- a first determining step of determining whether a terminal connected to the other end of the first electrical wire is identical to the second terminal of the second electrical component,
- wherein the region-based connector/wiring information reflects actual wiring and the auxiliary device-based wiring information is predetermined.

7. The wire harness continuity inspection method according to claim 6, further comprising:
- an n-th specifying step of referring to the first region-based connector/wiring information to specify an n-th electrical wire of which one end is connected to the other end of a (n−1)th electrical wire, described in the first region-based connector/wiring information when a terminal connected to the other end of the (n−1) electrical wire, where n is an integer of 2 or more, is not identical to the second terminal of the second electrical component; and
- an n-th determining step of determining whether a terminal connected to the other end of the n-th electrical wire is identical to the second terminal of the second electrical component.

8. The wire harness continuity inspection method according to claim 7, wherein
- when the terminal connected to the other end of the (n−1)th electrical wire, where n is an integer of 2 or more, is not identical to the second terminal of the second electrical component, the n-th specifying step includes referring to the first region-based connector/wiring information to specify the n-th electrical wire of which the one end is connected to the other end of the (n−1)th electrical wire described in the first region-based connector/wiring information based on connection means for connecting the other end of the (n−1)th electrical wire and the one end of the n-th electrical wire.

9. The wire harness continuity inspection method according to claim 7, wherein
- the (n−1)th specifying step includes sequentially recording information on the specified (n−1)th electrical wire, where n is an integer of 2 or more, and
- the n-th specifying step includes recording information indicating that the first terminal of the first electrical component is electrically connected to the second terminal of the second electrical component when the terminal connected to the other end of the (n−1)th electrical wire, where n is an integer of 2 or more, is identical to the second terminal of the second electrical component.

10. The wire harness continuity inspection method according to claim 9, further comprising:
- a second referring step of referring to second auxiliary device-based wiring information to specify the first terminal of the first electrical component and the second terminal of the second electrical component described in the second auxiliary device-based wiring information,
- a wire harness specifying step of referring to the information on the (n−1)th electrical wire, where n is an integer of 2 or more, recorded sequentially in the (n-1)th specifying step to specify first to (n−1)th wire harnesses connecting the first terminal of the first electrical component and the second terminal of the second electrical component,
- a wire harness determining step of determining whether the first to (n−1)th wire harnesses specified in the wire harness specifying step belong to wire harnesses constituting the second region-based connector/wiring information, and
- when the first to (n−1)th wire harnesses are determined to belong to the wire harnesses in the wire harness determining step, referring to the information recorded in the n-th specifying step, the information indicating that the terminals are electrically connected to each other, and recording information indicating that the first terminal of the first electrical component is electrically connected to the second terminal of the second electrical component.

11. A non-transitory storage medium in which is stored a wire harness continuity inspection program for causing a computer to execute the respective steps of the wire harness continuity inspection method as defined in claim 6.

* * * * *